(12) United States Patent
Deck et al.

(10) Patent No.: US 12,417,853 B2
(45) Date of Patent: Sep. 16, 2025

(54) ENGINEERED SiC-SiC COMPOSITE AND MONOLITHIC SiC LAYERED STRUCTURES

(71) Applicant: General Atomics, San Diego, CA (US)

(72) Inventors: Christian Peter Deck, San Diego, CA (US); Jiping Zhang, San Diego, CA (US); Christina Back, San Diego, CA (US); Jonathan David Sheeder, San Diego, CA (US)

(73) Assignee: General Atomics, San Diego, CA (US)

( * ) Notice: Subject to any disclaimer, the term of this patent is extended or adjusted under 35 U.S.C. 154(b) by 565 days.

(21) Appl. No.: 16/271,556

(22) Filed: Feb. 8, 2019

(65) Prior Publication Data
US 2020/0027580 A1 Jan. 23, 2020

Related U.S. Application Data

(63) Continuation of application No. PCT/US2017/045990, filed on Aug. 8, 2017.
(Continued)

(51) Int. Cl.
*B32B 18/00* (2006.01)
*C04B 35/565* (2006.01)
(Continued)

(52) U.S. Cl.
CPC .............. *G21C 3/07* (2013.01); *B32B 18/00* (2013.01); *C04B 35/565* (2013.01); *C04B 35/80* (2013.01);
(Continued)

(58) Field of Classification Search
None
See application file for complete search history.

(56) References Cited

U.S. PATENT DOCUMENTS 4,837,230 A * 6/1989 Chen .................. C04B 35/6325
501/88
5,182,077 A 1/1993 Feinroth
(Continued)

FOREIGN PATENT DOCUMENTS

| CN | 102825898 A | 12/2012 |
|----|-------------|---------|
| CN | 102906821 A | 1/2013 |

(Continued)

OTHER PUBLICATIONS

International Searching Authority, International Search Report and Written Opinion, PCT Patent Application PCT/US2017/045990, mailed Feb. 14, 2018, 10 pages.
(Continued)

*Primary Examiner* — Humera N. Sheikh
*Assistant Examiner* — Elizabeth D Ivey
(74) *Attorney, Agent, or Firm* — Perkins Coie LLP

(57) ABSTRACT

Systems, structures, devices, and fabrication processes for ceramic matrix composites suitable for use in a nuclear reactor environment and other applications requiring materials that can withstand high temperatures and/or highly corrosive environments are disclosed. In one aspect, a ceramic composite structure is provided. The structure comprises a chamber including an external shell and a hollow space inside the external shell. The external shell includes an inner composite layer including a first composite structure, a middle composite layer placed outside of the inner composite layer, the middle composite layer including a second composite structure that is different from the first composite structure, and an outer monolithic layer that has a spatially uniform material property and placed outside of the middle composite layer.

19 Claims, 45 Drawing Sheets

Related U.S. Application Data

(60) Provisional application No. 62/372,239, filed on Aug. 8, 2016.

(51) Int. Cl.

| | | |
|---|---|---|
| *C04B 35/80* | (2006.01) | |
| *C23C 16/32* | (2006.01) | |
| *G21C 3/07* | (2006.01) | |
| *G21C 3/20* | (2006.01) | |
| *G21C 21/02* | (2006.01) | |

(52) U.S. Cl.
CPC .............. *C23C 16/325* (2013.01); *G21C 3/20* (2013.01); *G21C 21/02* (2013.01); *C04B 2235/5244* (2013.01)

(56) References Cited

U.S. PATENT DOCUMENTS

| | | | |
|---|---|---|---|
| 5,681,511 A | 10/1997 | Streckert et al. | |
| 6,506,483 B1 | 1/2003 | Fehrenbacher et al. | |
| 9,031,184 B2 | 5/2015 | Cabrero et al. | |
| 9,275,762 B2 | 3/2016 | Garnier et al. | |
| 9,982,350 B2 | 5/2018 | Burke et al. | |
| 10,515,728 B2 | 12/2019 | Lahoda et al. | |
| 2005/0181192 A1* | 8/2005 | Steffier | B32B 18/00 428/293.4 |
| 2006/0039524 A1* | 2/2006 | Feinroth | G21C 3/07 376/409 |
| 2009/0032178 A1 | 2/2009 | Feinroth | |
| 2010/0263195 A1 | 10/2010 | Niccolls et al. | |
| 2012/0034415 A1 | 2/2012 | Kato et al. | |
| 2012/0088088 A1* | 4/2012 | Garnier | C01B 32/956 428/394 |
| 2013/0266363 A1* | 10/2013 | Khalifa | C04B 35/6267 403/270 |
| 2014/0153668 A1 | 6/2014 | Zabiego et al. | |
| 2014/0153688 A1* | 6/2014 | Zabiego | G21C 3/07 376/409 |
| 2014/0192949 A1 | 7/2014 | Feinroth et al. | |
| 2014/0261986 A1 | 9/2014 | Lazur et al. | |
| 2014/0307845 A1 | 10/2014 | Pop | |
| 2015/0063523 A1 | 3/2015 | Yacout et al. | |
| 2015/0078505 A1* | 3/2015 | Xu | C04B 37/001 376/451 |
| 2015/0228363 A1* | 8/2015 | Dewan | G21C 1/22 376/458 |
| 2016/0049211 A1 | 2/2016 | Feinroth et al. | |
| 2016/0159698 A1 | 6/2016 | Landwehr | |

FOREIGN PATENT DOCUMENTS

| | | |
|---|---|---|
| CN | 105139898 A | 12/2015 |
| EP | 2639211 A1 | 9/2013 |
| EP | 3010024 A1 | 4/2016 |
| JP | 06287062 A | 10/1994 |
| JP | H06287062 A | 10/1994 |
| JP | 2006511417 A | 4/2006 |
| JP | 2013210372 A | 10/2013 |
| JP | 2016013950 A | 1/2016 |
| JP | 2016052974 A | 4/2016 |
| JP | 2016135727 A | 7/2016 |
| RU | 2575863 | 11/2014 |
| WO | 2006076039 | 7/2006 |
| WO | 2012129677 A1 | 4/2012 |
| WO | 2012174548 | 12/2012 |
| WO | 2015200257 A1 | 12/2015 |
| WO | 2018031596 A2 | 2/2018 |

OTHER PUBLICATIONS

Russian Office Action for Patent Application No. 2019106307, mailed Oct. 2, 2019 (12 pages).
Ben-Belgacem, M. et al.; "Thermo-mechanical analysis of LWR SiC/SiC composite cladding"; Jounral of Nuclear Materials 447; pp. 125-142; Jan. 9, 2014.
Deck, C.P. et al; "Characterization of SiC-SiC composites for accident tolerant fuel cladding"; Journal Of Nuclear Materials 466; pp. 667-681; Aug. 8, 2015.
Extended Search Report mailed on Apr. 23, 2020 for European Application No. 17840171.7, filed on Feb. 8, 2019 (13 pages).
Japanese Office Action mailed on Jul. 28, 2020 for Japanese Patent Application No. 2019-507257 (11 pages).
Korean Office Action mailed on May 29, 2020 for Korean Patent Application No. 10-2019-7006923 (9 pages).
Canadian Office Action mailed on Nov. 20, 2020 for Canadian Patent Application No. 3,033,391 (3 pages).
European Office Action mailed on Feb. 12, 2021 for European Patent Application No. 17840171.7 (4 pages).
Japanese Office Action mailed on Feb. 9, 2021 for Japanese Patent Application No. 2019-507257 (9 pages).
Decision of Patent for Japanese Patent Application No. 2019-507257, mailed Sep. 21, 2021 (4 pages).
First Examination Report for Indian Patent Application No. 201917002872, mailed Nov. 10, 2021 (7 pages).
Final Office Action for U.S. Appl. No. 14/205,823, mailed Dec. 15, 2017 (16 pages).
Office Action for Chinese Patent Application No. 201780047437.2, mailed Nov. 1, 2022 (30 pages).
Communication pursuant to Article 94(3) EPC for European Patent Application No. 17840171.7, mailed Jun. 9, 2022 (4 pages).
Japanese Office Action mailed on Aug. 23, 2022 for Japanese Patent Application No. 2021-095833 (12 pages).
Office Action for Chinese Patent Application No. 201780047437.2, mailed Apr. 13, 2023 (24 pages).
Office Action for Chinese Patent Application No. 201780047437.2, mailed Dec. 13, 2023 (19 pages).
Hearing Notice for Indian Patent Application No. 201917002872, mailed Mar. 4, 2024 (3 pages).
Examiner's Requisition for Canadian Patent Application No. 3,170,919, mailed Sep. 6, 2023 (5 pages).
European Communication under Rule 71(3) EPC issued in EP Patent Application No. 17840171.7, dated May 22, 2024, 109 pages.

\* cited by examiner

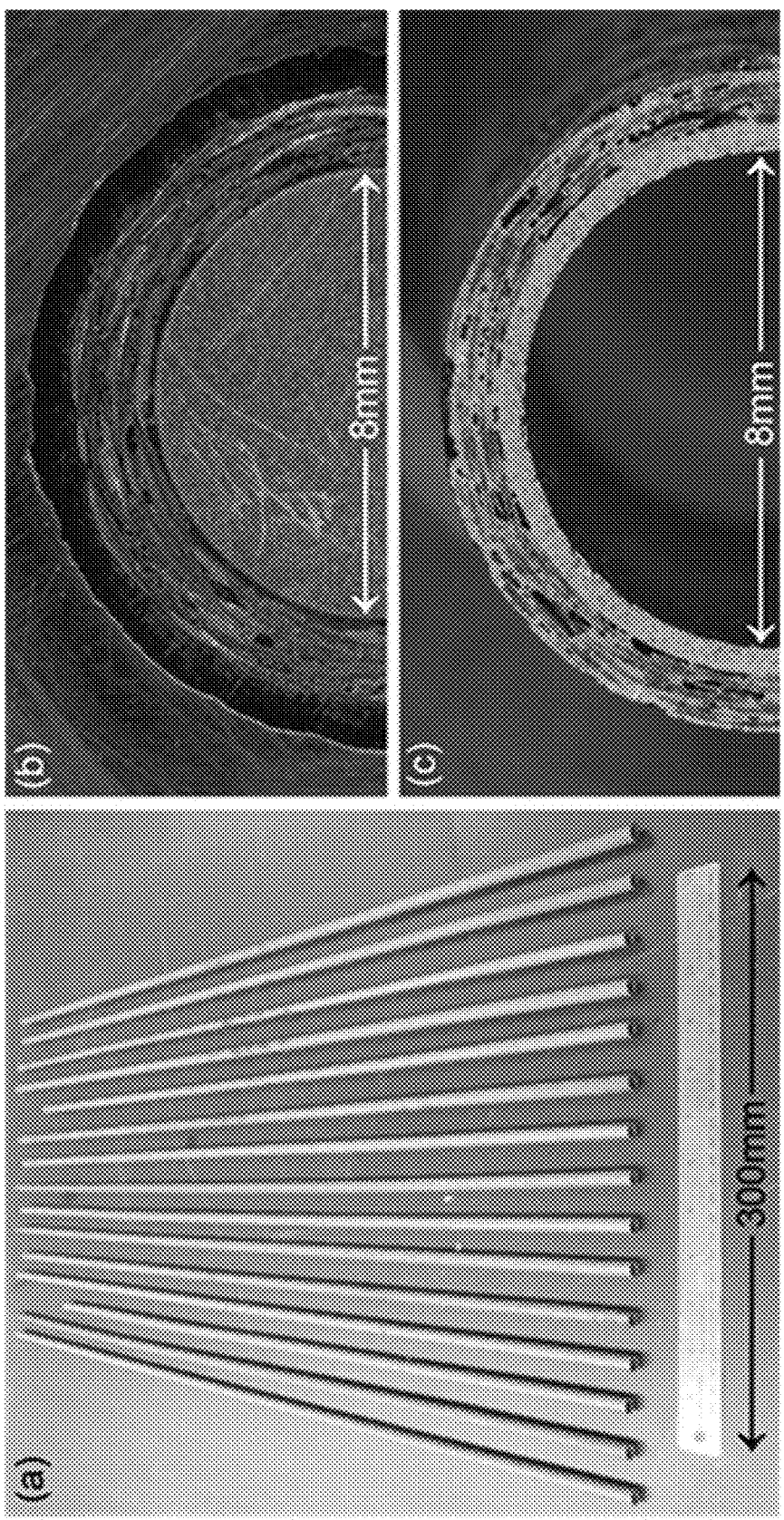

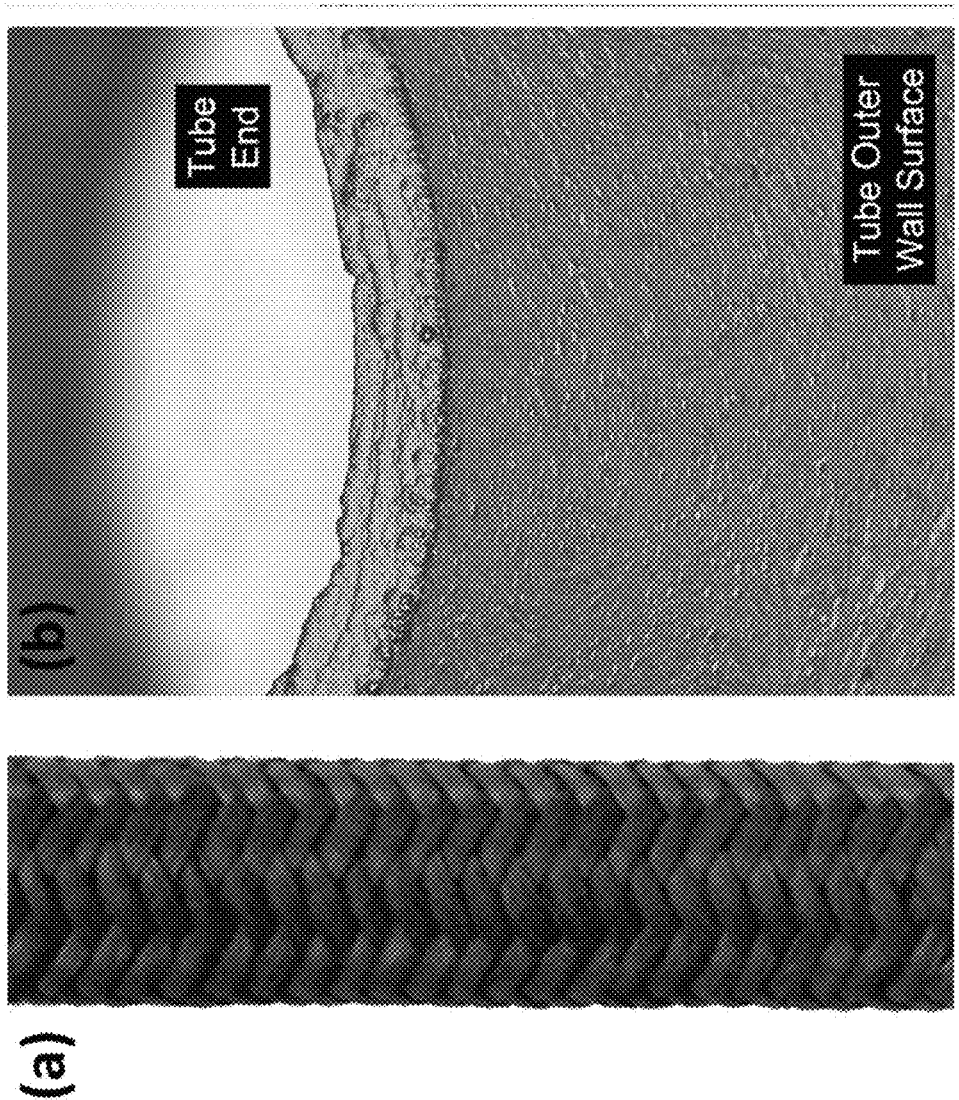

ENGINEERED SiC-SiC COMPOSITE AND MONOLITHIC SiC LAYERED STRUCTURES

CROSS REFERENCE TO RELATED APPLICATIONS

This application is a continuation of International Patent Application PCT/US2017/045990 filed Aug. 8, 2017, and entitled "ENGINEERED SI—SIC COMPOSITE AND MONOLITHIC SIC LAYERED STRUCTURES"; which claims the benefits and priority of U.S. Provisional Patent Application No. 62/372,239, filed on Aug. 8, 2016, and entitled "ENGINEERED SIC—SIC COMPOSITE AND MONOLITHIC SIC LAYERED STRUCTURES FOR NUCLEAR FUEL CLADDING"; both of which are incorporated by reference in their entireties.

TECHNICAL FIELD

This patent document relates to relates to systems, structures, devices, and fabrication processes in connection with casing, housing or cladding structures for holding nuclear fuel materials for use in nuclear reactors, or in connection with heat exchangers, or nosecones or nozzles, or with flow channel inserts.

BACKGROUND

Many nuclear reactors use a fissile material as the fuel to generate power. The fuel is usually held in a robust physical form (such as fuel rods) capable of enduring high operating temperatures and an intense neutron radiation environment. Fuel structures need to maintain their shape and integrity over a period (e.g., several years) within the reactor core, thereby preventing the leakage of fission products into the reactor coolant. Other structures, such as heat exchangers, nozzles, nosecones, flow channel inserts, or related components, also require high temperature performance, corrosion resistance, and specific, non-planar geometries where high dimensional accuracy is important.

SUMMARY

This patent document relates to systems, structures, devices, and fabrication processes for ceramic matrix composites suitable for use in a nuclear reactor environment and other applications requiring materials that can withstand high temperatures and/or highly corrosive environments.

In one exemplary aspect, a ceramic composite structure is provided. The structure comprises a chamber including an external shell and a hollow space inside the external shell. The external shell includes an inner composite layer including a first composite structure, a middle composite layer placed outside of the inner composite layer, the middle composite layer including a second composite structure that is different from the first composite structure, and an outer monolithic layer that has a spatially uniform material property and placed outside of the middle composite layer.

In some embodiments, the structure further includes one or more composite layers placed between the inner composite layer and the middle composite layer, each of the one or more composite layers having a different composite structure. In some implementations, the structure also includes one or more monolithic layers placed between the middle composite layer and the outer monolithic layer. In some embodiments, a plurality of thin layers can be deposited between the outer monolithic layer and the one or more monolithic layers, and between each of the one or more monolithic layers, to inhibit crack propagation. The plurality of thin layers may include a ductile material. For example, the plurality of thin layers may include pyrolytic carbon or metal.

In some embodiments, the first composite structure comprises a reinforced silicon carbide (SiC) composite. The reinforced SiC composite may include a braided SiC fiber composite, a wound SiC fiber composite, or a small-scale additive composite. The additives in the small-scale additive composite may include SiC whiskers, powders, or fibers in nano-scale. In some implementations, angles between fibers of the braided fiber composite are in a range of 35 to 75 degrees.

In some embodiments, the second composite structure comprises a reinforced silicon carbide (SiC) composite. The reinforced SiC composite may include a braided SiC fiber composite, a wound SiC fiber composite, or a small-scale SiC additive composite. In some embodiments, additives in the small-scale additive composite include SiC whiskers, powders, or fibers in nano-scale. In some implementations, angles between fibers of the braided fiber composite are in a range of 35 to 75 degrees.

The outer monolithic layer may include a dense β-SiC material. In some embodiments, the structure may also include a barrier coating layer placed outside of the outer monolithic layer. The barrier layer can comprise a metal or a ceramic.

In some embodiments, thickness of the inner composite layer and the middle composite layer comprises greater than 50% of the overall thickness. In some implementations, thickness of the inner composite layer and the middle composite layer comprises greater than 70% of the overall thickness.

In some embodiments, the inner composite layer comprises a smooth inner surface. The outer monolithic layer, in some implementations, is structured with respect to the inner and middle composite layers to remain in compression when subjected to an operating stress, such as operating stresses of a nuclear reactor. The external shell is structured for fabrication of a nuclear fuel cladding for holding a nuclear fuel material, a part of a heat exchanger, a part of a nozzle, a nosecone, a shroud, a combustor liner, or a flow channel insert.

In another exemplary aspect, a method of fabricating a preform suitable for use in ceramic composite manufacture is provided. The method includes arranging a fiber on a support structure to form a first layer of a fiber preform, applying a slurry to the first layer of the fiber preform, wherein the slurry includes a plurality of additives, one or more binders, and one or more solvents, and the one or more binders comprise thermo-plastic polymers; and removing the support structure after the slurry solidifies and binds with the first layer of the fiber preform so that the slurry and the first layer of the fiber preform collectively form a preform.

In some embodiments, the fiber is arranged on an outside surface of the support structure. The fiber can also be arranged on an inside surface of the support structure. In some embodiments, the applying of the slurry includes impregnating the slurry into the fiber. The applying of the slurry may also include brushing, spraying, vacuum molding, or warm pressing the slurry to the fiber. The removing of the support structure may include sliding, pushing, or melting the support structure from the preform.

In some embodiments, the method further includes placing the preform in a chemical vapor deposition (CVD) coating process or a chemical vapor infiltration (CVI) process, and densifying the preform by the CVD or CVI coating process at a densification temperature. In some embodiments, the one or more binders are selected so each selected binder deteriorates at a temperature below the densification temperature. For example, the one or more binders include Polypropylene Carbonate Polymer. In some embodiments, the one or more binders are solid at a room temperature. The one or more binders may be soluble in the one or more solvents. The one or more solvents may include acetone, methyl ethyl ketone, or ethanol. In some embodiments, the plurality of additives includes powders, whiskers, fibers, granules or any combination thereof. In some implementations, sizes of the plurality of additives are smaller than 1 mm.

In some embodiments, the preform formed by the slurry and the first layer of the fiber preform is in a tubular geometry. For example, the arranging of the fiber includes braiding the fiber into a tube. In some embodiments, the preform formed by the slurry and the first layer of the fiber preform is in a non-tubular geometry. For example, the arranging of the fiber includes weaving the fiber into a planar sheet. In some embodiments, the arranging of the fiber includes arranging or shaping the fiber in a hoop or axial orientation.

In some embodiments, the support structure is structured to exhibit a low surface friction. For example, the support structure can include graphite, molybdenum disulfide (MoS2), polytetrafluoroethylene (PTFE), or boron nitride (BN). In some embodiments, the support structure is structured to exhibit a melting temperature lower than a burnout temperature of a binder of the one or more binders. For example, the support structure includes a wax or a thermoplastic material.

In some embodiments, the method includes, subsequent to the removing of the support structure, further using the support structure is to fabricate another preform. In some implementations, the forming of the preform includes arranging fiber on top of the first layer of fiber preform to form a second layer of fiber preform having a second composite structure that is different from a first composite structure of the first layer of fiber preform; and forming an outer monolithic layer on top of the second layer of fiber preform.

In some embodiments, the method includes forming one or more layers of fiber preform between the first layer and the second layer, each of the one or more layers having a different composite structure. In some implementations, the method also includes forming one or more monolithic layers between the second layer of fiber preform and the outer monolithic layer. The method may also include depositing a plurality of thin layers between the outer monolithic layer and the one or more monolithic layers, and between each of the one or more monolithic layers, to inhibit crack propagation.

In some embodiments, the first composite structure comprises a reinforced SiC composite. The forming the first layer of fiber preform may include adjusting a fiber orientation of the fiber by varying number of fiber tows and angle relative to an axis of the support structure.

In some embodiments, the second composite structure comprises a reinforced silicon carbide (SiC) composite. The forming of the second layer of fiber preform may include adjusting fiber orientation by varying number of fiber tows and angle relative to an axis of the support structure. In some implementations, the method also includes forming a barrier coating layer on top of the outer monolithic layer.

In some embodiments, the method also includes using at least a part of the preform to fabricate a nuclear fuel cladding for holding a nuclear fuel material, a part of a heat exchanger, a part of a nozzle, a nosecone, a shroud, a combustor liner, or a flow channel insert.

The above and other aspects and implementations are described in greater detail in the drawings, the description and the claims.

BRIEF DESCRIPTION OF THE DRAWINGS

FIG. 14A shows examples of ~0.9 m long SiC—SiC tubes fabricated.
FIG. 14B shows an example of the cross-section of a tube structure with an outer monolithic SiC coating.
FIG. 14C shows an example the cross-section of a tube structure with an inner monolithic SiC layer.

FIG. 19A shows a photo of representative braided fiber structure prior to infiltration, where the inherent roughness of the braid structure is apparent.

FIG. 19B shows an example of optical image of a SiC—SiC tube outer wall surface with a small additive composite coating, wall thickness is ~0.75 mm.

FIB. 29B shows an exemplary scheme diagram of applying slurry on a fiber-wrapped support structure by a slurry bath.

Figure 30:
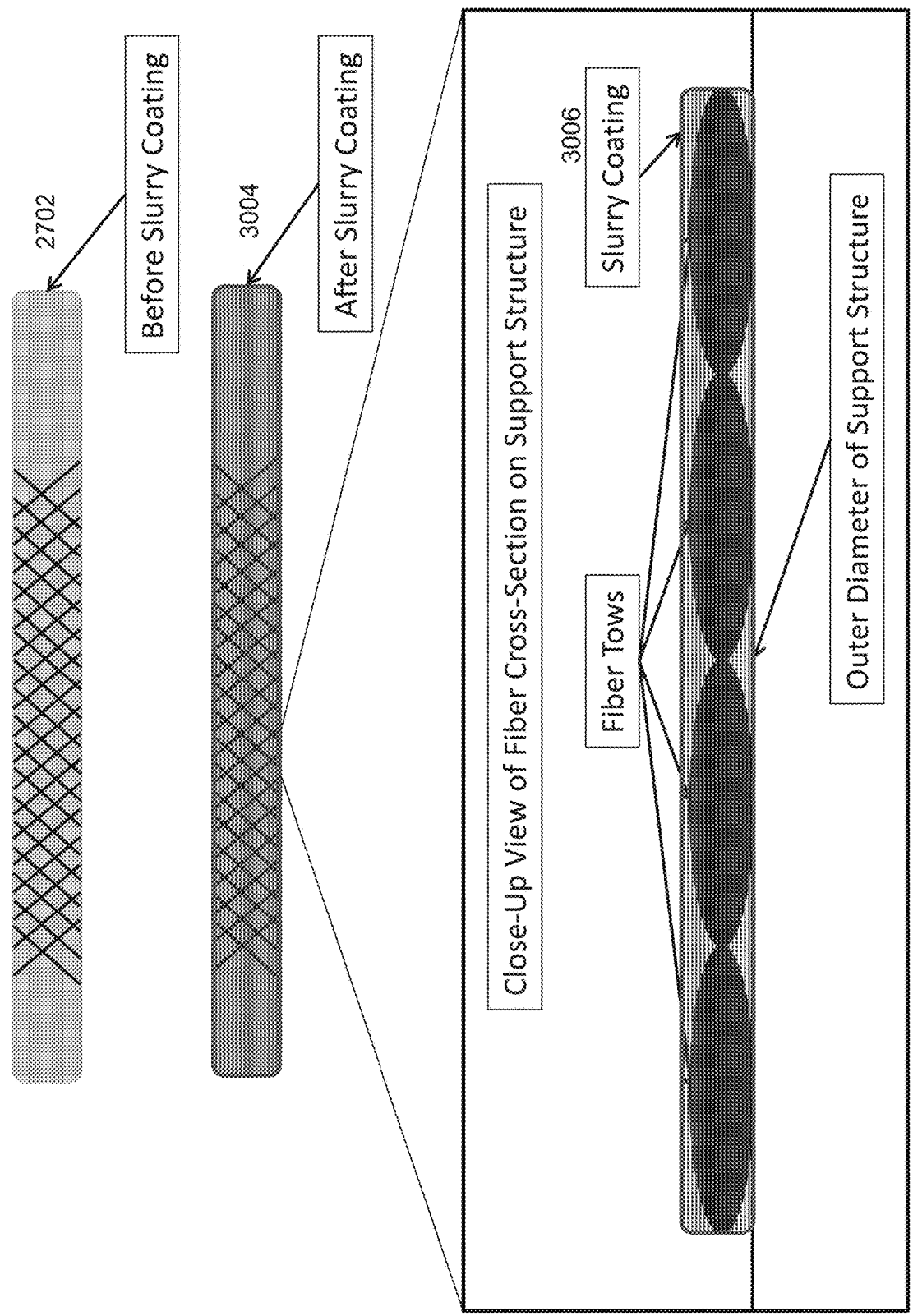

FIG. 30 shows an exemplary scheme diagram of a fiber-wrapped support structure before and after slurry coating is applied.

Figure 31:
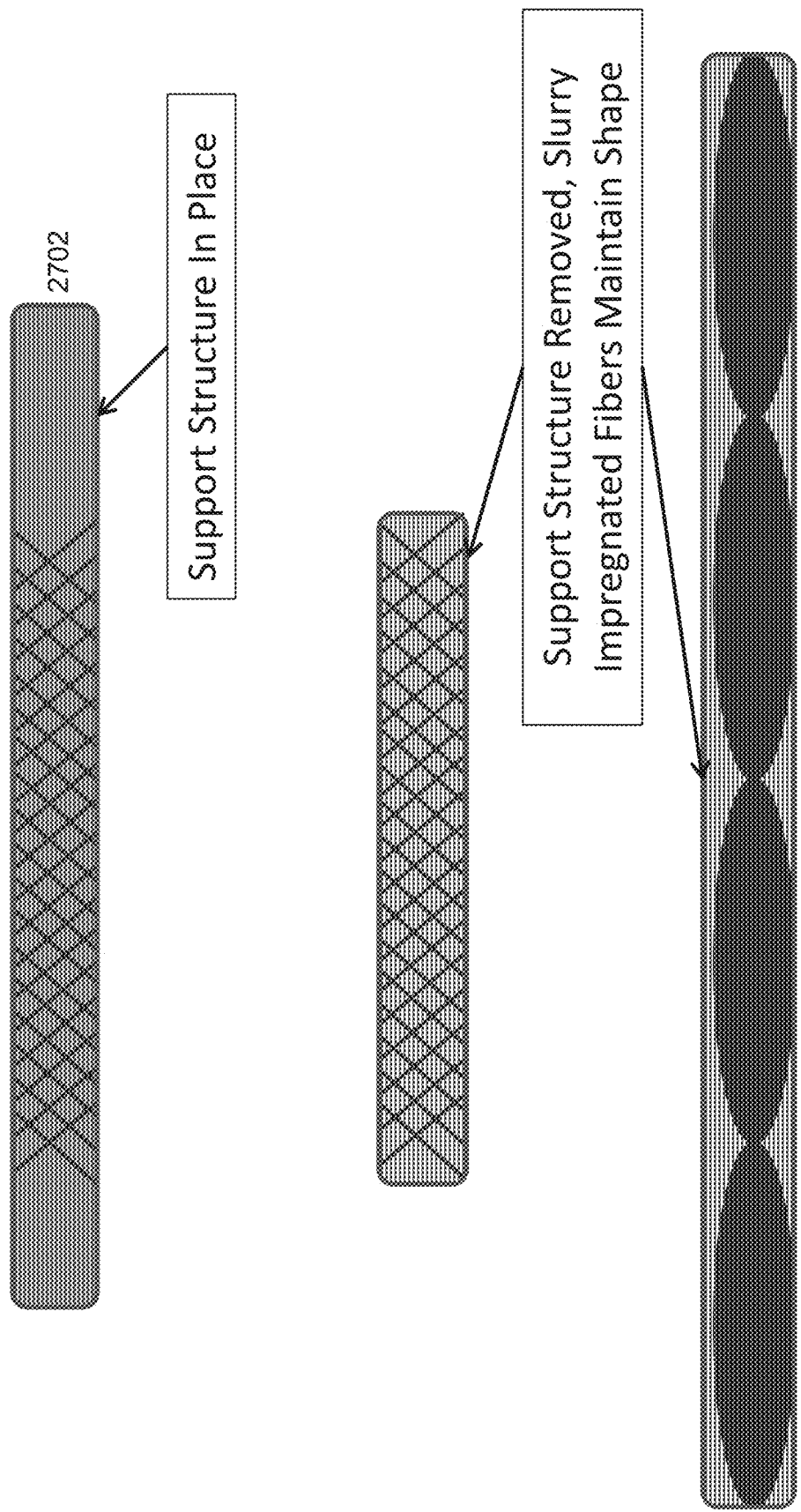

FIG. 31 shows an exemplary scheme diagram of a slurry impregnated fiber tube with the support structure removed.

Figure 32A:
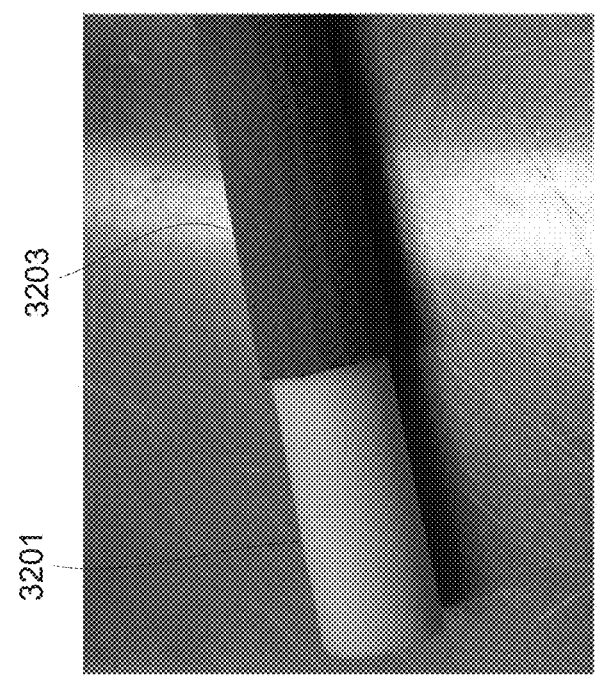

FIG. 32A shows an example of the support structure being slid out of the preform.

Figure 32B:
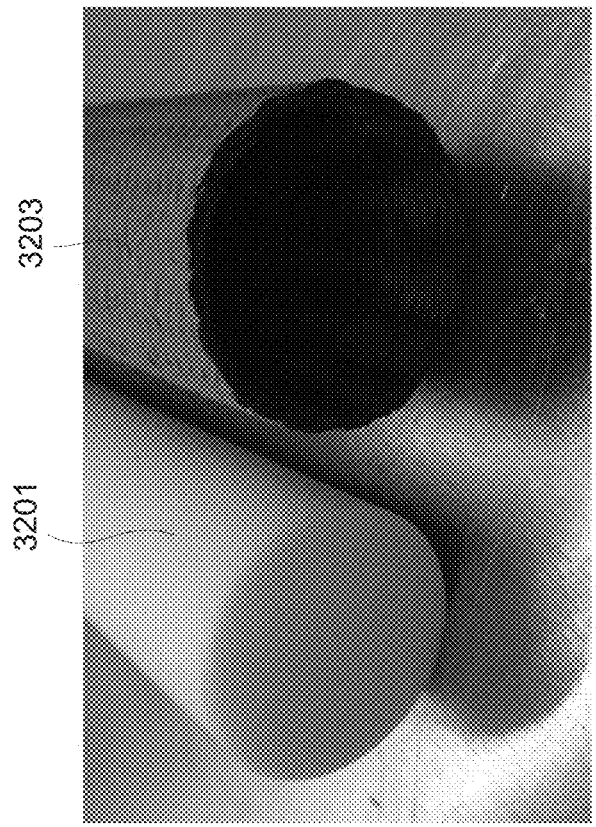

FIG. 32B shows an example of the supported structure separated from the preform.

Figure 33:
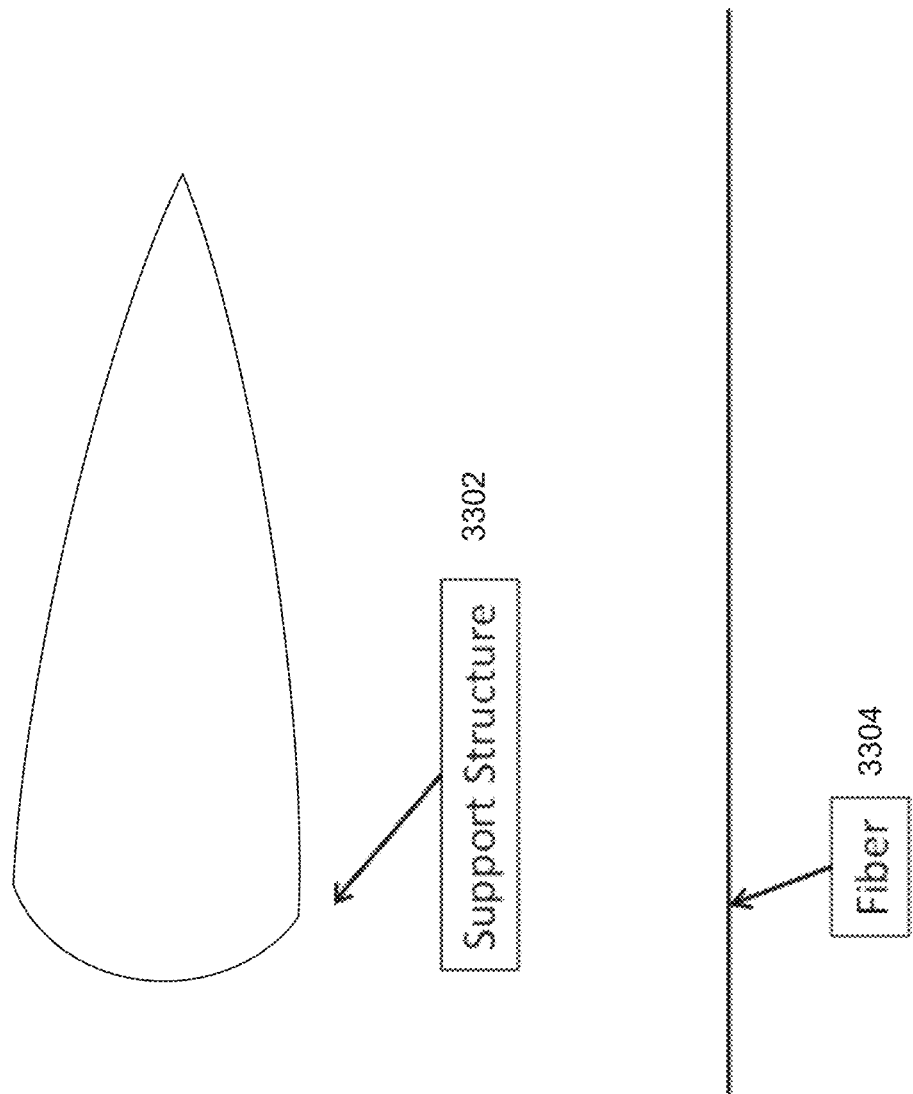

FIG. 33 shows an exemplary scheme diagram of a support structure and a fiber to be used for forming a composite fiber preform suitable for use in aerospace field.

Figure 34:
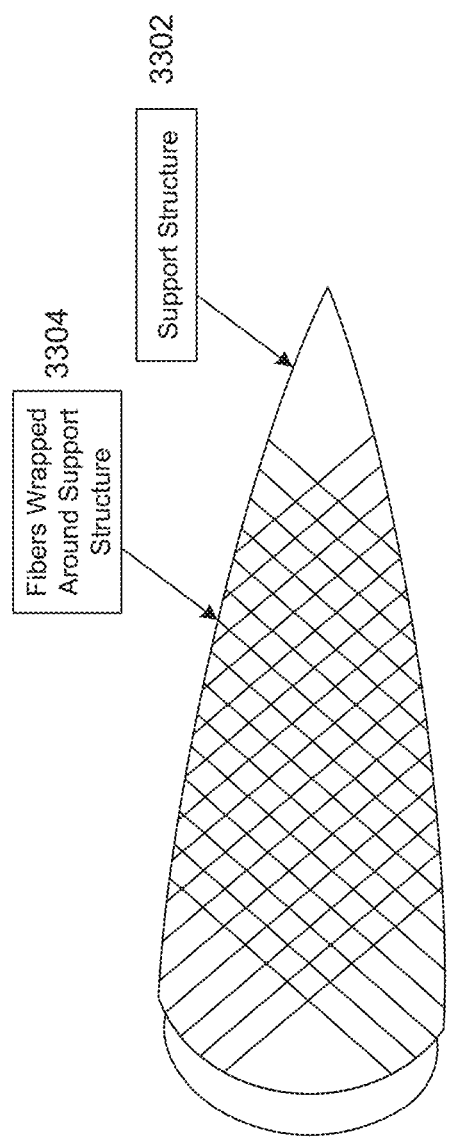

FIG. 34 shows an exemplary scheme diagram of a support structure with composite fibers wrapped around the support structure.

Figure 35:
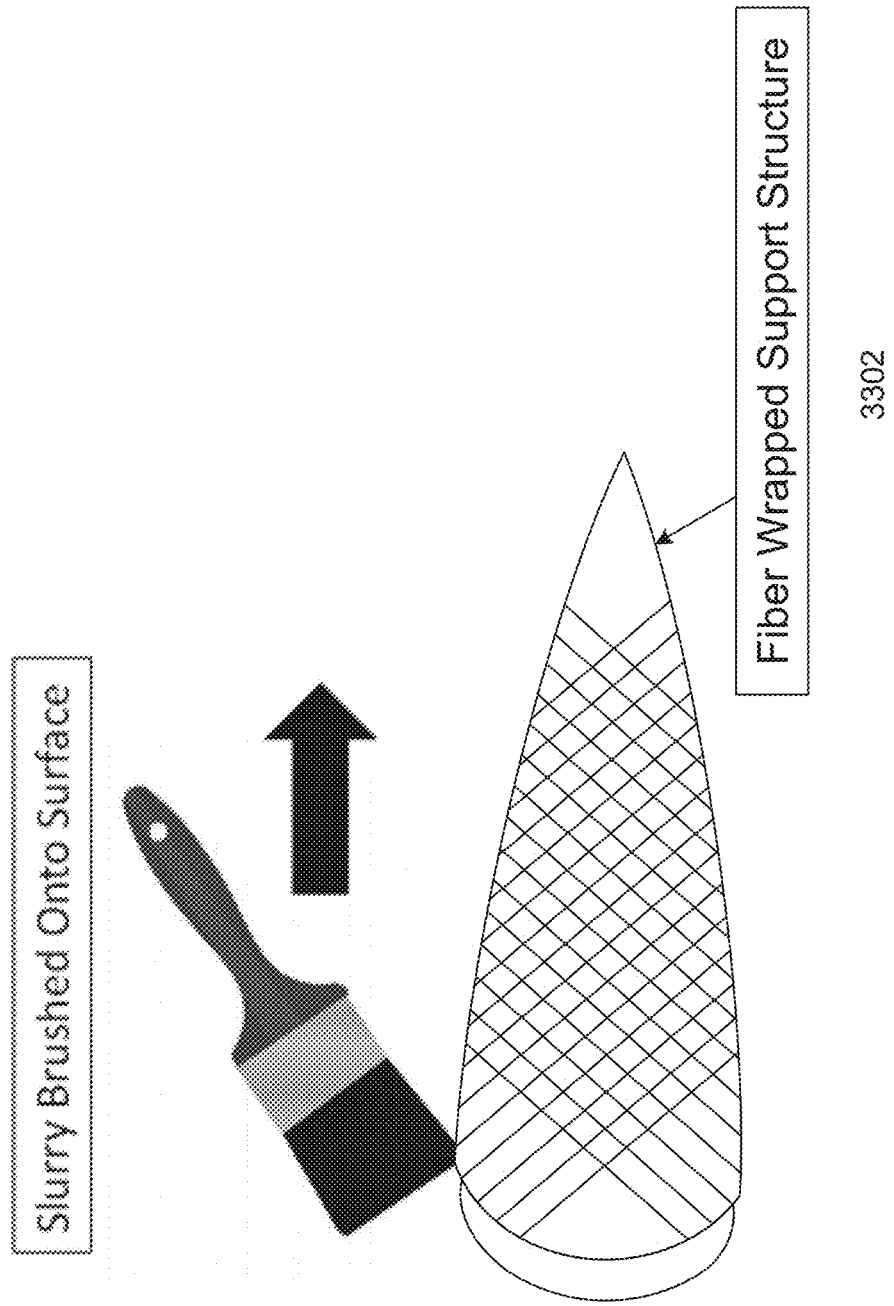

FIG. 35 shows an exemplary scheme diagram of brushing slurry on a fiber-wrapped support structure.

Figure 36:
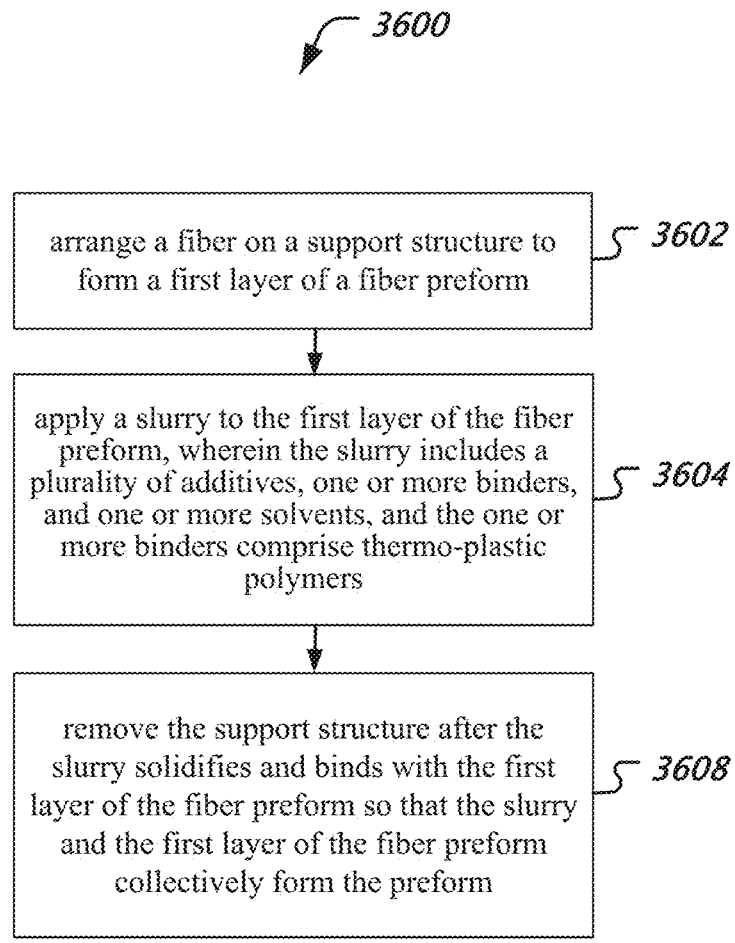

FIG. 36 shows an exemplary flow chart for the method for fabricating a preform suitable for use in nuclear fuel cladding manufacture in nuclear reactors.

DETAILED DESCRIPTION

Figure 1A:
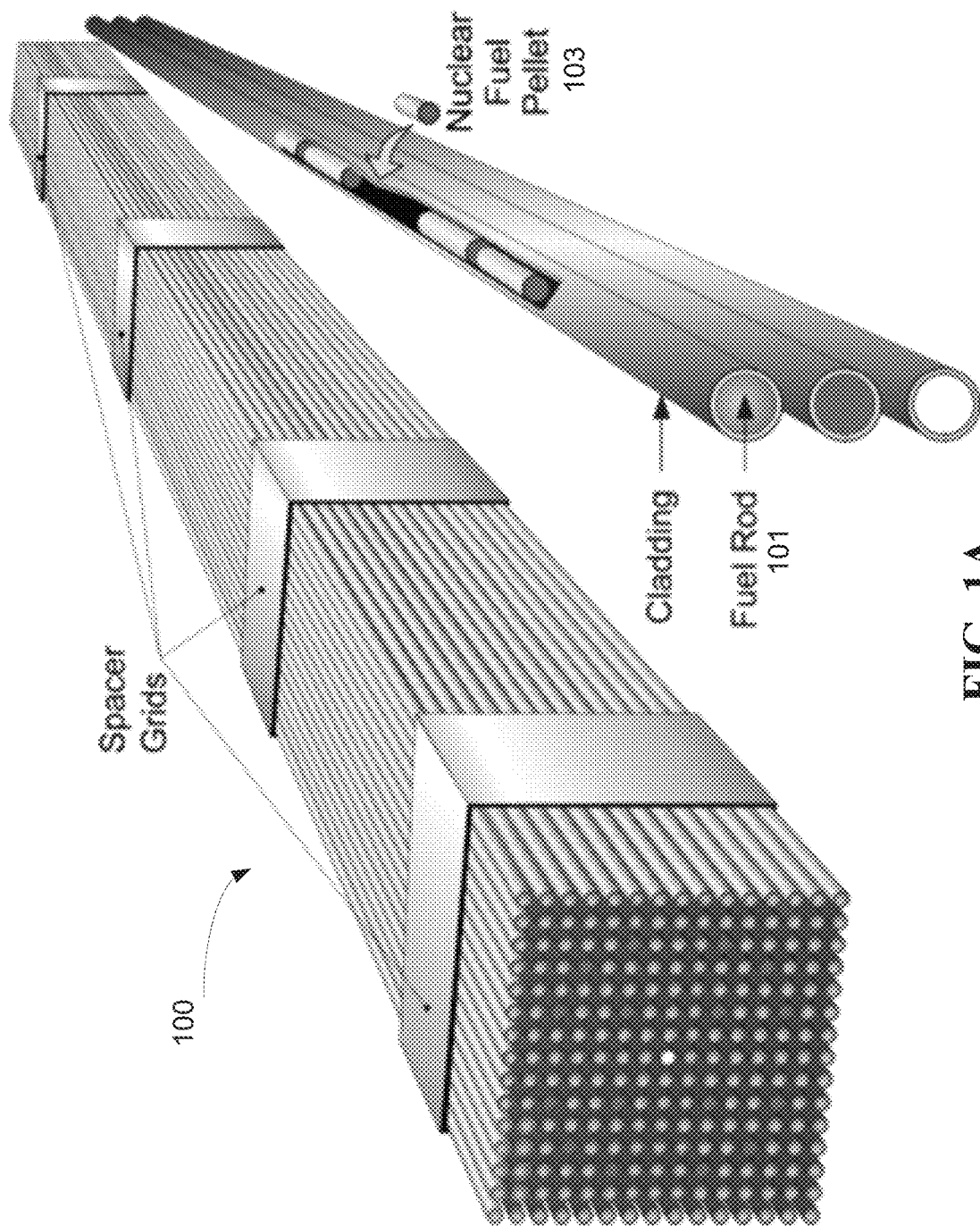
FIG. 1A shows an exemplary nuclear fuel assembly.

The nuclear fuel material used in a nuclear reactor is usually held in fuel rods capable of enduring high operating temperatures and an intense neutron radiation environment. Fuel structures need to maintain their shape and integrity over a long time period within the reactor core, thereby preventing the leakage of fission products into the reactor coolant of a reactor. FIG. 1A shows an example of a nuclear fuel rod assembly 100 formed of a bundle of fuel rods 101 used in a nuclear reactor. Each rod has a hollow interior to contain nuclear fuel pellets 103 such as Uranium-containing pellets and spacer grids are used to hold the rods in the assembly. A reactor is designed to hold many nuclear fuel rod assemblies in operation. Some fuel rods use zirconium cladding but the fuel rods in this document use SiC ceramic matrix composites (CMCs) for improved performance.

Silicon carbide (SiC) can be used in both fission and fusion applications, and recently has been considered as a candidate material for accident tolerant fuel cladding for light water reactors. High purity, crystalline SiC is a stable material under neutron irradiation, undergoing only minimal swelling and strength changes to 40 dpa and higher, which represents many times the exposure for a typical light water reactor (LWR) fuel life. In addition, SiC retains its mechanical properties at high temperature and reacts slowly with steam compared to Zircaloy, thus affording improved safety for water cooled reactors in a loss-of-coolant (LOCA) and other potential accident conditions. However, various monolithic SiC materials alone tend to exhibit low fracture toughness and such materials are unsuitable for nuclear cladding applications where fuel containment is essential and a coolable geometry must be maintained, especially under transient or off-normal conditions. Engineered composite structures can be used to address this brittle behavior of such monolithic SiC materials, using strong silicon carbide fibers that reinforce a SiC matrix to form a SiC—SiC composite. Compared to monolithic SiC, these composites offer improved fracture toughness, pseudo ductility, and undergo a more graceful failure process. High purity, radiation tolerant silicon carbide composites are typically fabricated using chemical vapor infiltration (CVI). While CVI provides the necessary purity for nuclear applications, it is challenging to reach very low porosity levels (<5%). As a consequence, the composite alone may not be sufficient to contain fission gases within the fuel cladding. Ultimately, a SiC-based cladding structure that is optimized to combine a tough SiC—SiC composite with a monolithic SiC layer, where the dense, monolithic SiC serves as an impermeable fission gas barrier and provides improved corrosion resistance, is the most promising design to achieve a completely SiC-based accident tolerant fuel cladding design.

In various nuclear reactor applications, in addition to providing desired strength or toughness at high temperatures caused by nuclear reactions, it is desirable that SiC-based fuel cladding meet a range of material property requirements and performance requirements, exhibit stability under irradiation, and have reduced oxidation compared to other nuclear cladding materials such as zircaloy. These requirements are primarily driven by differences between properties of silicon carbide structures compared to Zircaloy tubes, and the resulting implications of these differences on the performance. Specifically, the properties of SiC-based cladding are highly dependent on the processing route used, particularly for any fiber reinforced composite layers. In addition, while SiC—SiC composites undergo pseudo-ductile fracture rather than brittle failure, extensive micro-cracking occurs during this process which can lead to a loss of hermeticity. This micro-cracking occurs at strains in the range of 0.1% a strain level at which Zircaloy cladding would not yet exhibit any plastic deformation. Accordingly, attention to characterization and careful development of the SiC-based cladding design is needed to mitigate micro-cracking and ensure hermeticity. Another consideration is that while silicon carbide has a lower irradiated thermal conductivity than Zircaloy, it does have the advantage of not undergoing irradiation-induced creep at LWR operating temperatures like Zircaloy, which will delay pellet-cladding mechanical interactions and associated stresses.

Achieving controllable cladding tube circularity, roughness, and straightness therefore are very important for predictable heat transfer through the cladding. The lower thermal conductivity of a SiC-based cladding leads to higher temperature gradients through the cladding for a given linear heat rate. These temperature gradients can lead to significant stresses due to thermal expansion and irradiation-induced, temperature-dependent swelling. These stresses (and corresponding failure probabilities) can be reduced by decreasing the cladding wall thickness, which in turn lowers the temperature gradient. In addition, the cladding architecture (a combination of composite and monolithic SiC layers) can significantly influence the stress distribution though the cladding thickness during normal operating conditions as well as accident scenarios. With careful design, the stresses on critical layers within the cladding structure can be reduced. However, there are fabrication and handling challenges associated with both reductions in the wall thickness for long fuel cladding tubes, and production of specially designed tube structures.

The implementation of SiC-based accident tolerant cladding tubes in light water reactors will not only require design of optimized structures and development of consistent, scalable fabrication methods, this will also require thorough understanding and characterization of the material being produced. Among other performance metrics, the mechanical and thermal properties must be measured, and the permeability must be assessed. A limited collection of test standards has been accepted by the community (ASTM C28.07 ceramic matrix composite sub-group), and development of additional characterization tools is necessary.

Figure 1B:
FIG. 1B shows an exemplary heat exchanger.

Moreover, such accident tolerant SiC composite structure can also be used in variety of high temperature applications such as heat exchangers to recuperate high temperature waste heat from aluminum recycling, syngas production, or gasification-combined-cycle plants. FIG. 1B shows an example of a heat exchanger. The use of SiC composites, which is high temperature compatible and corrosion resistant, is an effective way to address corrosion problems that are escalating as crude oils are often contaminated with naphthenic acid, sulfur, carbon dioxide and hydrogen sulfide.

The aerospace field also has a wide variety of applications that are an ideal match for the high temperature strength of SiC composites: nosecones, shrouds, airfoils, turbine blades and other jet engine components. In all cases, the geometry of a fiber preform must be maintained during the fabrication process to produce a near net-shape ceramic matrix composite, component.

This patent document describes examples of layered ceramic composite structures suitable for use as nuclear fuel cladding as well as other non-nuclear applications that require operation in high-temperature and/or high-corrosion environments. The all-ceramic cladding fabricated using the disclosed technology provides significant advantages and safety improvements over existing zirconium-alloy based water-cooled nuclear reactor fuel cladding. An all-ceramic cladding design, when properly engineered, can provide improved performance, allowing for increased power density, higher fuel burn-up, and longer fuel life. In addition, the strength of metallic cladding significantly decreases at elevated temperatures, which can be encountered during accident or loss of coolant conditions. The reduced strength can lead to failure of the cladding and the release of fission gases or fuel, as was seen in the Three Mile Island and Fukushima accidents. An all-ceramic fuel cladding, and SiC-based cladding in particular, retains strength to much higher temperatures than zirconium alloy or other metallic cladding material. The superior high temperature mechanical performance also results in reduced cladding creep over the life of the fuel, which delays the onset of undesirable fuel-cladding mechanical interactions. During accident conditions, it is also probable that water coolant vaporizes to form super-heated steam. At high temperatures, this steam can react exothermically with zirconium alloy cladding creating an additional heat source, and this reaction can also liberate hydrogen gas from the water or steam. This hydrogen can build-up and reach flammable concentrations, and lead to explosions, as seen in the Fukushima disaster. The release of hydrogen gas, through chemical reactions with high temperature steam or water, is greatly reduced with ceramics such as SiC compared to zirconium alloys. Softer metallic cladding materials are also more susceptible to coolant flow-induced erosion compared to ceramic cladding.

This patent document also includes reports on the characterization of such SiC-based structures. The structures included fully composite tubes as well as tubes containing a monolithic layer on the outer surface, and were evaluated in the as-fabricated condition, or after additional processing steps had been performed. Mechanical, thermal, dimensional, and permeability measurements were made, and the utility of different characterization methods was evaluated.

Various SiC/SiC composites structures tend to be pliable prior to the densification process during fabrication. To manufacture a hollow composite cladding body, which may be a very long and thin-walled tube such as those illustrated in the example in FIG. 1A, a support structure is used to define and maintain the shape for the composite fiber.

The conditions for chemical vapor deposition (CVD) or chemical vapor infiltration (CVI) of a SiC matrix are very harsh; high temperature and corrosive environment are usually involved. Therefore, few materials are suitable for use as a mandrel. Graphite can be used as a mandrel material as it can withstand these harsh conditions. The much higher oxidation rate of graphite at elevated temperatures allows for the removal of the graphite mandrel from the SiC composite without damage to the composite. Details of certain examples regarding the graphite mandrel are further described in the U.S. Pat. No. 5,282,734, filed on Jul. 20, 1992, the entire contents of which are incorporated by reference in this patent document. However, the mandrel removal step usually involves burning or machining away the graphite material because the SiC CMC can become mechanically interconnected with graphite. The removal step is time consuming and introduces risks of oxidation of the fiber interface coating, which coats the SiC fibers in the CMC and is crucial for maintaining beneficial composite behavior. The graphite mandrel also limits surface area for fiber interface coating to the outer diameter surface because the graphite mandrel must be present during the CVI/CVD coating process. Moreover, the removal of graphite mandrel usually damages the graphite material and leads to one-time use of the mandrel, thus the use of graphite mandrels can become very expensive.

This patent document further describes techniques and methods for fabricating SiC composite structures into complex shapes without a graphite mandrel during matrix processing.

Design Examples

As a specific example, a SiC-based composite tube can include dense β-SiC layers and reinforced SiC composite layers that collectively form a tube for holding a nuclear material fuel inside the tube. In this example, the dense β-SiC acts as an impermeable barrier to fission product and gas escape and the SiC—SiC composite layer provides mechanical strength and enhanced toughness. The design benefits from the specific properties of both of these materials, and would not be feasible without both, as a 100% dense monolithic cladding would be too brittle, and a 100% composite cladding would be very difficult to make sufficiently impermeable. In order to take full advantage of the properties of both monolithic and composite materials, the stresses anticipated under operation must be considered. In general, monolithic ceramics perform much better in compression than in tension, and excessive tensile forces can cause monolithic ceramics to catastrophically crack, resulting in a loss of hermeticity. Ceramic composites are much tougher and better able to withstand tensile loads and micro-cracking without catastrophic failure. Therefore, for the anticipated stresses seen by the cladding throughout the cladding life, it is beneficial that the monolithic ceramic be located in regions where compressive stresses are anticipated.

Modeling or simulation results were performed on this composite structure example to estimate stresses experienced by nuclear fuel cladding over the life of a typical light water reactor fuel rod. The results are strongly affected by the thermal gradient through the cladding wall thickness and the irradiation effects on silicon carbide. While these calculations were performed for a light water reactor application, similar thermal gradient and irradiation effects will be present in other reactor types (such as gas-cooled, sodium-cooled, or other advanced reactor types), and these conclusions will apply to cladding for a broad range of nuclear reactors. In nuclear fuel rods, the fuel pellets contained within the cladding release a large amount of heat due to the fission reactions taking place. This heat transfers through the cladding wall thickness, where it is then transferred to the coolant. This heat transfer creates a temperature gradient through the cladding which is a function of the heat being transferred, the thermal conductivity, and the cladding thickness. The cladding temperature tends to be the highest on the inside surface and the lowest on the outside surface, and with all else being equal, the thermal gradient increases as the cladding wall thickness increases.

Figure 2A:
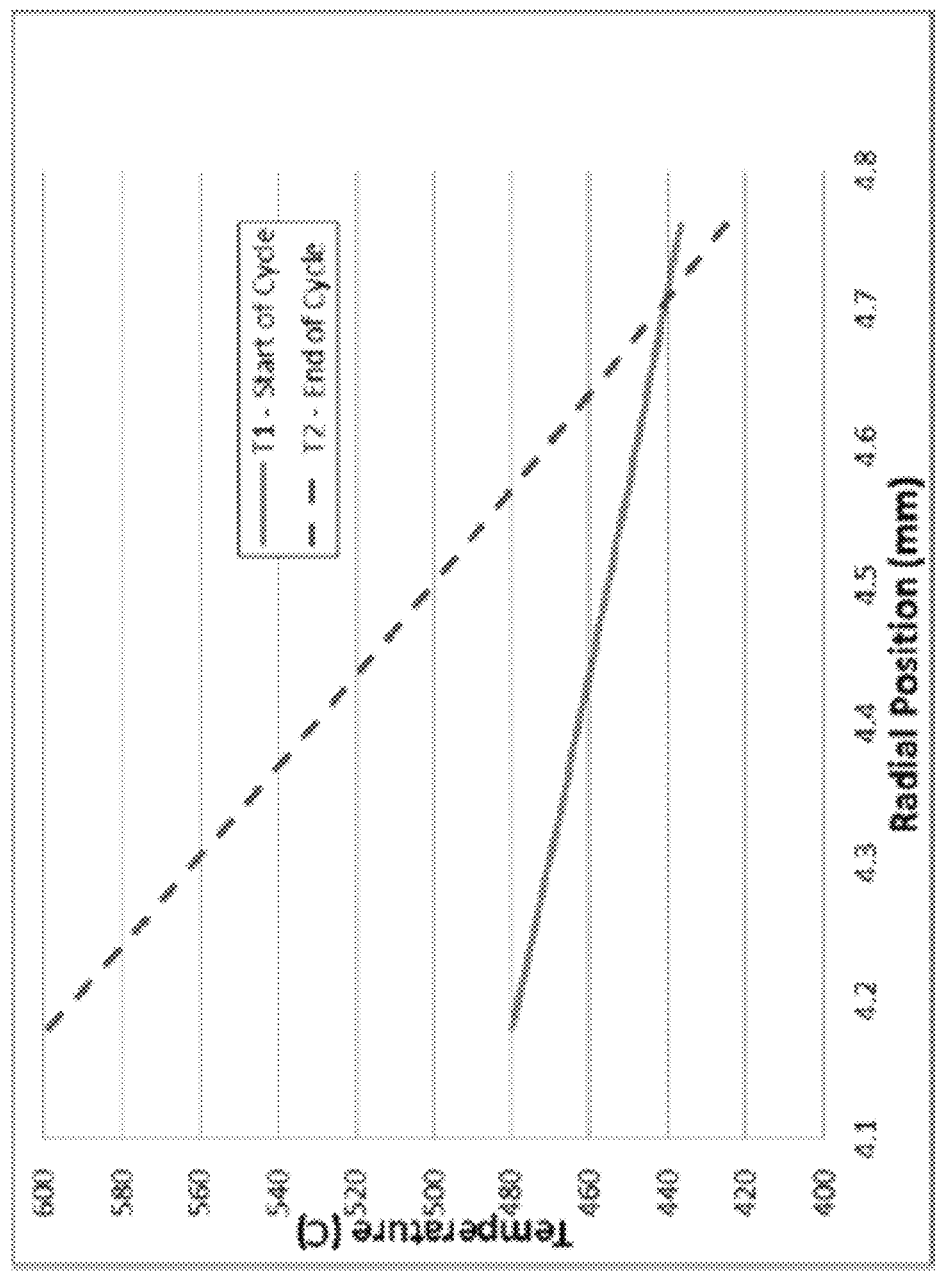
FIG. 2A shows an example of temperature profile for a SiC—SiC composite LWR cladding.

FIG. 2A shows a representative temperature profile for a SiC—SiC composite LWR cladding. This thermal gradient contributes to two major sources of stresses in the cladding. The cladding has a corresponding coefficient of thermal expansion, and in general, the hotter areas of the cladding expand more than the colder areas of the cladding due to the temperature gradient. For a tube geometry, the hotter inside expands more but is constrained by the colder outside, and this thermal expansion effect contributes to compressive stresses on the inside and tensile stresses on the outside of the cladding. In addition, silicon carbide undergoes a small but non-zero amount of irradiation-induced swelling and this swelling is a function of the temperature. The swelling is lower at higher temperatures (within the range anticipated for cladding applications), and higher at lower temperatures. As a consequence, the cooler outside of the tube swells more than the hotter inside of the tube, and thus is restrained from swelling. This irradiation-induced swelling effect contributes to tensile stresses on the inside of the tube and compressive stresses on the outside of the tube. In addition to these temperature dependent stresses, there is also internal or external applied pressures, due to either externally applied coolant pressure, or internal pressure caused by fission gas build-up.

Figure 2B:
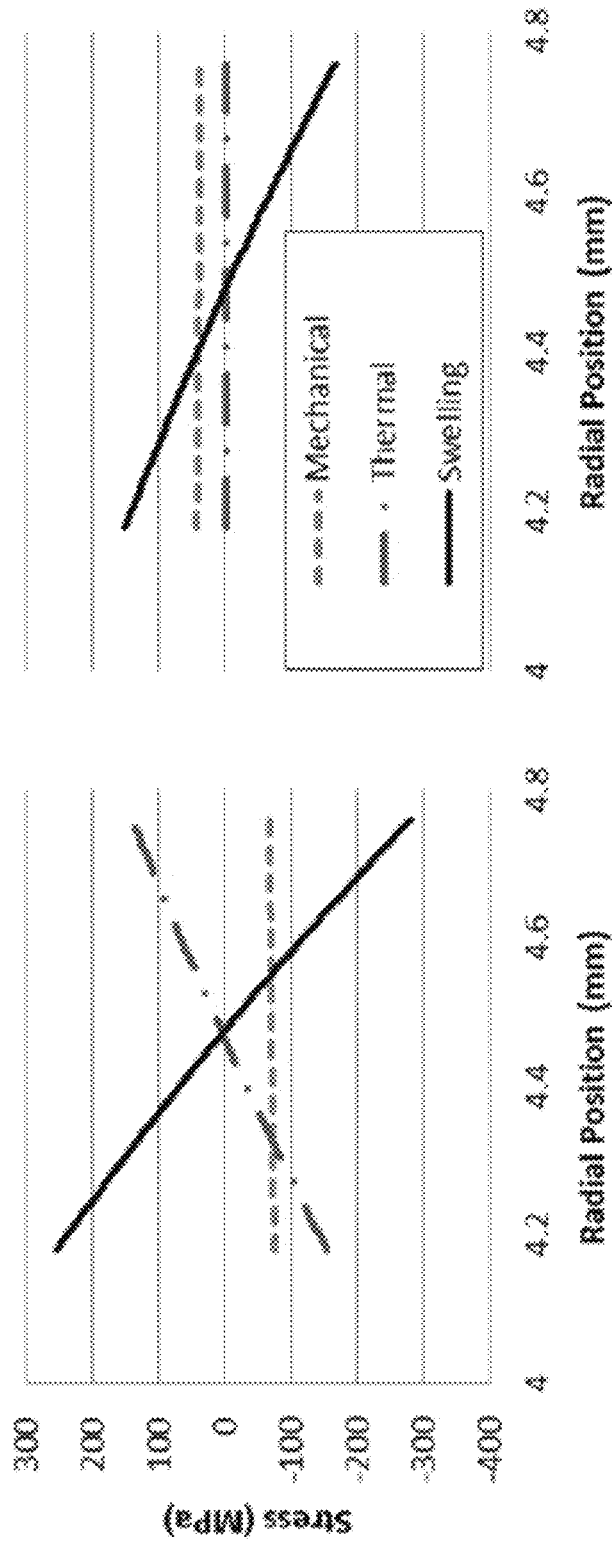
FIG. 2B shows an example of profiles of different contributions to cladding stresses for a SiC—SiC composite cladding.

FIG. 2B shows representative profiles of different contributions to cladding stresses for a SiC—SiC composite LWR cladding. Stresses from thermal expansion, swelling, and pressure are shown as a function of radial position through the cladding wall thickness, and are shown for the end of cycle and shutdown situations, which are more demanding than the beginning of cycle stresses. The stresses caused by the irradiation-induced swelling are the largest, and put the outside of the cladding wall thickness in compression and the inside in tension.

The total anticipated stresses in the cladding can be estimated by summing these stress effects over the course of the fuel life (as temperature change, irradiation damage occurs, and as the reactor is started and stopped for refueling). The sum of these effects indicates that the irradiation induced swelling plays the largest contribution to the cladding stresses, and that the summed stresses are tensile on the inside of the cladding tube wall thickness, and compressive on the outside of the tube wall thickness. Therefore a significant benefit can be achieved if the monolithic layer is placed towards the outside of the cladding tube wall thickness rather than the inside of the cladding tube wall thickness, as the monolithic layer will see fewer tensile stresses and have a higher probability of survival over the course of the fuel life. This drives the cladding design which is described as follows.

In some embodiments, the cladding can be kept thin to maximize fuel loading, and a thinner cladding reduces the thermal gradient during operation. This reduced thermal gradient reduces the stresses described above. However, there are minimum thicknesses for the layers. The dense β-SiC should be sufficiently thick to ensure fission product and fission gas retention, and the SiC—SiC composite should contain enough reinforcements to provide adequate toughness for the overall structure. As a specific example, the reinforced composite layers should comprise greater than 50% of the overall cladding thickness, and should preferably comprise greater than 70% of the cladding thickness. In some embodiments, the cladding structure can include three or more layers. For example, the cladding structure may include at least two composite layers and at least one monolithic layer, in a configuration where the two composite layers are inside of the monolithic layer. In addition, the two composite layers are different from each other, in order to serve complimentary functions. Specifically, the composite layers may vary in the type of composite reinforcement used, the angle or orientation of that reinforcement, or the method of generating the reinforcement structure (for example, braiding, winding, etc.). The combination of these two (or more) composite layers provides improved performance beyond what could be obtained through the use of a single composite layer. For example, one composite layer may be designed to provide a smoother surface, while a second composite layer may be designed to provide optimized strength. In this example, the first composite layer may contain smaller additives to improve the as-fabricated surface smoothness and minimize expensive post-processing machining steps while meeting surface roughness specifications. The second composite layer in this example may contain continuous reinforcing fiber in a specific braided structure which offers a balance of strength in the hoop and axial direction optimized for the anticipated stresses the cladding will experience during operations. The monolithic layer is outside these two composite layers and it is very important that the composite layer is located towards the inside or center of the cladding wall thickness to minimize the tensile stresses seen by the monolithic layer (as described above). The central composite layer (or layers) provides the primary mechanical strength and toughness. The inner composite layer provides complimentary mechanical support, and can also have a structure that offers a smoother inner surface. This smoother surface can improve performance in nuclear cladding applications by giving a more uniform pellet-cladding gap, which leads to a more uniform and consistent temperature distribution in the cladding and reduces temperature-dependent stresses and other failure modes. Minimizing roughness can also facilitate more efficient fabrication of the overall fuel rod, as the fuel pellets must be loaded into the cladding, and rough surfaces can catch on pellet edges and inhibit pellet loading operations. Due to the composite structure of this inner layer, the required surface roughness can be achieved with little or no additional machining, saving time and costs.

The mechanical performance of composite layers tends to highly depend on the orientation of the reinforcements. A composite with a structure that offers the best combination of relative strengths in the axial and hoop directions (to best accommodate anticipated stresses during operation) may have a rougher, more textured surface and would not be the optimal composite structure to provide a smooth surface. Conversely, a composite structure that offers a smooth surface (providing a more consistent fuel-cladding gap and improved performance) may need smaller or carefully aligned reinforcements, which may not provide the optimal mechanical reinforcement on their own. Through the use of two composite layers working together the structure can be optimized and can achieve both these objectives. The layers can also be designed to tightly fit together, reducing the wall thickness and increasing the reinforcement volume fraction in the cladding, which can be beneficial for enhancing the structural toughness. This approach can be applied to more than two composites layers, and cladding designs with two or more composite layers on the inside and center of a cladding tube to meet cladding performance requirements.

A specific example of this composite structure is described below:
1. Inner layer is made of a SiC-based composite with distinct structure "A" (as defined by the type of reinforcements, the orientation of the reinforcements, the method of applying the reinforcements, etc.).
2. Middle layer is made of a SiC-based composite with distinct structure "B" (differing from structure "A" in terms of the type, orientation, or fabrication method of the reinforcement).
3. Outer layer is made of monolithic SiC.

Other SiC-based layers can be added as described in the present document, and an outer environmental barrier coating can also optionally be added.

The composite layer is toughened by high aspect ratio ceramic inclusions, including ceramic fiber or whiskers, and an interphase layer deposited on the reinforcement allows for load transfer and sliding between the inclusions and the matrix. In one embodiment, the inner layer is a thin composite layer fabricated with small-scale whisker reinforcement to provide a smooth inner surface. Alternately, in another example this layer can be composed of a thin layer reinforced with wound continuous fiber reinforcement. In these examples, the following layer could then be composed of braided continuous fiber reinforcement with a structure designed to accommodate the anticipated stresses during operation. Another example would be two composite layers, both composed of braided continuous fiber, but with the braid structure or fiber angle of the braid varied, so as to provide the needed mechanical properties while at the same time achieving good fiber coverage and a relatively smooth surface. In both these examples, a monolithic outer ceramic layer is added. The positioning of the monolithic layer towards the outside of the structure and the thickness of this layer is carefully selected to ensure this layer remains in compression when subjected to operating stresses. By minimizing or avoiding any tensile loads on this monolithic layer, the chance of cracking can be greatly reduced, significantly improving the survival probability.

In some embodiments of the composite cladding structures, there can also be an additional thin environmental barrier coating layer on the outside surface to protect the cladding from undesirable cladding-coolant chemical or mechanical interactions and/or to provide controlled surface roughness properties. This layer can be a metal (such as Cr) or ceramic (such as SiC). Additionally, thin interphase layers can optionally be deposited between concentric layers to inhibit crack propagation between layers. These layers can be fabricated sequentially, with one layer deposited directly and with intimate contact on the previous layer. In various implementations, these interphase layers can include a ductile material, such as pyrolytic carbon or a metal.

This cladding can be based on a range of materials, and, as a specific example, the monolithic layer can be silicon carbide, and the composite layers can be SiC—SiC composites, made of a SiC matrix reinforced using SiC fibers, whiskers, or other reinforcements. The constituent materials can be of materials of high purity because the presence of impurities tend to reduce performance in nuclear applications.

The disclosed SiC composite structure can be configured in the form of a long, thin-walled tube. For example, in some implementations, the wall thicknesses can be less than 2 mm, and less than 1 mm thick. The length of the tube is governed by the needs of the specific application. For example, in some nuclear reactors, the cladding for a light water reactor may be 12 feet, 14 feet, or longer, and cladding for a gas cooled fast reactor may be between 8 and 9 feet long. The tube diameter may also be selected based on the needs of the applications, and can range, in some cases, from roughly a quarter-inch diameter up to three-quarter inch diameter or more. The cladding may be fabricated by building up layers from the inside-out, and in general, chemical vapor deposition of high purity silicon carbide is used as a key fabrication step for each layer.

The disclosed SiC composite structure can also be configured into other non-tubular shapes. For example, the aerospace field has a wide variety of applications that are an ideal match for the high temperature strength of SiC composite structures: nosecones, shrouds, airfoils, turbine blades and other jet engine components. The SiC composite structures may be fabricated in a similar manner to the tubular SiC claddings.

Fabrication

Figure 3:
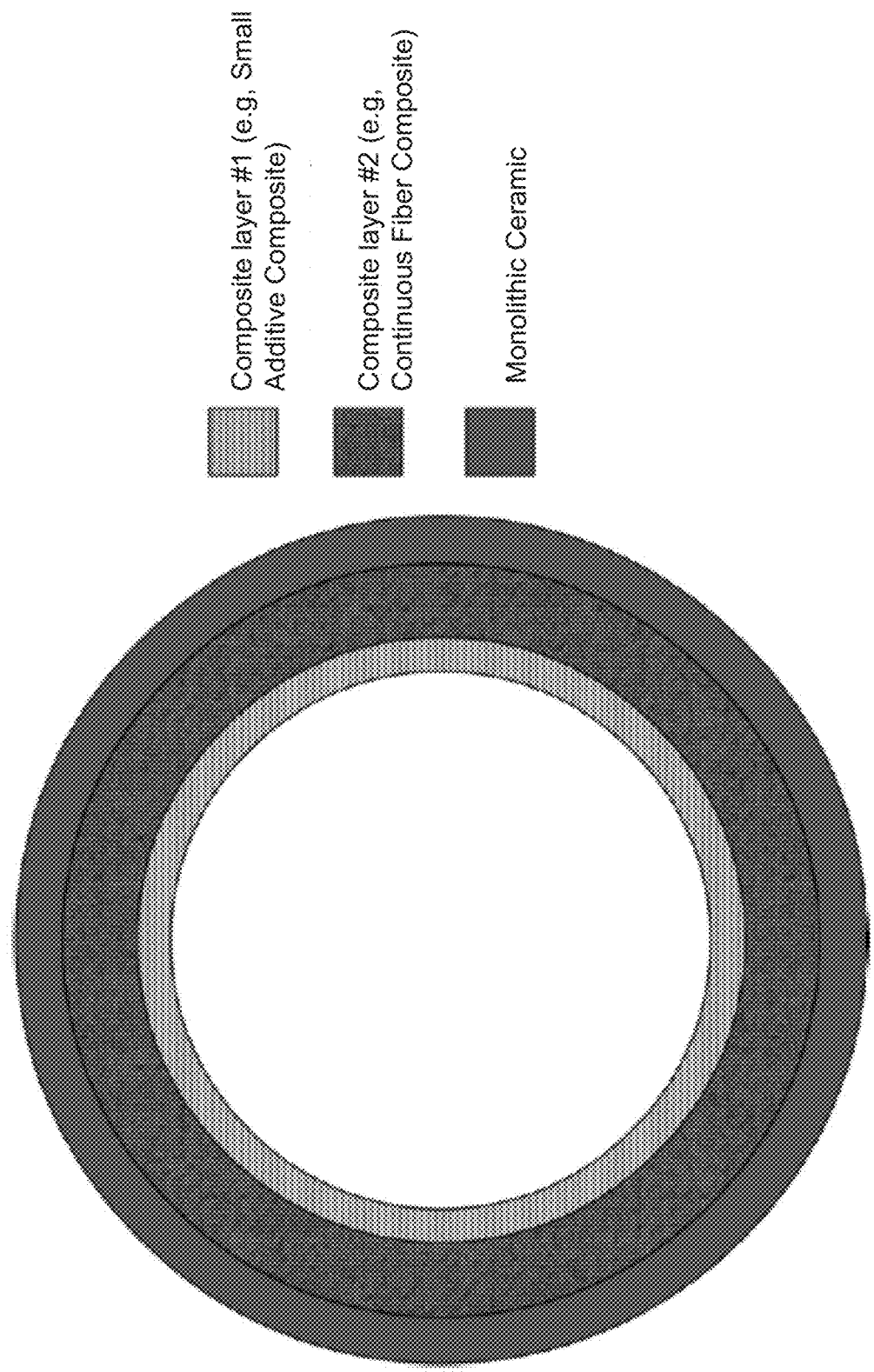
FIG. 3 shows an example of cross-section of LWR cladding concept.

A schematic cross-section of the proposed cladding is shown in FIG. 3. The illustrated cross section represents a portion of the structure.

The low toughness and Weibull modulus of dense β-SiC make it undesirable to use as the sole means of mechanical strength in the cladding. To enhance the cladding performance, SiC-fiber or SiC whisker (or other small SiC additives) reinforced composite layers are used to provide toughness and mechanisms to inhibit crack propagation. SiC fibers and/or whiskers provide enhanced tensile strength, and fiber direction can also be optimized to balance the material performance in the axial and circumferential directions in the cladding. The composite layers in the cladding are positioned towards the inside and center of the cladding wall thickness.

Braided Fiber Composite Layers

In composites with braided reinforcements, stoichiometric, high purity SiC fiber tows are braided into sleeves, which can be braided directly onto a mandrel or partially fabricated cladding, or can be braided separately and later positioned. A pyrolytic carbon or other interface layer is deposited on the fiber using chemical vapor deposition or other methods. This layer serves as an interface between the SiC fiber and the SiC matrix, and can arrest crack growth and allow for load transfer and fiber pull-out and sliding.

High purity SiC matrix is then deposited, with a similar chemical vapor deposition process to that used for the dense β-SiC deposition. A slower deposition rate is used for this matrix infiltration step, and techniques such as forced flow chemical vapor infiltration can be used to reduce the fabrication time. Mechanical and thermal properties improve with increasing composite density, and the relative composite density can be between 70% and 90% or higher. The mechanisms which provide good composite behavior also depend on fiber loading, which can vary between 20% and 50% or more by volume. In these braided layers, a two-dimensional fiber orientation is used, with fibers angled between the axial and circumferential directions to optimize strength. Typical fiber angles range between ±35° and ±75° (relative to the cladding axis), and in some braid structures additional fiber reinforcement can be added aligned with eh axial direction. The thickness of these SiC-fiber composite layers may be selected based on the number of fibers per tow and the braiding parameters. Braiding provides improved fiber content uniformity in the composite layer compared to making multiple passes with wound fiber. If fiber is braided directly onto the partially fabricated cladding, then tension can be used to apply a desirable compressive load to the inner cladding layers. Braid architectures can be varied within the overall multi-layered structure. For example, one braided composite layer with a fiber bias angle of ±45° and another braided composite layer with a fiber bias angle of ±60°. These would constitute two distinct composite layers, and this reinforcement can be tailored to provide optimal performance.

Wound SiC—SiC Composite Layer

A wound composite layer can be formed by reinforcing fiber or tow that has been wound around the cladding or mandrel rather than being braided. The fiber in this layer can be wound at a desired angle (e.g., between ±35° to ±90°) relative to the clad axis compared to the braided sleeves, and one or more tows of fiber can be wound simultaneously. This provides additional fiber reinforcement in the circumferential direction, where stresses will be largest, and provides a smoother surface. In order to obtain a high purity, nuclear-grade matrix, chemical vapor infiltration will be used to densify this composite layer, and a pyrolytic carbon interphase layer or other interphase layer will be deposited between the fibers and the matrix.

Composite Layer with Whiskers or Other Small-Scale Additives

Composite layers may also be formed using smaller scale inclusions (such as SiC powder or whiskers or short lengths of SiC fibers). These micro- and nano-scale additives can be added in dry or slurry form, and can be densified using chemical vapor deposition, similar to the other composite types. In this way, the additives (in dry or slurry form) become the reinforcements in a distinct composite layer, and due to the small-scale of the additive, a very, very smooth composite surface can be obtained. Alternately, this approach can also be coupled with either the braiding or winding approach, with additives impregnated into the fiber braids and winding prior to, during, or after the preforming process. In this way, these additives can be used to fill gaps and larger pores between fiber tows. These additives can also be impregnated into fiber tows, which can subsequently be wound or braided into the cladding structure. If inclusion containing slurry is used to help achieve uniform dispersion, the liquid component of the slurry can be evaporated or pyrolyzed during processing, leaving only small-scale reinforcing inclusions. Alternately, the liquid phase component in the slurry can be a pre-ceramic polymer, which can be reacted to produce crystalline SiC. As with the braided fiber or wound fiber composites, a pyrolytic carbon or other interface layer is deposited on the small-scale additives using chemical vapor deposition or other means to facilitate toughening mechanisms in the composite.

Note that these three distinct composite types is not an exhaustive list, and other approaches for composite reinforcement, structure or orientation of that reinforcement or method of fabricating the composite can be used to generate the differing layers described in this disclosure.

Dense Monolithic β-SiC Layers

To ensure structural stability under neutron irradiation, the dense SiC layer may be stoichiometric, high purity, and β-(cubic) phase in some implementations. Certain methods commonly used to produce SiC (including liquid phase conversion, hot-pressed, sintered) may not be suitable for making nuclear-grade SiC due to high impurity levels (J. Nuc. Mat., vol. 371, pg. 329 (2007)). In one implementation, nuclear-grade SiC can be deposited using a vapor phase reaction with methyltrichlorosilane, methylsilane, silane and hydrocarbon, or other suitable precursors. These precursors can be diluted in a gas stream and flow into a furnace held at appropriate temperatures and pressures, where they decompose to form dense, high purity β-SiC. Dense β-SiC has a relatively low fracture toughness (K1C~3-5 MPa$\sqrt{m}$), and under stress, cracks could initiate at small defects or flaws and propagate through the dense SiC thickness, releasing fission gas, and potentially leading to brittle failure. This unacceptable outcome may be addressed in several ways. The cladding is designed to ensure stresses in the dense β-SiC due to gas pressure, swelling, thermal gradients, fuel-cladding interactions, and other operation stresses remain compressive. This is achieved through specific positioning of the monolithic layer towards the outside of the structure. Based on the SiC layer thickness specifications for TRISO particles, a 35 μm layer provided sufficient thickness for the impermeable SiC layers to ensure fission product retention and pressure containment (J. Nuc. Mat., vol. 355, pg. 150 (2006)). In this proposed fuel cladding design, the internal pressure is lower (~15 MPa at end of life compared to ~40 MPa for German TRISO fuel, J. Nuc. Mat., vol. 371, pg. 270 (2007)), but the hoop stress in the cylindrical geometry is higher than stresses in spherical pressure vessels. Based on these differences, and allowing for additional thickness to ensure impermeability, the dense β-SiC layer thickness should be at least 100 μm. The maximum thickness is governed by the needs to maintain a sufficient fiber loading and to keep the cladding wall thickness thin to minimize stresses related to temperature gradients. Additional polishing of the outer SiC layer can be performed to achieve a desired surface roughness.

The relatively low fracture toughness of dense monolithic SiC can be addressed using one additional route: using ductile layers to inhibit crack propagation. These layers can be pyrolytic carbon or other ductile materials (metals, etc.), and can be deposited in between successive monolithic layers or on the outside of the monolithic layer. Preferably, these layers can be deposited in multiple positions within and on the surface of the monolithic layer or layers. Layers near the inside or outside of the monolithic layer can serve to isolate the monolithic layer from micro-cracking in the composite, or from impacts or stresses on the outside, respectively. Ductile layers deposited between successive monolithic layers serve to partially isolate each monolithic layer from the others, allowing loads to transfer, but preventing cracks from propagating through. This leads to an increased overall reliability and toughness for these monolithic ceramic layers, and provides a structure which can withstand a crack through one monolithic layer without a loss of hermeticity.

The simple cross-sectional schematic shown in FIG. 3 is a representation of the most simplified version of this invention. However, there are many possible ranges which would be covered, with variations in type of composite, relative thickness of layers, and number of layers. Some additional examples are shown as follows, and it should be noted that these examples are just provided for illustrative purposes, and these examples are not comprehensive and other protected structures can exist beyond those shown here.

Figure 4:
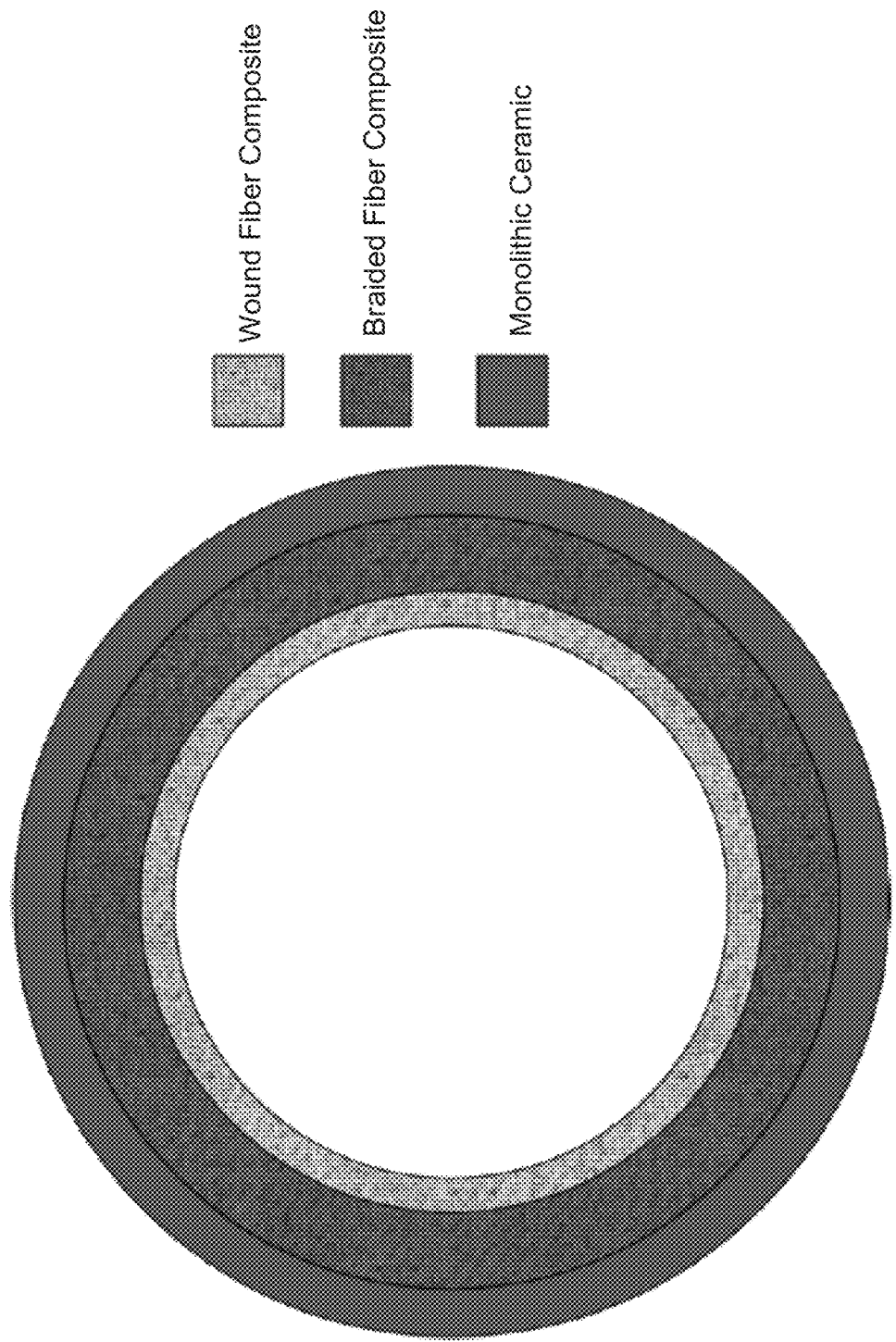
FIG. 4 shows an example of cladding cross-section containing inner wound composite layer, middle braided composite layer, and outer monolithic layer.

FIG. 4 shows a schematic of cladding cross-section containing inner wound composite layer, middle braided composite layer, and outer monolithic layer.

Figure 5:
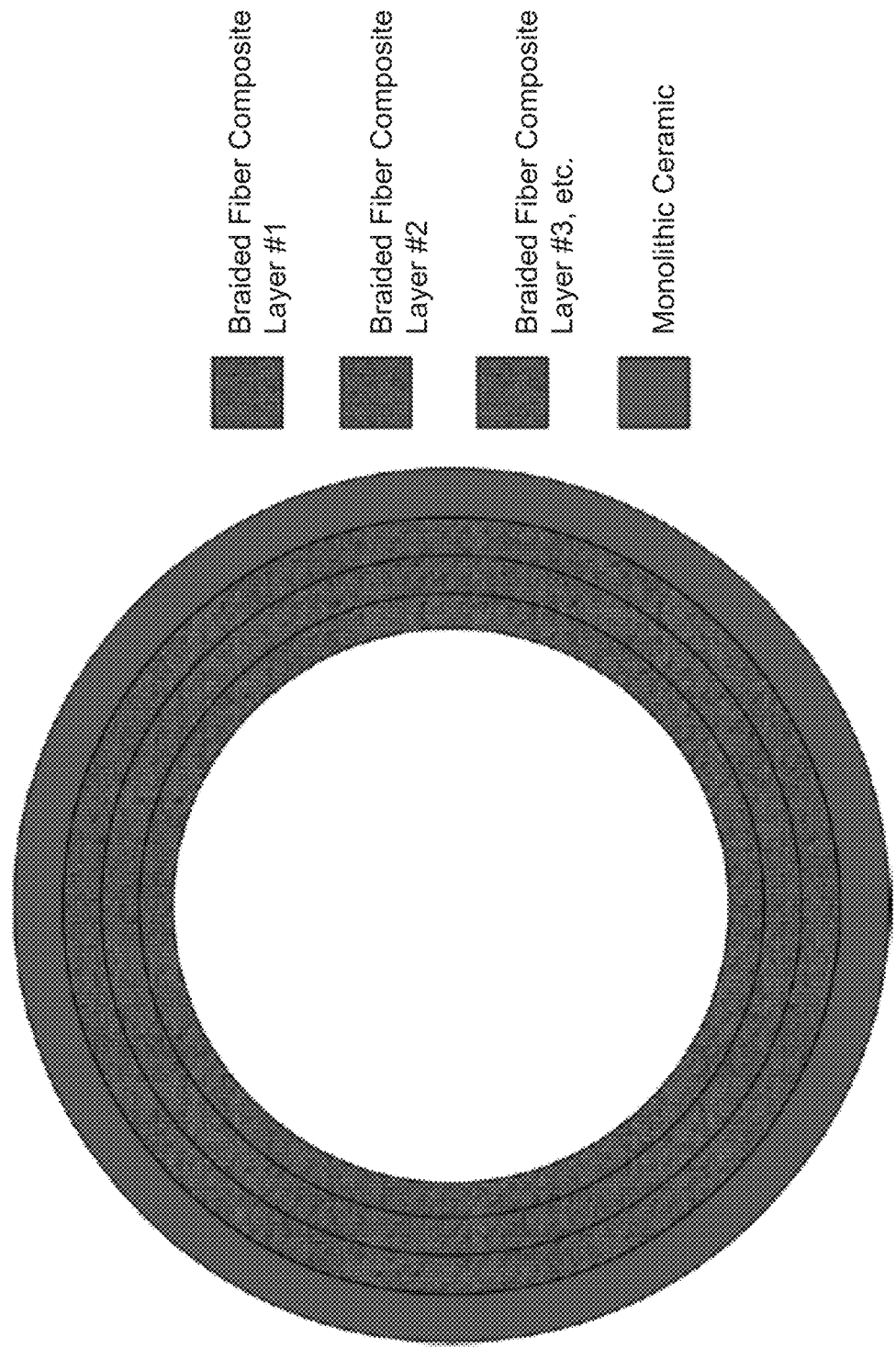
FIG. 5 shows an example of cladding cross-section containing multiple inner braided composite layers and an outer monolithic layer.

FIG. 5 shows a schematic of cladding cross-section containing multiple inner braided composite layers and an outer monolithic layer. Note the braid layers may differ in architecture (e.g. biaxial vs. triaxial), and/or fiber angle (e.g. 45°±5° for the first layer, 50°±5° for the second layer).

Figure 6:
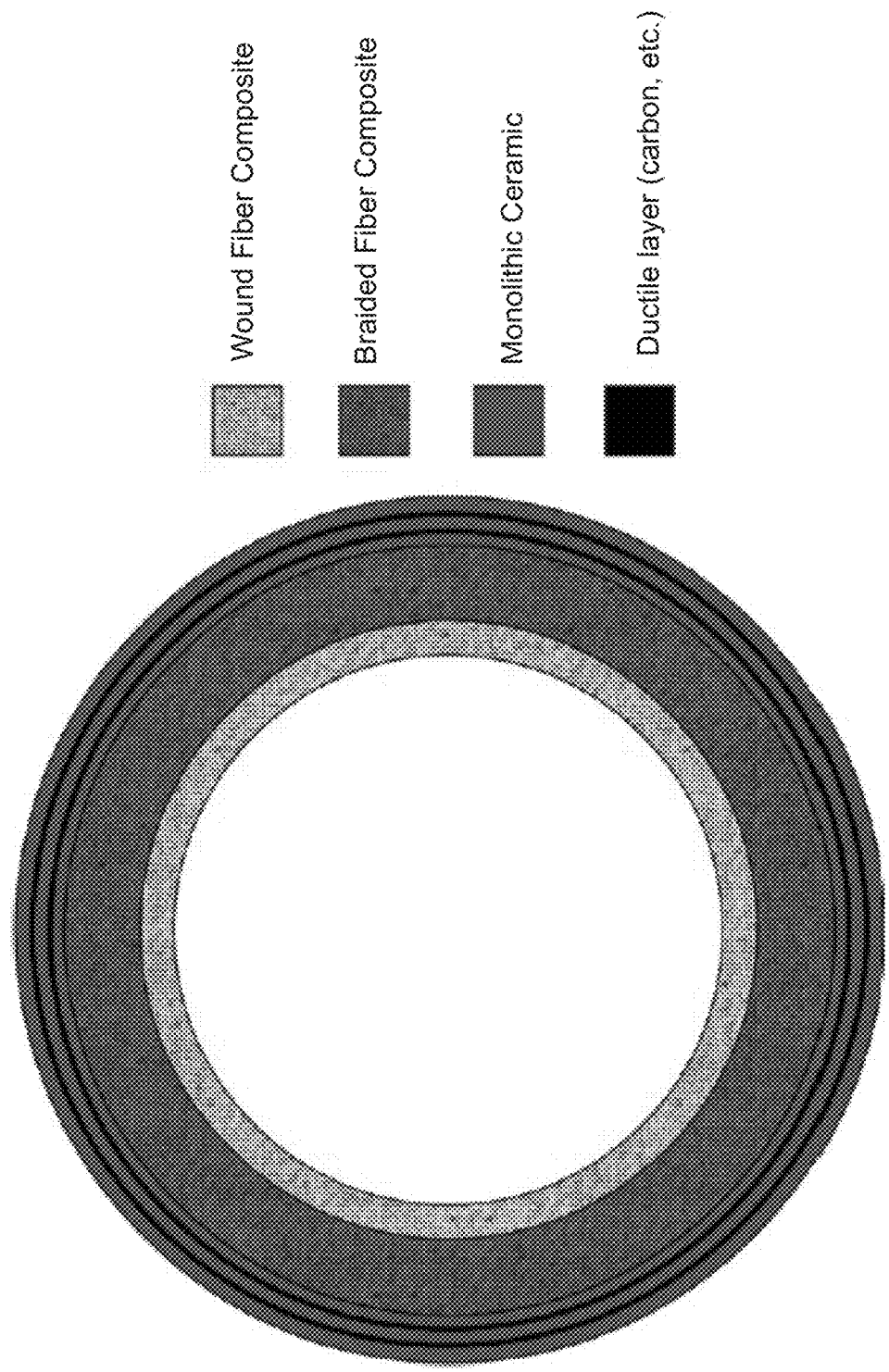
FIG. 6 shows an example of cladding with wound composite inner layer, braided composite central layer, and outer monolithic layer composed of several thin monolithic layers separated by ductile layers.

FIG. 6 shows a schematic of cladding with wound composite inner layer, braided composite central layer, and outer monolithic layer composed of several thin monolithic layers separated by ductile layers.

Figure 7:
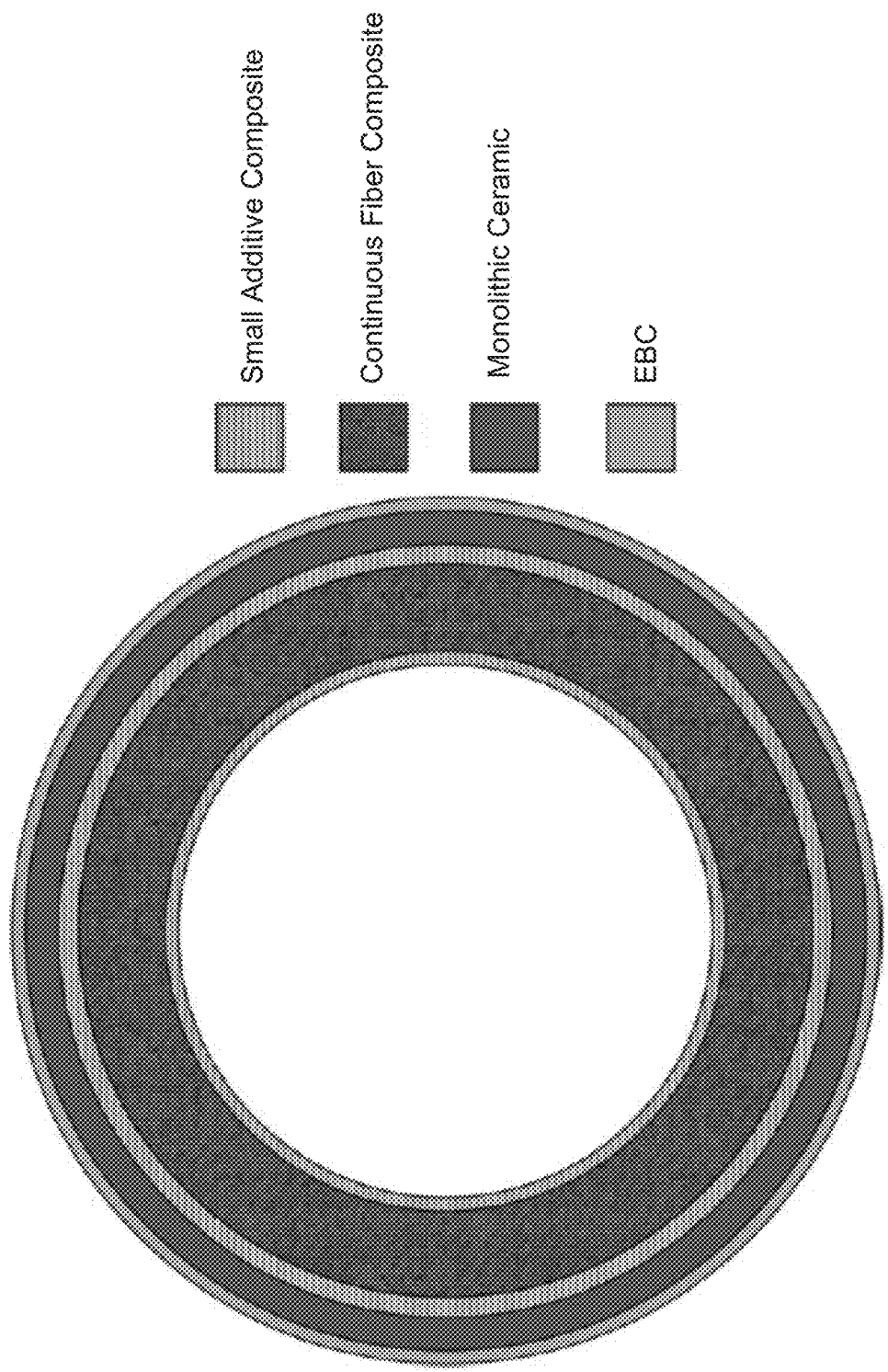
FIG. 7 shows a schematic of cladding with inner small-additive composite layer, central braided composite layer, subsequent small-additive composite layer, and outer monolithic layer with environmental barrier coating layer (EBC).

FIG. 7 shows a schematic of cladding with inner small-additive composite layer, central braided composite layer, subsequent small-additive composite layer, and outer monolithic layer with environmental barrier coating layer (EBC).

In some embodiments, the cladding may be fabricated in successive layers, from the inside out. A mandrel may be used to define the inner cladding diameter at the beginning of the fabrication process, and subsequent layers are formed on top of the previous layer. To provide good nuclear performance, all fiber must be stoichiometric, low-oxygen silicon carbide fiber, such as Hi-Nicalon type-S(Nippon Carbon Co., Ltd.) or Tyranno-SA (UBE Industries Ltd.), or similar. Reinforcing additives used in such composite structures, such as nano-scale SiC whiskers or short lengths of SiC fiber, should be high-purity, stoichiometric, beta-SiC. Nominally, the SiC composite matrix and dense β-SiC layers will be deposited in-situ, using established chemical vapor phase deposition techniques.

Various other deposition methods that can produce high purity, stoichiometric silicon carbide may also be considered, such as pre-ceramic polymers that are processed to form SiC.

Figure 8:
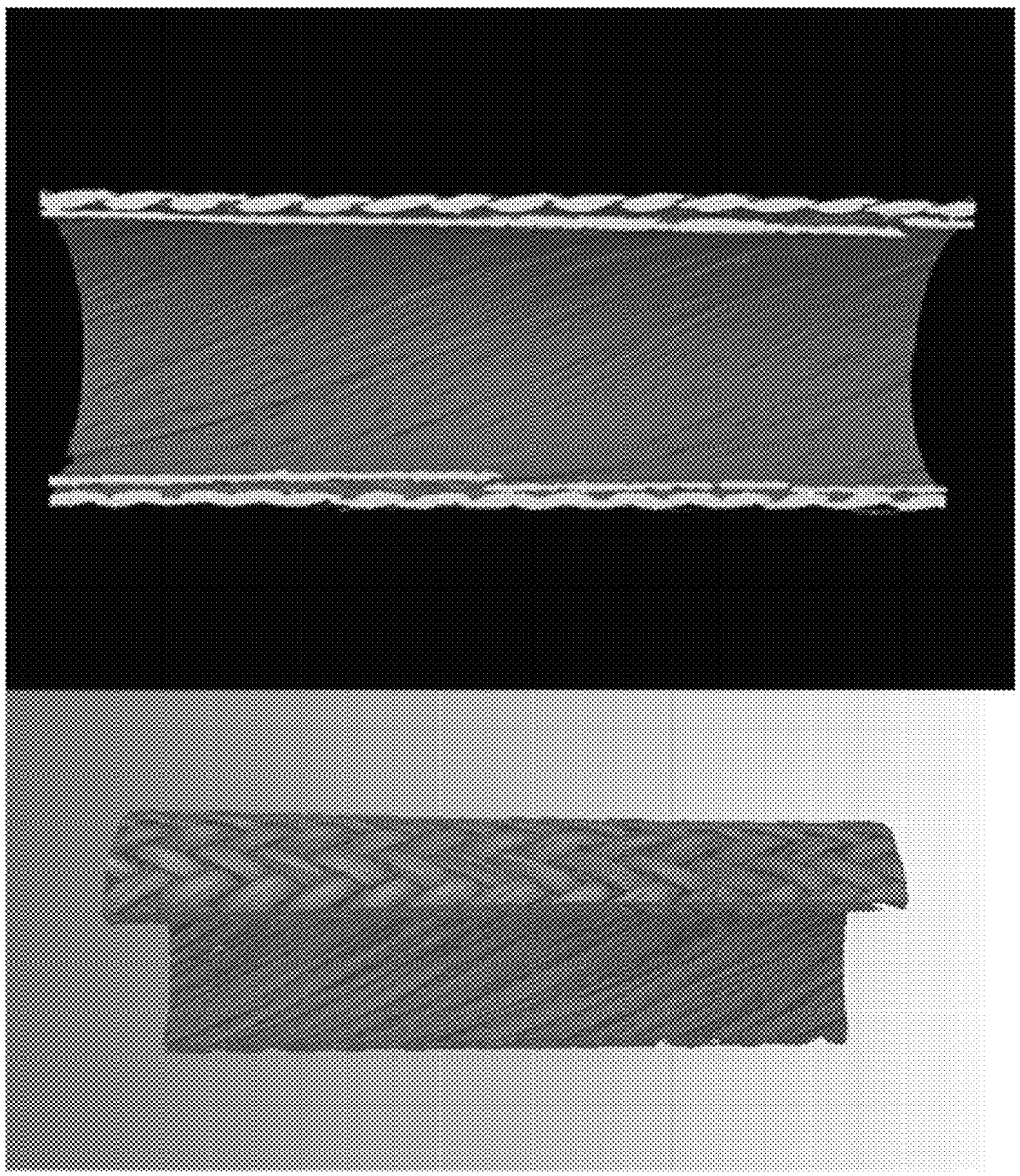
FIG. 8 shows an example of X-ray computed tomography reconstruction of cladding tubes fabricated with inner wound composite layer and subsequent braided composite layer.

FIG. 8 shows X-ray computed tomography (XCT) reconstruction of cladding tubes fabricated with inner wound composite layer and subsequent braided composite layer. This shows that the combination of these two distinct composite layers offers significantly reduced surface roughness on the inner surface, while offering the mechanical strength advantages of a braided layer for the second composite layer. Note that in this sample, the outer monolithic layer is not shown.

Figure 9A:
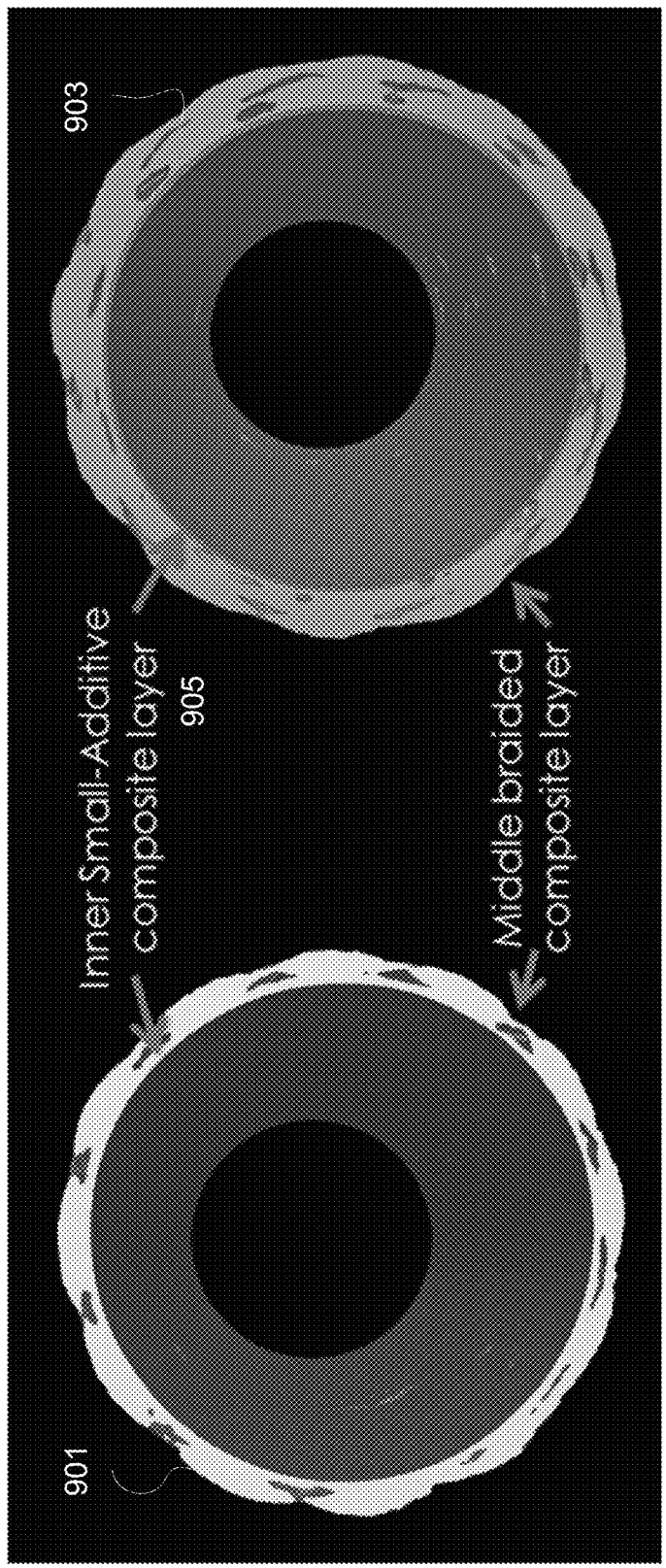
FIG. 9A shows examples of cladding tubes with a thin, small-additive composite inner layer and a subsequent braided composite layer and layers.

FIG. 9A shows examples of cladding tubes with a thin, small-additive composite inner layer and a subsequent braided composite layer (901) or layers (903). On the right, the inner composite layer 905 is highlighted in blue, and the surrounding composite layers 903 are highlighted in green, showing the smooth surface of the inner layer, and the rougher surface of the surrounding layer. The inner layer provides the smooth finish, while the surrounding layer provides the optimal mechanical reinforcement.

Figure 9B:
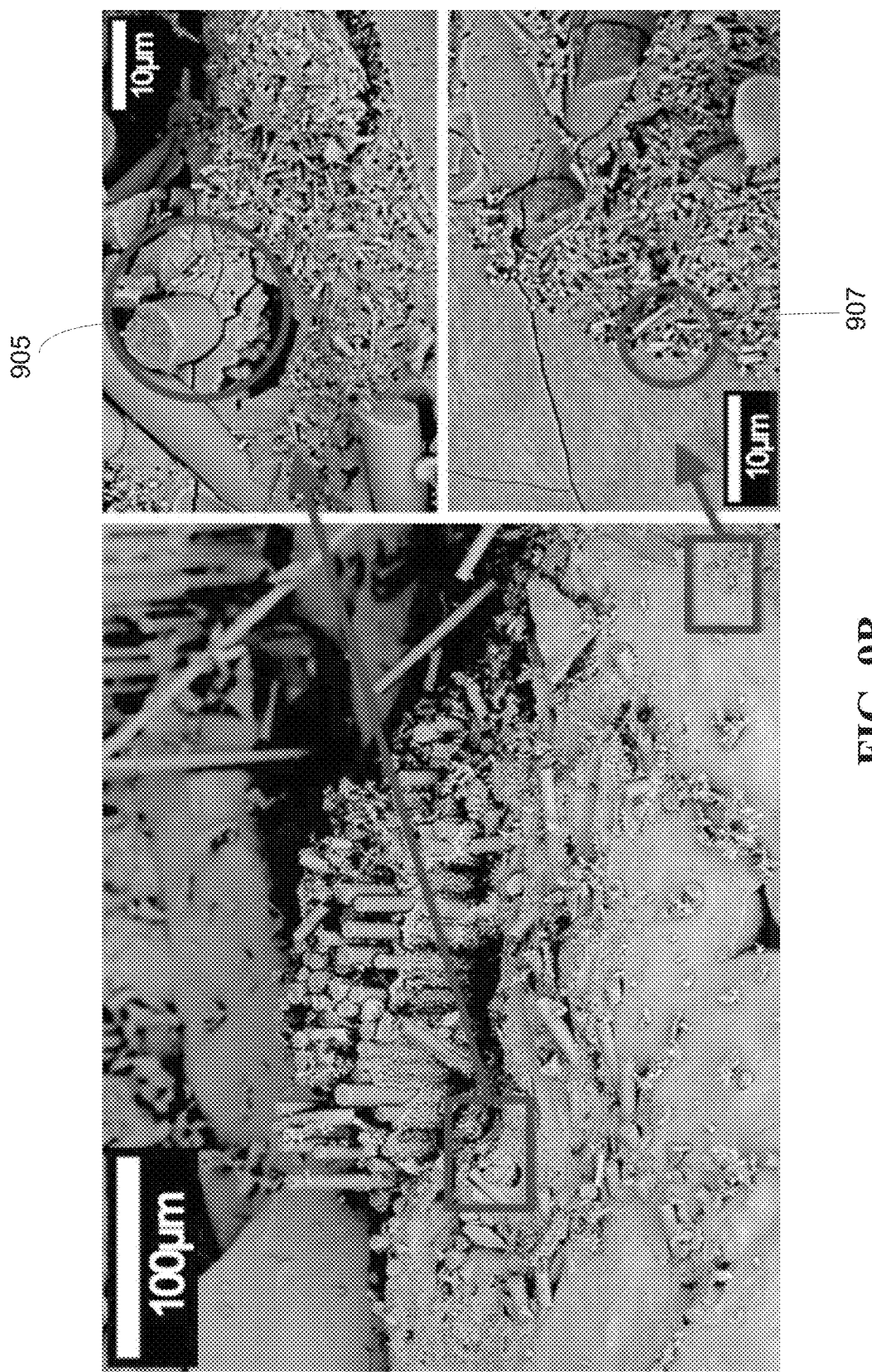
FIG. 9B shows a scanning electron micrograph of a composite fracture surface obtained after mechanical testing.

FIG. 9B shows a scanning electron micrograph (SEM) of a composite fracture surface obtained after mechanical testing. The SEM demonstrates an example of the toughening mechanisms that can be obtained from two distinct composite reinforcements: continuous SiC fiber 905 and dispersed small-scale SiC whisker additives 907. Composite toughening mechanisms, such as crack deflection, and reinforcement pull-out, can be observed from both reinforcing fibers 905 and from reinforcing small-scale SiC whiskers 907.

Figure 10B:
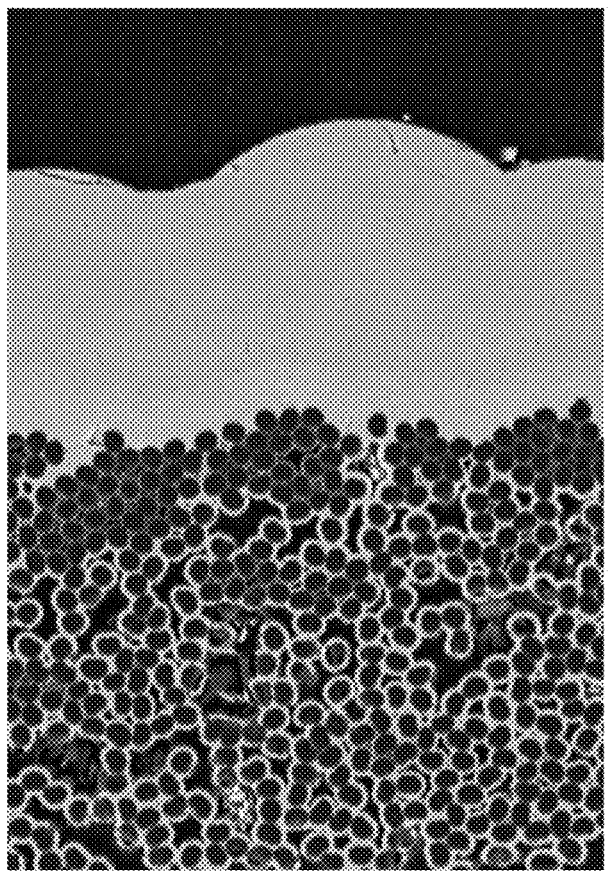
FIG. 10B shows an example of dense monolithic β-SiC deposited over a woven SiC—SiC composite.
Figure 10A:
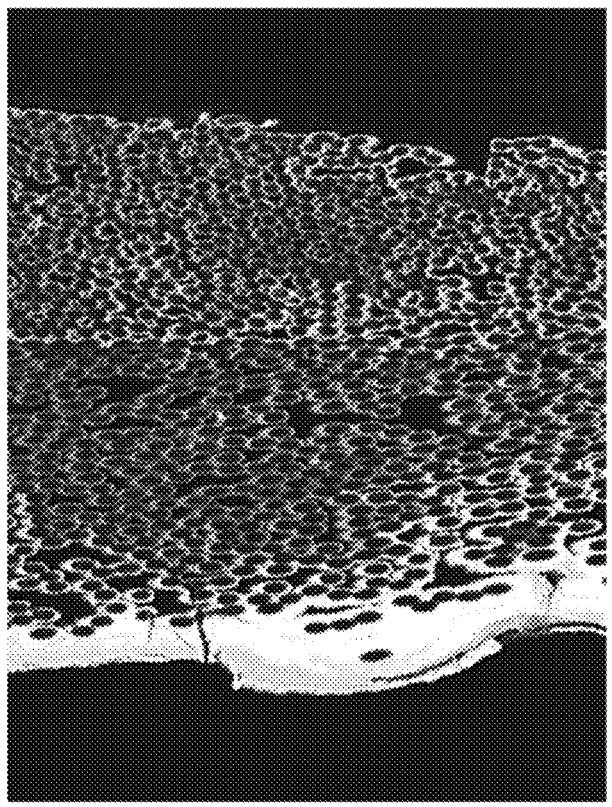
FIG. 10A shows an example of dense monolithic β-SiC deposited over a braided SiC—SiC composite.

FIG. 10A shows an example of dense monolithic β-SiC deposited over a braided SiC—SiC composite and FIG. 10B shows an example of dense monolithic β-SiC deposited over a woven SiC—SiC composite.

Figure 11B:
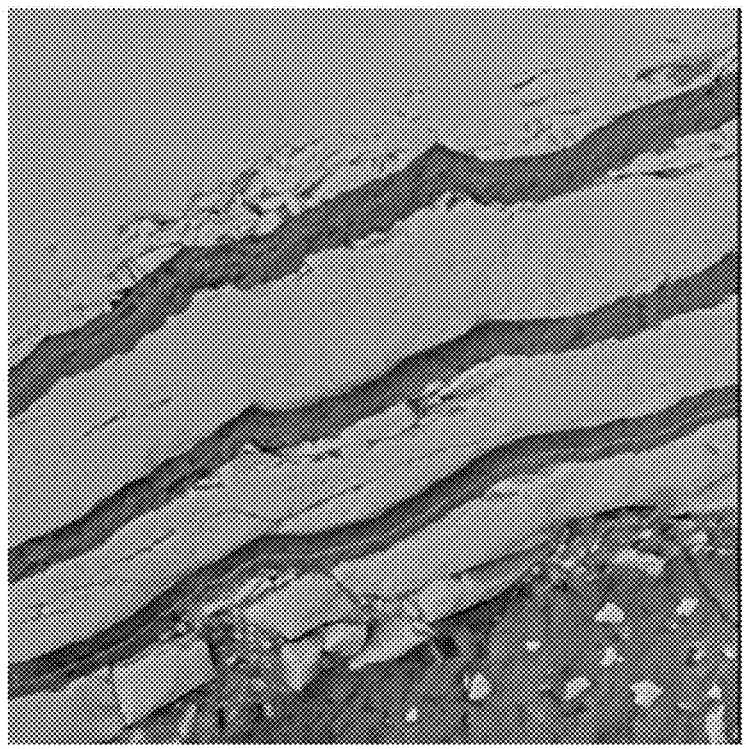
FIG. 11B shows an example of slightly thicker ductile layers deposited between successive monolithic layers on the outside of the composite layer in the cladding.
Figure 11A:
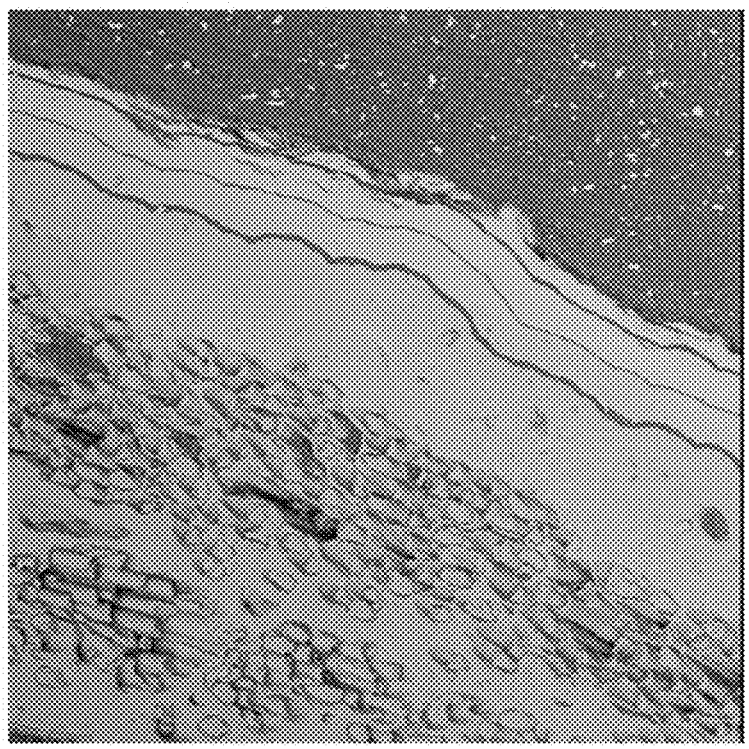
FIG. 11A shows an example of thin ductile layers deposited between successive monolithic layers on the outside of the composite layer in the cladding.

FIG. 11A shows an example of thin ductile layers deposited between successive monolithic layers on the outside of the composite layer in the cladding. FIG. 11B shows an example of slightly thicker ductile layers deposited between successive monolithic layers on the outside of the composite layer in the cladding.

Figure 12:
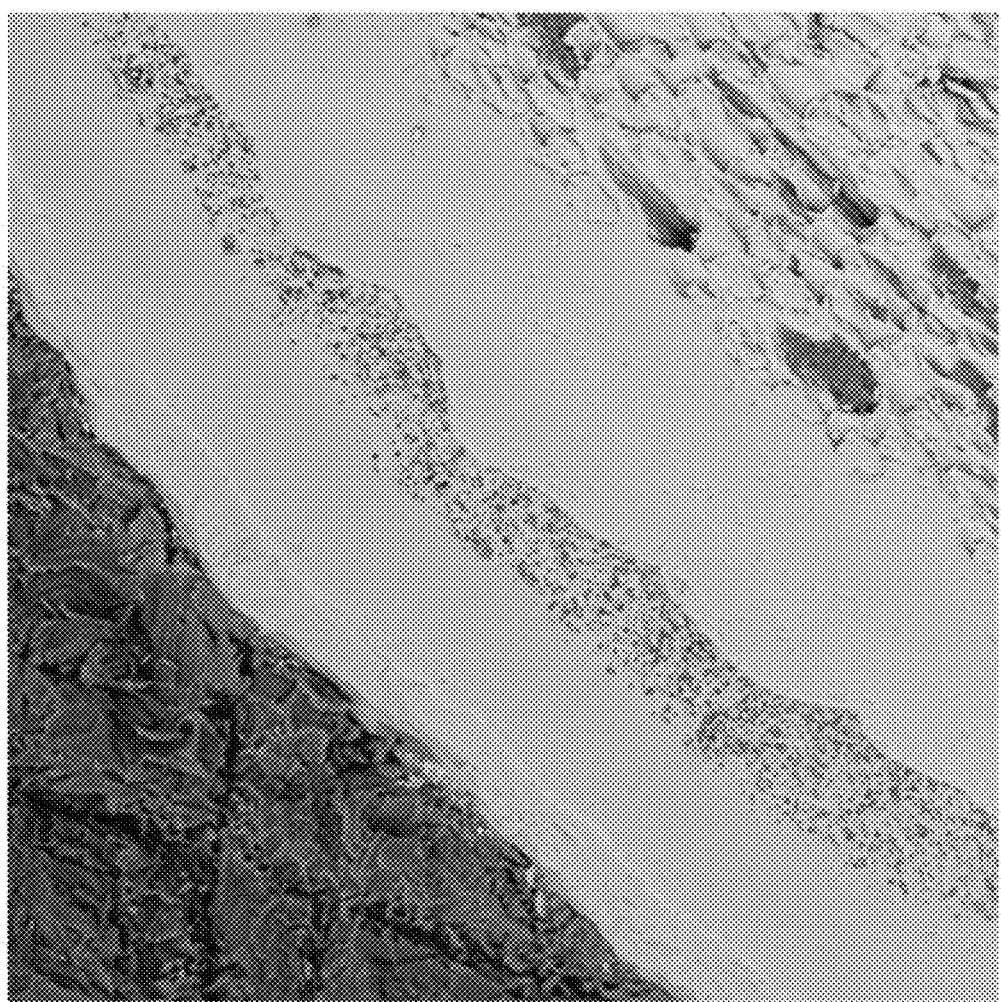
FIG. 12 shows an example of a cladding structure with two outer monolithic layers, deposited on top of a braided composite layer, and separated by a thin, small-additive composite layer.

FIG. 12 shows an example of a cladding structure with two outer monolithic layers, deposited on top of a braided composite layer, and separated by a thin, small-additive composite layer.

In order to demonstrate some of the beneficial aspects of the disclosed technology, exemplary embodiments were fabricated. In some embodiments, chemical vapor infiltration was used to fabricate SiC-based cladding tubes at approximate LWR cladding diameters and in lengths up to three feet. Prototypical cladding architectures were produced including structures containing an outer monolithic SiC layer. Composite samples were reinforced with stoichiometric SiC fiber (Hi-Nicalon type-S fiber, NGS Advanced Fiber Co.). The tube structures (tubes composed of only SiC—SiC composite and those with an outer monolith layer) were formed by placing fiber around a mandrel to define the tube inner diameter. The mandrel was later removed as part of the overall fabrication process. Details regarding exemplary methods of fabrication of SiC-based cladding tubes are discussed below in connection with FIGS. 27-36.

During fabrication, fiber orientation was varied by adjusting the number of fiber tows used and the angle relative to the tube axis, and for these examples, preforms were produced containing different ratios of fiber in the hoop and axial directions, ranging from 1.3:1 (hoop biased) to 1:1.5 (axially biased). These fiber ratios were used for these demonstrations, but do not represent a limit on the ranges of fiber orientations covered in this invention. These variations can be used to demonstrate the benefit of this invention, by showing the ability to control the mechanical properties of the cladding as a function of the structures of the composite layers. In some embodiments, a pyrolytic carbon interphase coating of ~150 nm was deposited via the chemical vapor decomposition of methane or acetylene, and the matrix was then deposited and densified through the chemical vapor infiltration of methyltrichlorosilane to a final relative density of approximately 80%. The embodiments described herein should not be viewed as a limit to the processing and structure variations. The composite densification step represented the final processing step for those tubes composed of all composite and those containing a SiC inner monolith. For those tubes containing an outer monolith, additional SiC was deposited to form a dense outer SiC coating. In some embodiments, final tube wall thicknesses varied depending on the structure, and ranged from 1.2 mm to 2.1 mm. Tubes composed only of SiC—SiC composite had wall thicknesses between 1.2 mm and 1.4 mm while tubes with an inner monolith were slightly thicker (1.3 mm to 1.5 mm), and tubes with an outer monolithic layer were 1.9 mm to 2.1 mm thick. However, these were the thicknesses used for these examples, and this does not constitute a limit to the range of thicknesses over which this cladding invention can be applied, and cladding tubes with wall thicknesses as thin as 0.4 mm are described in this invention. For the two layer structures, containing either an inner or outer monolithic layer, that monolithic layer made up approximately 30% of the wall thickness.

Characterization

To compare the structures described in the present document, the claddings were evaluated in terms of mechanical performance, hermeticity, and geometric and dimensional tolerances. Mechanical properties of SiC-based tubes can be evaluated using several methods. Hoop strength was measured using C-ring testing and expanding plug testing, while axial strength was measured using monotonic axial tensile testing.

C-Ring testing was carried out following similar guidelines established for monolithic ceramics in ASTM C1323 and described in Jacobsen et al. Samples rings were cut to 2-3 mm thicknesses using an Accutom-50 diamond saw and subsequently polished using diamond grit. While most testing was performed on material sized for LWR cladding applications (~7.5 mm inner diameter), some additional samples with a larger diameter were also measured (~19 mm inner diameter, fabricated using very similar fiber architectures to the LWR-size material and densified using the same process). These larger diameter tubes were produced to show the applicability of these structures for nuclear fuel cladding designs larger than LWR cladding dimensions. A C-ring gap of 4 mm was used for LWR sized material and 7.5 mm for the larger diameter material. Load was applied to the specimens using an Instron 5982 Universal Mechanical Tester at a crosshead speed of 2 mm/min. For each reported data point, a minimum of 5 specimens was tested, with 10 specimens being typical. Load was converted to stress using curved beam theory.

Expanding Plug testing was performed following the procedures established in the literature. Specimens were cut and polished to approximately 25 mm in length, and a 12-15 mm polyurethane plug of 95 durometer hardness was used. Crosshead speed was set to 1.5 mm/min. Strain was monitored during testing through strain gauges with 2.5-3 mm gauge length (Omega). A minimum of 5 tests were performed for each sample, and stress at the tube ID and OD was calculated using Lamé's equation.

Axial tensile testing was performed using the procedure described in ASTM C1773. A passive gripping fixture was utilized where the tube was epoxied at both the ID and OD (United Resin Corps Tuff Bond epoxy). Total sample length was 100-120 mm, with a gauge section of 50 mm. A U-Joint was utilized to help ensure proper alignment as measured through a set of 4 or 8 strain gauges with 3-4 mm gauge length mounted in 90 degree intervals. Crosshead speed was set to 2 mm/min. For the axial tension testing, the reported data represents an average of a minimum of 3 tests. This test method was previously validated through testing of monolithic SE grade silicon carbide (Hexoloy) and 99.8% purity alumina tubes (Coorstek) with well-known tensile strengths. Measured tensile strengths were within 10% of reported values for these monolithic materials.

For both expanding plug and axial tension testing, bulk measurement of macro-scale cracks could be detected via small drops in the strain data, but techniques to monitor more localized micro-scale cracking (such as acoustic emission detection) were not used in this work. Elastic modulus, proportional limit stress (PLS), and ultimate tensile strength (UTS) were obtained from the stress-strain curves using the methods described in the corresponding ASTM procedures.

Thermal Diffusivity

Thermal diffusivity was measured using a NETZSCH LFA 427 laser flash analyzer, following the approach introduced by Parker et al., and with modifications for sample geometry according to Zhang et al. Both flat and curved samples were measured, and curved specimens were cut from the sides of SiC—SiC tubes. The sample size was kept constant at 10 mm×10 mm to fit into the specimen holder for the analyzer. Thermal diffusivity was measured in the through-thickness direction at 25° C., 300° C., and 800° C., and three measurements were taken at each temperature.

Permeability

Figure 13:
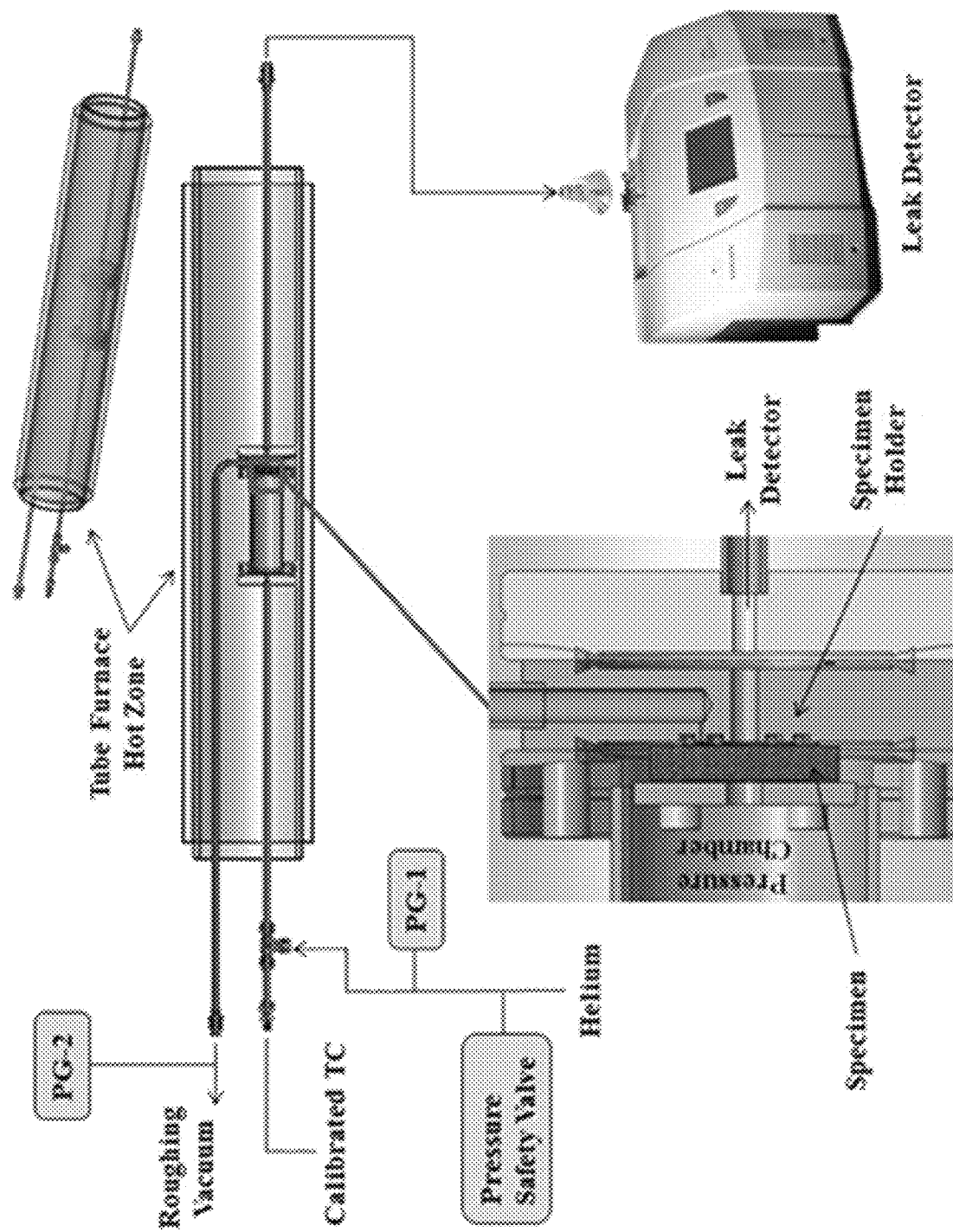
FIG. 13 shows an example of test configuration for permeability measurements of SiC—SiC tube specimens.

Permeability of SiC—SiC tubes was assessed using a mass spectrometer leak detector (Agilent VS MD30) and with consideration of guidelines from ASTM E432-91 (2011). The leak detector was assembled together with a roughing pump, custom chamber, helium source, and pressure gauges. Specimens to be tested were held in the chamber between a high pressure and a low pressure region, and this assembly could be positioned inside a tube furnace to facilitate permeability testing at elevated temperatures. Typically, a pressure differential of 1 atm was applied across the sample during a test, and then the leak rate was monitored as helium was detected permeating through the sample and until the leak rate had achieved a steady state. One exemplary test configuration is shown in FIG. 13. This equipment could be used to measure leak rates through both open ended SiC—SiC tubes, and tubes which had one end sealed with a SiC endplug, joined using a SiC-based joint.

Dimensional Tolerances

Surface roughness measurements were made using a stylus surface profilometer (Dektak 6M with 2.5 µm radius diamond tip) to compare with the roughness values extracted from the XCT volumes. The profilometer scan length was between 2 mm a 7 mm, with a vertical height range of 254 µm, and a vertical step resolution of 4 nm. All profilometer roughness scans were made in the axial direction.

Other dimensional measurements were obtained from x-ray computed tomography (XCT) using a Nikon XT H 225 X-Ray Computed Tomography unit equipped with a Perkin Elmer 1620 CS3 detector. Due to the high aspect ratio of the SiC-cladding tubes being examined, scans were performed at different resolutions and magnifications depending on the dimensional tolerance being evaluated. Volume Graphics "VGStudio Max" was used for analysis of the resulting image volumes.

To obtain data, longer (~0.9 m) SiC—SiC tubes were scanned in separate, 25 cm long segments. Each reconstructed 3D volume was generated from 720 2D X-Ray projections with beam settings of 140 kV and 55 µA, and with no filter. Four segments per tube were reconstructed individually and then stitched together into one measurable volume using Volume Graphics or XCT analysis software. The individual reconstructed volumes and the stitched volume are comprised of voxels measuring 0.002 mm3, which corresponds to a linear resolution of 127 µm.

Additional straightness measurements were obtained using two other measuring tools: a Coordinate Measuring Machine (CMM) (Wenzel LH87) offering 12.7 µm resolution in the X, Y, and Z directions and a digital height gauge (SPI 13-599-6) offering 10 µm height resolution.

Infiltration uniformity may be assessed by measuring the thickness of CVI SiC deposition on the outside of the SiC—SiC tube walls. This outer SiC layer forms during densification, and its thickness is affected by the composite structure, infiltration conditions, and infiltration efficiency. Variations in this outer CVI SiC layer can therefore serve as an approximate indication of the uniformity of the underlying composite. Longer tubes were cross sectioned at 10 cm intervals, mounted and polished, and thickness was measured using scanning electron microscopy (Phenom X SEM).

Performance Requirements for SiC-Based Nuclear Fuel Cladding

Performance attributes for silicon carbide-based nuclear fuel cladding (including cladding designed for accident tolerant fuel for current LWRs and cladding designed for other advanced reactor concepts must be defined and demonstrated for normal operation, design basis accidents, and beyond design basis accidents, and cladding fabrication must be feasible at a very large production scale. A very thorough assessment of these requirements and performance criteria has been published by Bragg-Sitton et al., and some of the key cladding metrics include mechanical strength, thermal behavior, impermeability, and dimensional control. For LWR fuel cladding, dimensional requirements will likely be similar to current Zircaloy cladding tube specifications, which include ~0.8-1.3 µm surface roughness requirements ±25 µm ovality requirements, and 0.25 mm per 300 mm length straightness requirements. Exact requirements will need to be reestablished for a final SiC-based cladding design. In addition, fuel cladding designs for other reactor types (gas-cooled reactors, sedum-cooled, metal, or molten salt-cooled, etc. may have differing dimensional and geometric specifications and tolerances, but the cladding design described in this invention can be applied to any of these.

To meet these requirements, an impermeable monolithic SiC layer can be deposited using chemical vapor deposition on the outside of a composite tube, resulting in an outer-monolith design, as described in this patent document.

Examples of the tubes and structures fabricated are shown in FIGS. 14A-C. FIG. 14A shows examples of ~0.9 m long SiC—SiC tubes fabricated. FIG. 14B shows the cross-section of a tube structure with an outer monolithic SiC coating.

Mechanical Characterization of SiC—SiC Tube Structures

In order to demonstrate the effect of fiber reinforcement on the hoop and axial strengths, two different fiber architectures were investigated. The first architecture had a slightly higher ratio of fiber reinforcement the axial direction than the hoop direction (1.5:1) while the second architecture was biased in the hoop direction (1.3:1; for comparison, an architecture with fibers oriented at ±45° would be balanced with a 1:1 hoop:axial reinforcement ratio). C-ring testing was used to measure hoop strength and monotonic tensile testing was used to measure axial strength, and the engineering ultimate tensile strengths for the two different fiber architectures are reported in Table 1. This shows the wide range of control which can be achieved over the mechanical properties based on the composite structure. This demonstrates the benefit of being able to optimize the mechanical properties through the use of two or more distinct composite layers, rather than one single layer.

TABLE 1

Mechanical data for hoop and axial directions for two different fiber architectures (Standard deviation given in parentheses)

| Fiber Architecture | Hoop UTS (C-ring, MPa) | Axial UTS (uniaxial tensile, MPa) | Elastic Modulus (axial, GPa) | Hoop:Axial Fiber Ratio | Hoop:Axial Strength Ratio |
|---|---|---|---|---|---|
| Axial biased | 209 (24) | 236 (35) | 243 (19) | 1:1.5 | 1:1.13 |
| Hoop biased | 331 (74) | 93 (14) | 129 (14) | 1.3:1 | 3.56:1 |

Figure 15A:
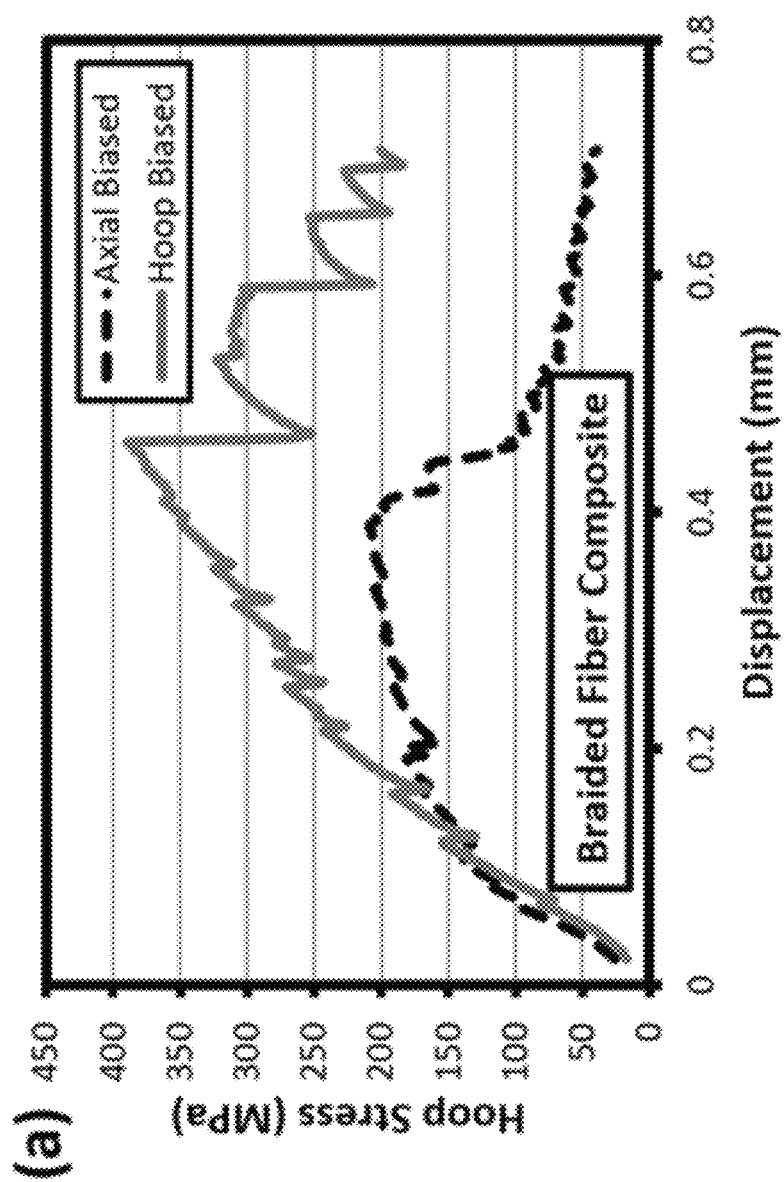
FIG. 15A shows an example of representative hoop stress versus displacement as measured with the C-ring test for two different fiber preforms.

The stress versus displacement plots for representative c-ring tests are shown in FIG. 15A. Although C-ring testing is most suitably compared to planar flexure testing, it has been demonstrated that for relatively uniform composites c-ring testing gives a good approximation of hoop stress. The strengths and moduli observed in this work are similar to those reported previously for both SiC—SiC panels and tubes, although differences in fiber architectures between reports mean that comparisons will only be approximate. For both fiber architectures, similar displacement at failure is observed. However, the hoop biased composite shows a more than 50% increase in ultimate tensile hoop strength and a better ability to carry residual load beyond the UTS. This higher load carrying capacity would be important in a severe accident situation, and would help maintain the cladding in a coolable geometry without brittle fracture. The additional reinforcement in the hoop direction means that more bridged cracking can occur, one of the primary mechanisms for improved toughness and strength in composites. In bridged cracking, matrix cracking is deflected along the weak interface layer surrounding the fibers and the resulting load is transferred and maintained on the undamaged fiber.

Figure 15B:
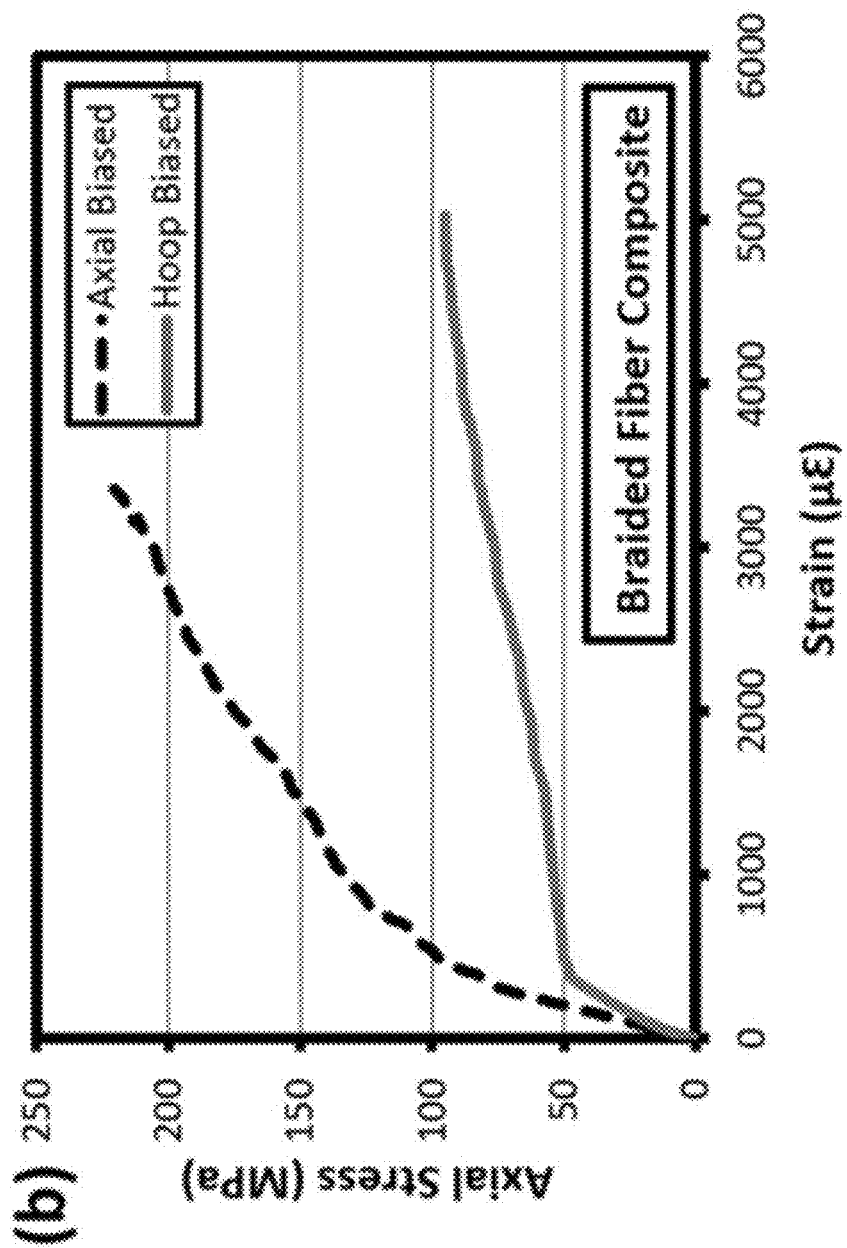
FIG. 15B shows an example of representative axial stress versus strain as measured with the uniaxial tensile test for two different fiber preforms.

FIG. 15B shows representative stress vs. strain plots for the uniaxial tensile tests of these specimens. For the axially biased fiber architecture a much higher axial UTS is observed. This is consistent with the C-ring test results where additional reinforcement in the loading direction leads to higher strength. This result is expected and consistent with reports in the literature where polymer matrix composite tubes with varying fiber orientations showed a trend of increasing failure load correlating with increasing fiber aligned in the loading direction. For the hoop biased specimen additional strain at failure and a lower modulus is observed, which could be due to differences in density and porosity distribution of the composites. Again, this shows the importance of the composite architecture on the performance, and the benefit which can be achieved by using two or more, distinct and different composite layers to improve performance.

In some embodiments, all specimens characterized for each strength test method had the same length, chosen with respect to the technique being used to make the measurement. Katoh et al. report that composites tested with a loading direction off-axis to the fiber reinforcement direction exhibit a specimen width effect on strength, particularly when the specimen width is comparable to the fiber reinforcement unit cell width (with decreasing strength values observed with decreasing specimen width). In this study, expanding plug and axial tension tests use specimens that include the complete tube diameter and have lengths many times the unit cell dimension, so sample size is no issue. The C-ring tests use a shorter length of tube (2-3 mm), however Jacobsen et al. reported good agreement between hoop strength values measured on larger expanding plug test specimens and C-ring test specimens of the same size as used in this current work. Thus, although larger ~4 m long tubes for cladding applications may need additional testing to confirm properties, based on the literature and current results, the specimen sizes used in this work are large enough to provide representative measurements of the properties for these SiC—SiC composite tubes.

These results demonstrate a powerful ability to control the relative strengths in the hoop and axial direction. This demonstrates that fine control of the ratio of hoop to axial strength is possible for tubes. Control of the fiber architecture will allow tailoring of the cladding to specific conditions expected during normal operation as well as accident scenarios, and the use of two or more distinct composite layers as described in this invention will allow for better optimization. These situations and the corresponding stresses will need to be considered as architecture is being determined through a combination of specification application requirements, modeling of expected stresses, and manufacturing considerations.

Figure 15C:
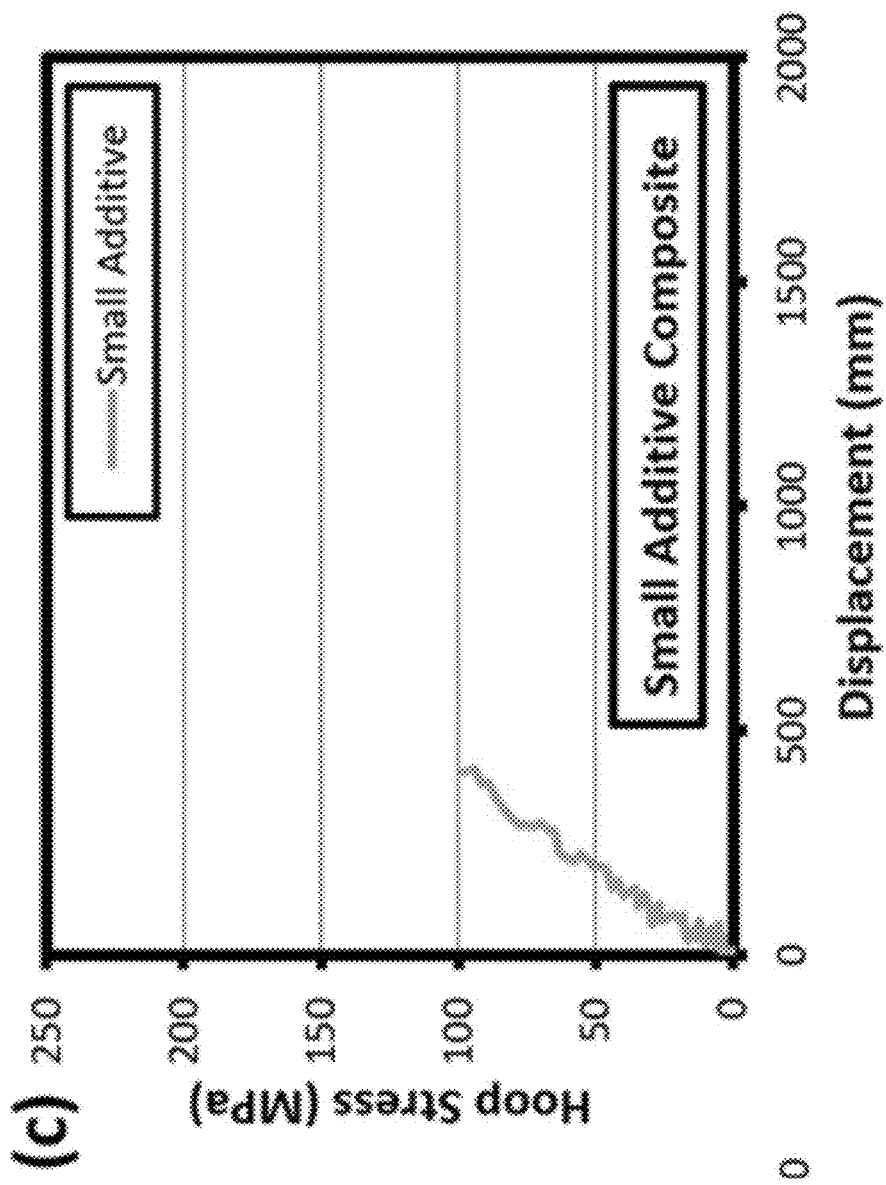
FIG. 15C shows a representative stress train curve for a SiC—SiC composite reinforced with only small-scale additives.

FIG. 15C shows results from additional mechanical testing performed on a composite reinforced with only small-scale additives. These SiC structures (such as SiC whiskers), are much smaller than the continuous SiC fibers used in the braided fiber or wound fiber types of SiC—SiC composite. These additives provide some reinforcement. However, due to their small-scale (not extending for long distances within the composite) and the challenges in controlling the orientation of these additives, these do not provide the same significant toughness benefit as the continuous reinforcing fiber used in braided or wound fiber composites. This leads to the lower strength and minimal pseudo-ductile behavior observed in the stress-strain response for this small additive composite mechanical response. Therefore, for optimal mechanical performance, a structure containing braided fiber or wound fiber reinforcement is preferred to provide higher strengths, and the ability to tailor the mechanical properties between the hoop and axial direction to best meet performance needs. However, these small additive composites provide other benefits, such as offering much smoother as-fabricated surface roughness compared to continuous fiber reinforcements. The use of multiple, distinct composite layers leverages the advantageous properties of each type of composite layer and allows the creation of a structure that combines the best attributes of each.

In addition to the incorporation of two or more distinct composite layers, this invention also utilizes a multi-layered structure in which a monolithic layer of SiC is placed either on the outside or inside of the composite, or both. The monolithic SiC offers improved oxidation resistance compared to SiC—SiC composites, and, provided it remains uncracked, can provide hermeticity, while the composite layer provides increased strength and toughness to the cladding. As fission gas must be contained throughout the fuel life, it is important for the monolithic layer to remain intact through normal operating conditions. In some embodiments, this monolithic layer is optimally positioned on the outside of the cladding to best accommodate expected stresses during reactor operation.

Thermal Diffusivity

In SiC—SiC composites, the fiber structure and related porosity has a significant effect on the mechanical and thermal properties, Due to the differences in the fiber architecture between SiC—SiC plates (composed of layers of woven fabric), and tubes (with wound or braided fiber), measurements on planar composites would not be directly comparable with tubes. This consideration is important in instances where the characterization approach has been optimized for, or is limited to, planar geometries.

The thermal conductivity of a sample can be determined as a function of the sample's specific heat, density, and thermal diffusivity. Specific heat and density measurement can be made without needing to account for the sample geometry. The thermal diffusivity measurement is typically obtained from a flat specimen using the laser flash method, where a pulsed laser delivers energy to one side of a sample and the temperature rise on the opposite side of the sample is monitored as a function of time. The thermal diffusivity is a function of the sample thickness and the time-temperature profile, specifically the time required for the temperature to reach half the eventual maximum value. This approach assumes a flat sample and 1 dimensional heat transfer, and therefore cannot be directly used to measure thermal diffusivity in curved samples, where heat transfer in two dimensions occurs.

A geometric factor can be determined as a function of sample curvature and then used as a correction to the measured value to obtain the actual material diffusivity value. A more complete explanation of this work, including a derivation of curvature effects based on a 2-D heat transfer equation, and an evaluation of temperature effects on the accuracy of the geometric factor has been published previously.

Figure 16:
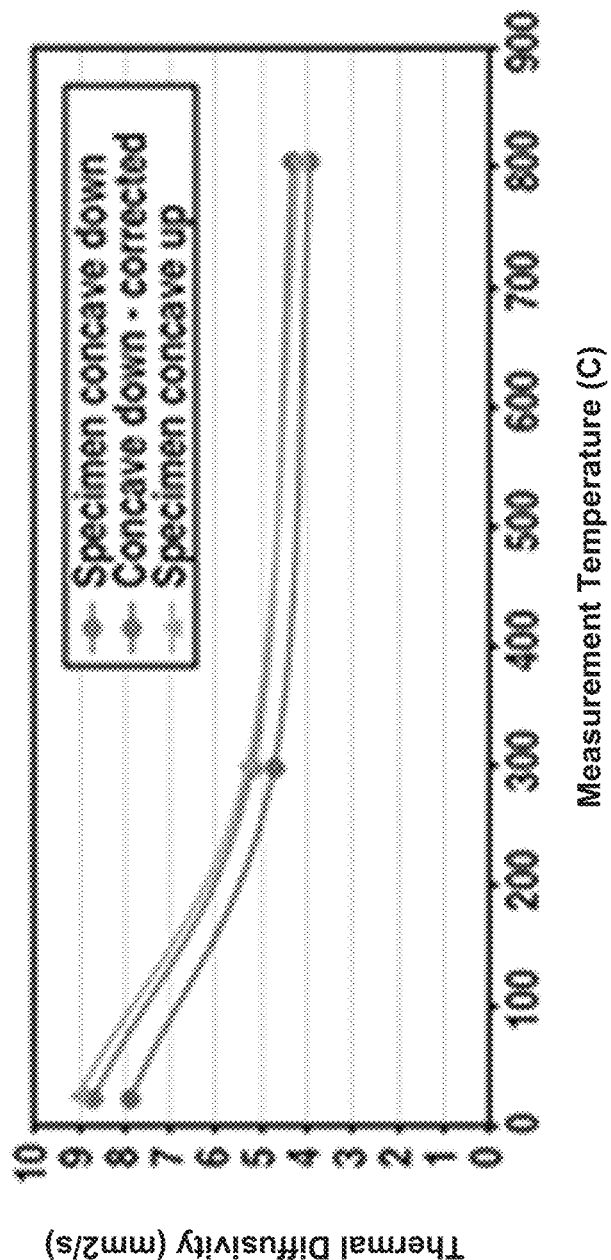
FIG. 16 shows an example of thermal diffusivity results for a representative as-fabricated SiC—SiC tube specimen, comparing uncorrected data for two different specimen orientation with data after the geometric correction factor has been applied.

Specimens taken from as-fabricated SiC—SiC composite tubes were evaluated using this geometric correction factor. The same specimen was measured in in the through thickness direction but in two orientations, with the concave curvature facing up and with the curvature facing down. This correction factor was then applied to the concave down thermal diffusivity measurements (this was the orientation used when obtaining the geometric factor). Results for a representative curved SiC—SiC specimen are shown in FIG. 16. The uncorrected through thickness thermal diffusivity measurements for the two specimen orientations were very similar, with values differing by only 2-3%. However, by applying the geometric correction, it can be seen that both orientations overestimate the true material thermal diffusivity by approximately 10%. This significant difference demonstrates the necessity of applying an appropriate correction for the geometry of curved specimens. Both the through thickness thermal diffusivity values measured here (7.9 mm2/s at room temperature), and the trend of decreasing diffusivity with increasing temperature are similar to other reports in the literature. Katoh, et al. summarizes data for flat, non-irradiated SiC—SiC composite panels from several sources, where through thickness thermal diffusivity values at room temperature range from 6.5 to 8.5 mm2/s for composites reinforced with Hi-Nicalon type-S fiber and 7.5 to 13.2 mm2/s for composites reinforced with Tyranno-SA3 fiber. In addition, Katoh, et al. report that thermal diffusivity and conductivity vary as a function of measurement direction, and are typically higher in the in-plane direction compared to the through thickness direction for SiC—SiC composites, as the fibers can conduct heat and the porosity distribution is different. For cladding applications, high thermal diffusivity, and a corresponding high thermal conductivity are important to ensure heat removal from the fuel and reduce stresses in the cladding caused by thermal gradients.

Permeability

Permeability is a critical performance metric for SiC-based cladding, as hermetic containment of fission gas throughout the fuel life is challenging due to the occurrence of matrix cracking at stresses beyond the proportional limit strength and residual porosity in SiC—SiC composites. Permeability of monolithic silicon carbide is extremely low, and a versatile fixture was used to hold specimens and prevent leakage of helium while facilitating measurement of very small leak rates through the sample. The fixture assembly was verified to give consistent performance at elevated temperatures, allowing testing at 300° C. To ensure accurate results, a calibrated leak standard and null and control samples were used to differentiate between permeation through the seal (between the sample and the fixture), and permeation through the sample itself. In addition, excessive tube surface roughness interfered with the ability to obtain a leak-tight seal on the sample surface, so care had to be taken in sample preparation.

The leak rate requirements were allocated based on the maximum acceptable leak rate for current pressurized water reactor (PWR) fuel cladding, which was taken as $10^{-6}$ atm-cc/s with 1.7 MPa helium pressure at room temperature. This value will vary for cladding used in other reactor types that is based on this invention, and the results will show that this design is capable of meeting leak rate requirements significantly more strict than the requirements given here. From this value, leak rate requirements were extrapolated for smaller specimens tested at various temperatures and pressures. In addition, a suitable SiC-based material used in a fuel cladding application should meet leak rate requirements through the tube walls, and the entire cladding structure, including material used to seal the ends, should also meet the requirements. A silicon carbide based joining method can be used to seal one end of SiC—SiC composite tubes with a monolithic SiC endplug. These joints include high-purity cubic SiC, and achieve room temperature shear strengths of ~80 MPa, meeting requirements for containment of expected end-of-life LWR cladding pressure, as well as anticipated cladding requirements for other reactor fuel rod designs. The tubes used were SiC—SiC tubes coated with an outer monolithic SiC layer, and, both open ended SiC-based tubes as well as tubes which had one end sealed using a SiC endplug and SiC joint were tested. This helium leak measurement approach is versatile and could be adapted for different SiC component geometries beyond tubes through the use of a modified fixture and sealing method.

Initial testing determined that both composite cladding tubes with an outer monolithic layer and tubes with an endplug joined using a SiC-based joining method can meet the permeability requirements for LWR applications in the as-fabricated condition. Measured helium leak rates were below 10-12 atm-cc/s.

In nuclear reactors, the cladding structure will undergo stresses and loading conditions during the fuel life, including internal pressurization due to fission gas build-up, thermal cycles, and mechanical stress cycles during power ramps or shutdowns for fueling. The cladding must maintain hermeticity throughout these conditions, while being simultaneously being subjected to neutron irradiation.

In conducted tests, specimens were subjected to internal pressure and thermal cycles, and permeability was assessed as a function of stress levels. Internal stress was applied to an open-ended composite tube with an outer monolithic layer (as described in this patent document) using the expanding plug technique starting near the stress level where micro-cracking is believed to occur. The specimen was stressed in increments of 3.8 MPa of internal pressure, and the load was then removed and permeability was measured; this process was repeated until hermeticity had been lost. Results for this incremental loading are shown in FIG. 16, and no leak was detected after pressurization to 56.2 MPa internal pressure. After the next stress application, at an internal pressure of 60 MPa, micro-cracking in the sample leads to a partial loss of impermeability. After an additional 3.8 MPa of pressure the cracking becomes severe enough that the leak rate measures beyond the limits of the leak detector. This internal pressure is well beyond the end-of-life pressure for a typical LWR fuel rod, typically in the range of 15-20 MPa. Using Lamé's equation with a uniform material approximation, a lower bound on the hoop stresses in the specimen wall would be between 100 MPa and 120 MPa when hermeticity was lost. However, this uniform material approach underestimates the stress on the monolithic layer, as this does not consider that the modulus of the monolithic layer is often approximately twice that of the composite layer. Actual stresses on the monolithic layer would be higher than indicated by a uniform material assumption, although a more detailed FEM-based calculation would be needed to provide a more accurate calculation of stresses.

Figure 17:
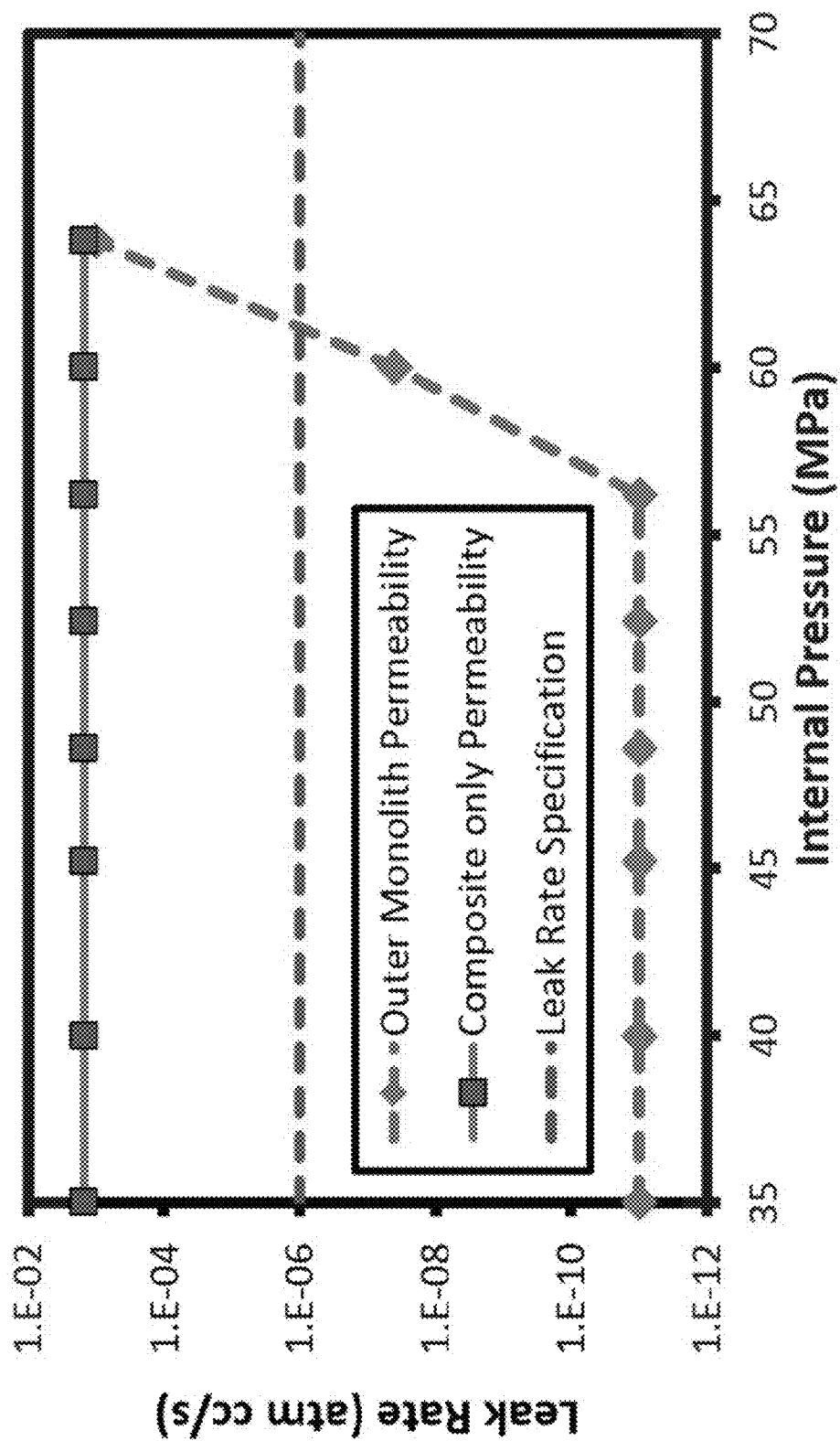
FIG. 17 shows an example of measured helium leak rate through a SiC—SiC tube with an outer monolith as a function of incrementally applied internal pressure.

Also plotted in FIG. 17 is a nominal leak rate requirement, as well as a typical leak rate measured for a tube composed of only a single composite layer (without an external monolithic SiC layer). This shows the challenge in achieving the needed hermeticity for a composite-only structure, and clearly shows the substantial improvement which is gained by coupling a monolithic layer with multiple inner composite layers to improve the impermeability of the structure.

Additional stress loading was performed on a joined tube/endplug assembly, and after performing a baseline permeability measurement, the specimen was subjected to ten thermal cycles ramping between room temperature and 1000° C. At this point a permeability test was performed, and then an additional load of 16.8 MPa internal pressure was applied before a final leak test. These permeability tests were conducted at 300° C., and for this combination of test temperature, applied helium pressure, and sample size, the leak rate extrapolated from the full fuel LWR rod requirement was $3.0 \times 10^{-8}$ atm-cc/s.

Figure 18:
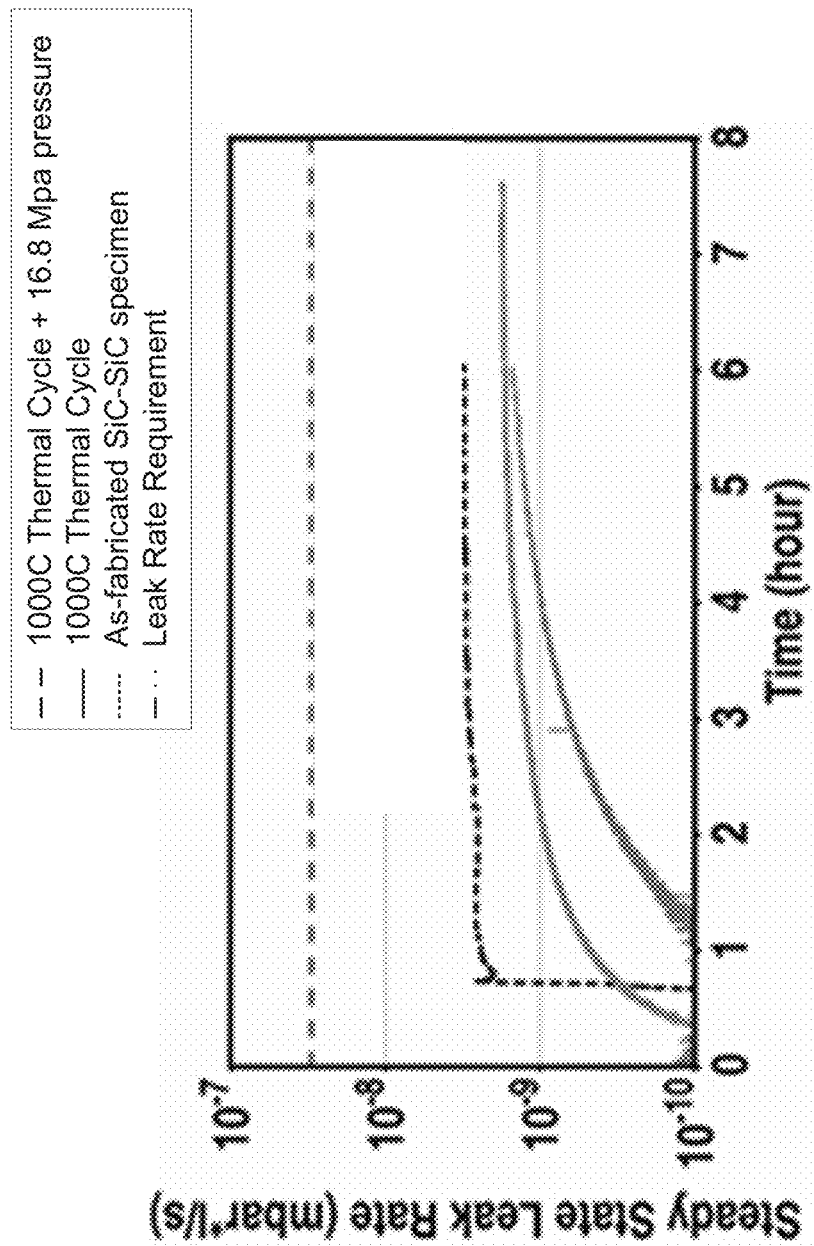
FIG. 18 shows an example of steady state helium leak rates measured for as-fabricated, thermally cycled, and thermally cycled plus internally pressurized tube/endplug.

No observable change in the steady state leak rate was observed after the thermal cycling, and only a small rise in leak rate was detected after the subsequent internal pressurization. These results are shown in FIG. 18, and after all loading conditions had been applied, the final leak rate of $4.05 \times 10^{-9}$ atm-cc/s was nearly a full order of magnitude below the calculated leak rate requirement. These results indicate that SiC-based cladding tubes composed of an inner SiC—SiC composite layer coated by an outer SiC overcoat and sealed with a SiC endplug and a SiC-based joint can show robust behavior and survive different loading conditions while maintaining hermeticity. These results also show that the design described in this invention is capable of meeting leak rate requirements exceeding those required for LWR designs.

Dimensional Control

To demonstrate that cladding tubes can meet dimensional requirements, accurate means of measuring uniformity, roughness, roundness, and straightness/cylindricity, and other dimensions must be utilized. Currently, there are a range of tools available to obtain these dimensional tolerance values, including microscopy, CMM, micrometers, height gauges, and stylus profilometers. X-ray computed tomography can be used to generate a high resolution 3D reconstruction of a part, and it is possible to extract a range of dimensional measurements from a single XCT scan. These tools were used to demonstrate that a silicon carbide cladding structures based on this invention can be fabricated to meet straightness, roughness, and uniformity requirements.

In these studies, portions of several SiC—SiC tube samples were scanned using x-ray tomography, and then reconstructed for analysis. For roughness measurements, smaller regions were scanned at higher resolution and roughness values were obtained directly from these volumes without further processing. For larger scale measurements (straightness, cylindricity) over a longer tube length (~0.9 m), separate volumes had to be aligned, stitched, and combined into one larger volume comprising the entire tube.

Surface roughness measurements were obtained from stylus profilometer scans. Two tube samples were examined: one as-fabricated SiC—SiC composite tube with a braided reinforcing fiber structure, and a second tube, which had undergone additional processing to introduce a SiC—SiC composite layer containing small additives which offers reduced surface roughness.

The as-fabricated tube shows significant surface texture resulting from the underlying fiber tow architecture, as seen in a representative photo of starting fiber structure prior to infiltration, as shown in FIG. 19A. Multiple scans were obtained for each approach, and average roughness for the overall tube can be obtained. Representative surface profiles from the stylus profilometer are shown in FIG. 19B and are qualitatively similar.

Roughness values obtained from the profilometer are given in Table 2. The height of the individual reinforcing SiC fiber tows is in the range of ~200 μm-300 μm, and the fiber architecture and regions where tows overlap contribute to the surface undulations in the as-fabricated tube. Therefore, it is an expected result that the peak-valley roughness measurement obtained is very similar to the thickness of the individual fiber tows. This demonstrates that fiber architectures which are optimized for strength or other performance characteristics may not be ideal to provide a low surface roughness required for cladding applications.

TABLE 2

Roughness values for the outer surface of an as-fabricated SiC-SiC tube taken from a 7 mm long axial line profile.

| Roughness | Profilometer result |
| --- | --- |
| $R_{average}$ | 32.7 μm |
| $R_{rms}$ | 42.4 μm |
| $R_{peak-valley}$ | 197.4 μm |

The large peak-valley roughness (as well as average and rms roughness values) in the as-fabricated tube is not expected to be sufficient for a nuclear fuel cladding application. Excessive roughness on the cladding inner surface will lead to variations in the gap between the fuel and cladding and can result in non-uniform temperature gradients, causing additional stresses in the cladding. In addition, although high surface roughness on the outside surface of the cladding may provide some benefits to heat transfer due to turbulent mixing, this roughness will increase the coolant pressure drop through the core. The use of two or more distinct composite layers can address this problem, by combining composite layers optimized for a smooth surface and composite layers optimized for strength.

Figures 19C, 19D:
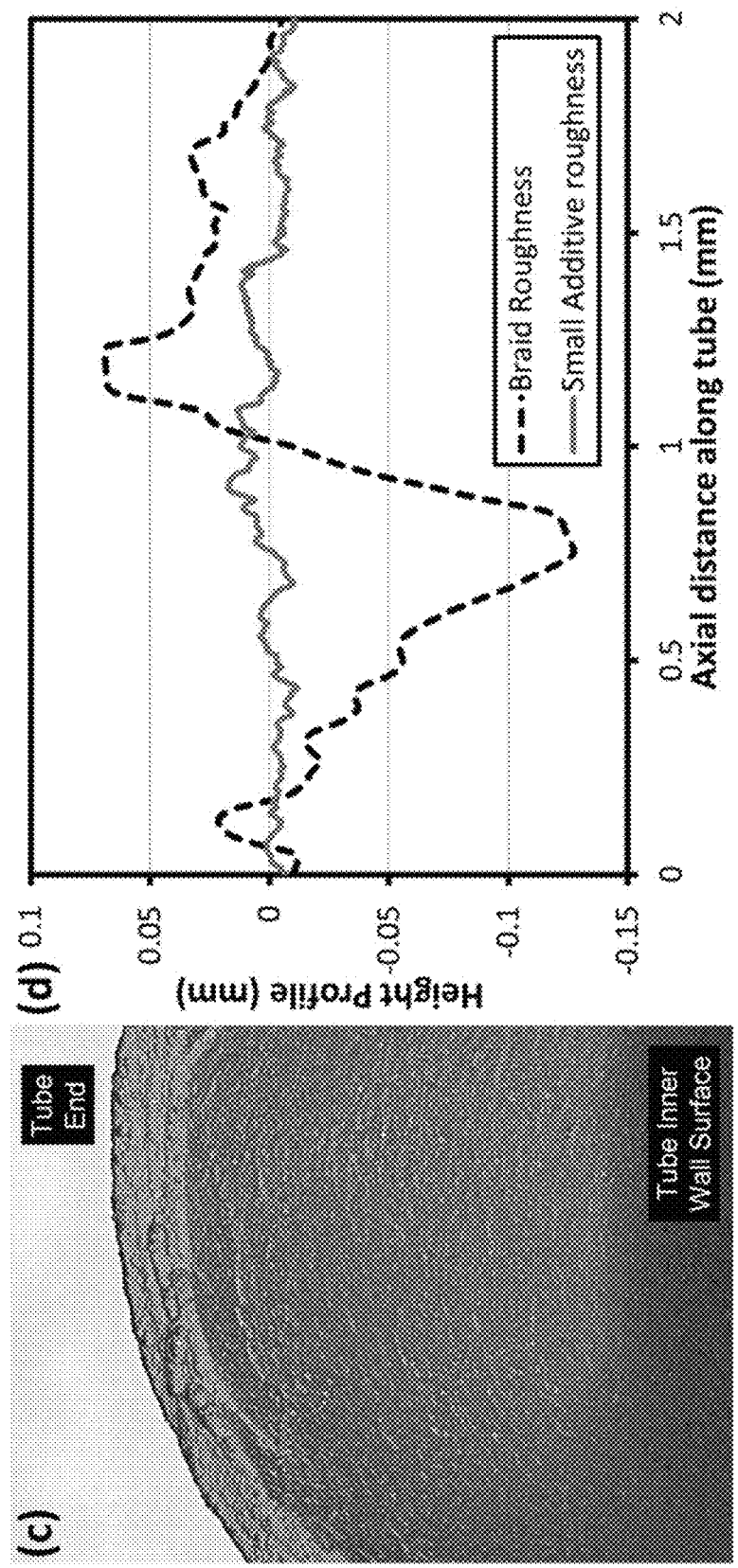
FIG. 19C shows an example of optical image of a SiC—SiC tube inner wall surface with a small additive composite coating, wall thickness is ~0.75 mm.
FIG. 19D shows an example of representative surface profiles for SiC—SiC composite made using small additives and for a SiC—SiC composite made using braided reinforcing continuous fiber. Height profile data obtained using profilometer measurements.

It is therefore desirable to characterize cladding tubes with controllable roughness on both the inner and outer surfaces. Several methods can be used to achieve controlled surface roughness, such as polishing or grinding, or through the use of composite layers which can provide an improved surface smoothness compared to the continues fiber reinforced composites shown in FIG. 19A. A tube which has thin composite layers containing small reinforcing additives on the inside and outside of a braided SiC—SiC composite layer was examined, as shown in FIG. 19B and FIG. 19C.

As with the SiC—SiC tube with a braided continuous fiber reinforcement, roughness values were obtained using stylus profilometry.

Average, root-mean-square, and peak-valley roughness are tabulated in Table 3, and represent a significant (~5-10×) reduction in roughness for this small additive composite layer tube compared to the braided fiber SiC—SiC tube. Representative surface profile scans for this small additive composite surface and the braided fiber composite surface are shown in FIG. 19D. While roughness specifications for SiC-based fuel cladding has not yet been defined, these values are close to the current specification for Zircaloy cladding tubes, and further improvement could be obtained through additional refinements to processing methods. Roughness values for the inner and outer surfaces are comparable. Standard deviations were obtained from roughness values from 2 mm long line scans taken from six different areas on the tube sample. This shows the significant advantage that can be obtained by combining two distinct composite layers within a cladding structure, as a cladding tube can be made that couples the desirable mechanical strength of a composite containing braided or wound continuous fiber reinforcement with the smoother, as-fabricated surface which can be obtained from a composite layer containing small-scale reinforcing additives. This reduced surface roughness can reduce cost and time associated with post-fabrication machining and polishing to meet surface roughness specifications.

TABLE 3

Roughness values for smoothed SiC-SiC tube obtained using stylus profilometry, taken from 2 mm long axial line profiles

| Roughness | Profilometer result | Profilometer Std. Dev. |
| --- | --- | --- |
| Inner - $R_{average}$ | 6.4 μm | 2.2 μm |
| Inner - $R_{rms}$ | 7.9 μm | 2.7 μm |
| Inner - $R_{peak-valley}$ | 37.6 μm | 13.1 μm |
| Outer - $R_{average}$ | 6.1 μm | 1.8 μm |
| Outer - $R_{rms}$ | 7.7 μm | 2.3 μm |
| Outer - $R_{peak-valley}$ | 38.1 μm | 10.3 μm |

Straightness and cylindricity are very important for fuel cladding applications, as deviations from straightness can lead to non-uniform spacing between tubes in a tightly packed fuel assembly, causing variations in heat transfer, increases stresses, and potential bowing.

For tubular structures, straightness measurements assess the maximum deviation of the tube surface from a straight reference line aligned along the tube axial direction. Although only straightness and roundness (or ovality) may be required specifications for a cladding tube, cylindricity measurements combine an assessment of both the tube straightness and the tube roundness into a single measurement, as deviations from both straightness and circularity contribute to the overall cylindricity value. Cylindricity measurements may be easily obtained through analysis of reconstructed XCT volumes, and this provides a single value to assess the tube geometry.

Cylindricity was measured by fitting cylinders to the exterior of the measured tube, and this was performed for each of the four ~25 cm long XCT volumes, as well as the stitched full length tube. The fitting process involved a user manually selecting a large number of randomly chosen points on the surface to be fit (either the inner or outer surface of the tube; for the following results the outer surface was used). 5000 evenly spaced points were automatically fit to the surface of the tube to envelope the manually selected points and a perfect cylinder was fit to these automatically selected points using a Gaussian least squared fit method. These points were used to obtain the cylinder diameter, and the cylindricity was also determined by finding the maximum inscribed and minimum circumscribed circles based on the fit to the cylinder. The scan size selected for these measurements gave a resolution for the cylindricity measurements of 127 μm, and this represented a balance between the scan resolution and number of scans necessary to encompass the full tube length.

Cylindricity results were first obtained for shorter volume sections (each approximately 25 cm long). The cylindricity for these volumes averaged 399 μm (standard deviation of 49 μm), with an average outer radius of 4.56 mm (standard deviation of 0.019 mm). The stitched and merged volume representing the entire 0.9 m long tube was then analyzed, and the fit process (initiated by user-selected surface points) was repeated eight times. Average tube outer radius for the entire length was almost identical to the average radius for the individual sections at 4.57 mm (compared to 4.56 mm), and there was essentially no variation between each of the eight individual fits that were analyzed (standard deviation of the radius for these eight different fits was 0.001 mm). The average cylindricity for the fit of the merged volume was 774 μm, with a standard deviation of 30 μm between the different fits. This indicated that while there is a manual aspect to the fitting process (the user selection of surface points which forms the basis for the fit), the potential error introduced by this selection is small (standard deviation is only ~4% of the average cylindricity value).

For the SiC—SiC tubes analyzed in this work, even though the surface roughness of the as-fabricated tubes contributed to a large roundness deviation value, the overall cylindricity still had a significant component due to straightness deviations. Assuming the straightness deviation is the main contribution to the 774 μm average cylindricity value over the 0.9 m long tube, this would correspond to a straightness deviation of ~3.1 mm over a full ~4 m long fuel rod, which meets requirements for LWR fuel cladding. However, the straightness tolerance for nuclear fuel cladding tubes is large relative to the roundness requirements.

A coordinate measuring machine (CMM) and a vertical height gauge were also used to evaluate the cylindricity of these tubes, as a comparison to the XCT-derived values. This measuring approach offers improved resolution compared to the XCT scans (12.7 μm in the X, Y, and Z directions), and can measure the entire 0.9 m length of the tube at once. However, the CMM approach is limited in that location measurements are taken individually, and as a consequence it is not practical to sample thousands of surface points, which the XCT approach is able to provide. This CMM limitation may introduce some sampling error, and potentially under-represent the cylindricity. In these CMM measurements, five points encompassing 180° were taken around the circumference of the tube at each of 25 different circumferences, evenly spaced along the tube axis. The cylindricity value obtained from this measurement was 472 µm. This CMM cylindricity value is similar to the cylindricity values obtained from the individual (25 cm long) XCT volumes (399 µm), but smaller than the cylindricity in the merged XCT volume (774 µm). A summary of the cylindricity values obtained in this work from different scan lengths and measurement methods is given in Table 4.

TABLE 4

Average cylindricity or straightness values obtained for different scan lengths and measurements techniques.

| Measurement (number) | Average Cylindricity (Std. Dev.) |
|---|---|
| XCT - 0.25 m length | 399 µm |
| (four different scans) | (49 µm) |
| XCT - ~0.9 m stitched length | 774 µm |
| (one volume, eight fits) | (30 µm) |
| CMM - ~0.9 m Length | 472 µm |
| (single measurement) | (N/A) |
| Height Gauge -~0.9 m length | 863 µm |
| (nine separate tubes) | (453 µm) |

The cylindricity for a cladding tube will depend on the straightness obtained in the underlying composite, and would be defined near the start of processing (absent any mechanical grinding or polishing steps at the end of fabrication). The cylindricity value reported above therefore gives a good approximation of the straightness that could be currently obtained for these structures.

Figure 20:
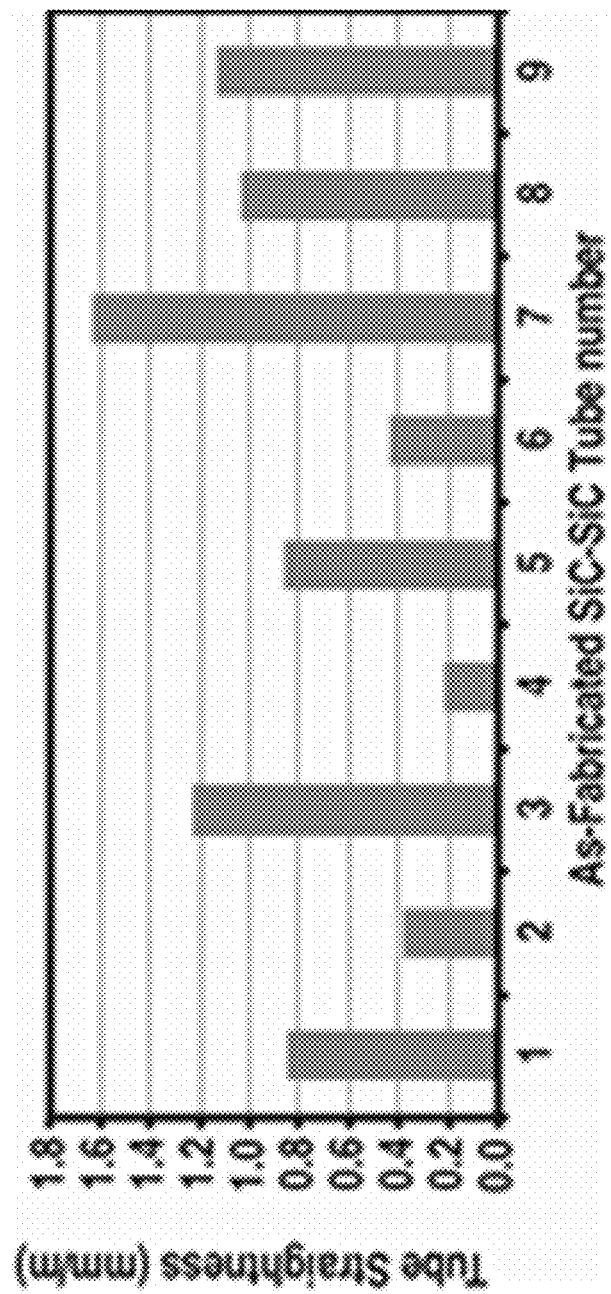
FIG. 20 shows an example of straightness measurements obtained using a vertical height gauge for a set of nine tubes fabricated using the same fabrication approach.

One additional method was used as a rapid assessment of tube straightness. A vertical height gauge was used to find the highest point along the length of a tube while the tube ends rested on a flat granite surface. While this vertical height gauge method provided a quick measurement, the practical accuracy of this approach relied on a visual assessment to ensure the highest point on the tube was being measured. As such, while the resolution of the vertical height gauge was 10 µm, the accuracy of this measurement method was subject to more user error than both the XCT and CMM cylindricity measurement methods. Furthermore, as this method only measured the highest point on the tube, it provides a straightness measurement, rather than a cylindricity measurement (cylindricity would incorporate both straightness and roundness assessments, and with only the highest point sampled, the vertical height gauge does not measure the roundness contribution to the cylindricity). However, these height gauge measurement were used to evaluate the straightness distribution across a range of tubes produced using nominally the same fabrication method. All tubes were ~0.9 m long, and across the nine tubes, the average straightness was 863 µm, and the standard deviation between all samples was 453 µm. This set of measurements is shown in FIG. 20. The current cladding straightness requirement is 0.25 mm per 300 mm length (which translates to 0.833 mm/m), and the tube measured using the XCT and CMM methods, and approximately half the tubes measured by the height gauge method meet the specification (three of the tubes measured using the height gauge exceed the requirement, and two are within 3%). With refinements to the fabrication process, repeatability is expected to improve and result in a higher yield of tubes meeting this specification, and this shows that the cladding design described in this invention can meet cladding straightness requirements.

In addition to meeting dimensional tolerances in the production of long SiC—SiC tube for fuel cladding applications, it is also essential that the material performance is uniform along the tube length, and meets mechanical, thermal, and permeability requirements. Fiber structures and orientations can be maintained with good consistency for long tubes; however, the infiltration of these fibers can vary as a function of length during the chemical vapor infiltration process. The completeness of infiltration is a function of the temperature, pressure, and local precursor concentrations during infiltration, and all these parameters, as well as byproduct concentrations, can vary throughout the infiltration chamber, both spatially and temporally. During the infiltration process, a deposition gradient develops from the outside of the composite to the center, and this will result in the gradual formation of a dense SiC layer on the outer surface of the composite. The uniformity of the infiltration can be assessed by measuring properties or porosity as a function of position along the length of the tube, or as a coarse approximation, the thickness of the outer SiC layer can be used as a gauge of the uniformity. This approximation assumes that if the deposition of SiC on the outer composite surface is uniform, then the interior infiltration will likely be similar. While not as accurate as direct comparison of mechanical and thermal performance at different points along the tube length, or density measurements, the variation in the SiC coating thickness as a function of length can provide important feedback on the uniformity of the infiltration process.

Figure 21:
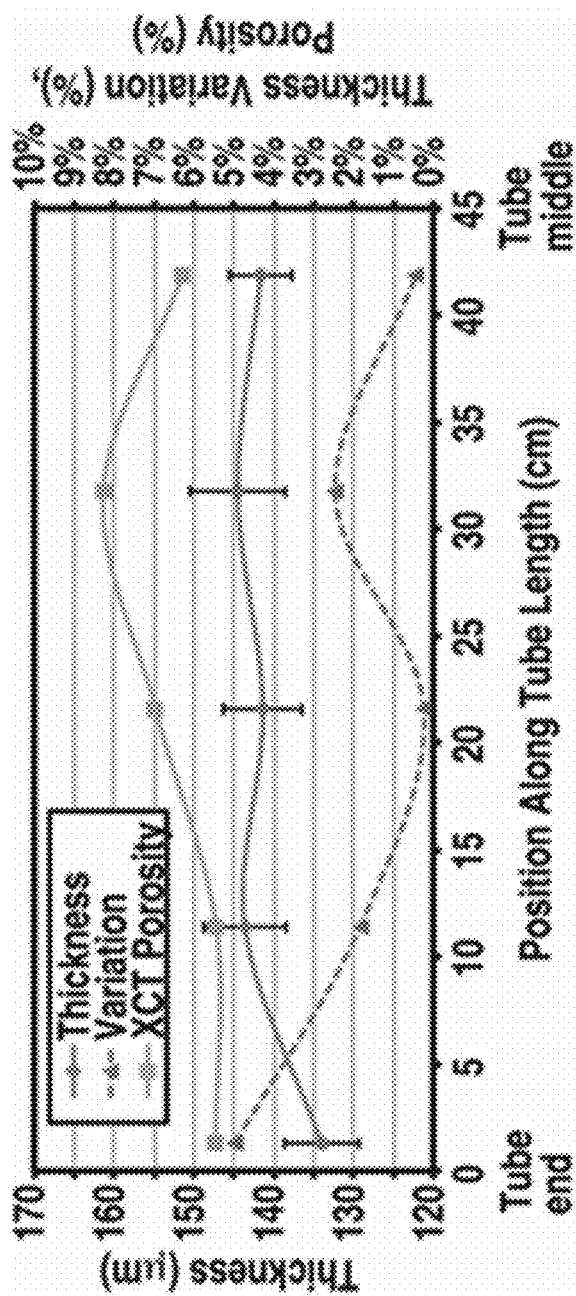
FIG. 21 shows an example of SiC overcoat thickness and variation in overcoat thickness (normalized to the overcoat thickness) and fraction porosity as a function of axial distance along tube length.

Measurements of uniformity along the length of a representative tube were performed using two approaches. First, XCT scans were taken at approximately 10 cm intervals along the length, starting at one end and continuing to the center of the tube. A representative volume of the tube was analyzed at each interval and total material volume as well as total internal pore volume was measured. Due to the resolution of the XCT scans used, extremely small pores may not be resolved, and as a consequence, these values may slightly underestimate the actual total sample porosity. However, a significant variation in this underestimation as a function of position is not expected, and these XCT scans should give a good indication of uniformity. The porosity fraction was calculated from these measurements, and is plotted as a function of position along the tube length in FIG. 21. The second approach utilized the overcoat thickness approximation, and measurements of overcoat and variations in thickness (normalized to the average thickness) were obtained and are also shown in FIG. 21. This data only represents half the distance along the tube length (from one end to the center); however through periodic rotation of the tube during fabrication it is expected that any thickness variation is symmetric from each tube end. These initial results show that the porosity ranges between 5% and 8% along the tube length, and the coating thickness variation is 5% or less. In addition, no clear trend of varying porosity or overcoat thickness is observed as a function of position. A complete assessment of the density, mechanical, and thermal properties along the tube length would provide a more complete data set, however, these results suggest that good tube axial uniformity can be achieved for this cladding design.

Alternative Structures and Experimental Results
Inner Monolithic SiC Layer

Alternate structures containing an inner monolithic SiC layer, as well as structures composed entirely of SiC—SiC composite, were also produced to show a contrast in the designs and the benefits of the invention. Those tubes containing an inner monolithic layer incorporated a thin-walled (~450 um wall thickness) extruded and sintered SiC Hexoloy tube (St. Gobain Ceramic Materials). Compared to CVD SiC, Hexoloy has similar unirradiated material properties but contains sintering aids and has slightly lower density and purity. Reinforcing fiber was then formed around this inner monolith as a second layer. The tube structures (tubes composed of only SiC—SiC composite and those with an inner composite layer) were formed by placing fiber around a mandrel to define the tube inner diameter. For example, FIG. 14C shows the cross-section of a tube structure with an inner monolithic SiC layer.

Test Model for Mechanical Characterization of SiC—SiC Tube Structures

For comparison purposes, calculations of the expected ratio of hoop to axial strength were made based on simplified fiber architectures. Assuming ultimate strength is governed by the strength of the fibers (with maximum strength occurring after significant matrix cracking has reduced the matrix load carrying capacity), filament wound pressure vessel strength equations can give a rough estimate of strength for a given fiber alignment. This simplified approach neglects fiber architecture details, such as weaving, fiber tow curvature, and related crimping effects, but can give a rough approximation of relative strengths in the hoop and axial directions for different fiber reinforcement structures. For both fiber architectures studied, the measured hoop strength was higher relative to the axial strength than predictions based on this simple approximation would suggest. In the axially biased samples, this simple estimate predicted a 50% higher strength in the axial direction than in the hoop direction, but the measured axial strength was only ~13% higher than the hoop strength. This difference was also apparent in the hoop biased specimens, where a 30% higher hoop strength was predicted, but the measured hoop strength was over 300% higher than the axial strength. This is in contrast to reports for a ±45° braided tube in the literature, where nearly identical hoop and axial behavior was observed, as would be expected by the balanced braid architecture (1:1 ratio of axial:hoop fiber reinforcement).

The discrepancy between the model predictions and measurements indicate that other parameters are influencing the mechanical properties, in addition to fiber reinforcement architecture. Past experience in fabrication has shown that certain fiber preforms may be easier to infiltrate to near full theoretical density or have a more favorable pore distribution, resulting in improved mechanical properties. Since porosity specifically is known to have a direct effect on the elastic modulus in ceramics and ceramic composites its distribution within the fiber architecture is likely to be the most probable cause of the discrepancy.

The differences between estimated hoop and axial strengths and measured values, could also be due to differences between the test methods and test specimen geometries. For axial tests, a relatively large volume of material within the gauge length is loaded while in C-ring tests only a small volume of material is subjected to the most severe loading conditions. For a ceramic matrix with a distribution of flaws and voids, a larger volume would have an increased probability of containing a larger void which could initiate cracking at lower stress levels. However, similarity between C-ring hoop strength results and expanding plug hoop strength results (where a much larger sample volume is loaded) has already been demonstrated, suggesting that the differences in volumes of stressed material may not fully explain the difference in the axial and hoop strength results. In addition to the pore size distribution, the pore geometry may also show a directional dependence. The void shape and alignment is influenced by the fiber architecture, and this may also contribute to the observed variations in hoop and axial strengths. Another contributing factor could be the potential for more complicated stress states to occur during gripping and loading and contribute to initiating failure in the specimen. For axial tensile tests, small misalignments can introduce bending moments during loading, whereas contact points on C-ring specimens are far away from the point of failure. However, measured bending for the axial tensile test was typically below 5%. A more detailed study of effects of both fabrication and mechanical testing parameters on the measured SiC—SiC composite properties is needed, to resolve the discrepancy between model predictions and measurements. Nevertheless, the model calculations provide a relative guide for assessing architectures.

Multi-layered tubes have been tested with either an inner or outer monolithic layer to investigate the effects of this multi-layered structure on mechanical performance. During mechanical testing, this multi-layered structure remained intact, and delamination between layers was not observed. Additional tubes composed solely of SiC—SiC composite with the same fiber architecture but lacking a monolithic SiC layer were processed in identical conditions and tested for comparative purposes. Fully monolithic tubes were not tested in this work, but as a reference, CVD SiC has a modulus of ~460 GPa and strength ranging from 200 MPa to 500 MPa, and sintered Hexoloy SiC has a reported flexural strength of 280 MPa and modulus of 420 MPa at room temperature. Hoop strength results for both multi-layered and all-composite tubes are presented in Table 2. Weibull analysis was performed on the C-ring results, and Weibull moduli are also reported in Table 5. For these tests, ten specimens were tested for the inner monolith structure and the corresponding all-composite structure as well as the outer monolith structure. Weibull modulus values for these samples range from 4.6 to 7.9. Only five specimens were tested from the all-composite structure corresponding to the outer monolith structure, and it is believed that this smaller specimen set is the reason this sample had a higher Weibull modulus, of 12.1. These values are similar to those reported in the literature for SiC—SiC composites (between 3.7 and 11.0). For the inner monolith and corresponding all-composite samples, the reinforcing fiber architecture used is the same as the axial biased architecture shown in Table 1. The outside monolith and their corresponding all-composite tubes were larger than typical LWR cladding diameters (~19 mm inner diameter); however, the fabrication process for these tubes was essentially identical to that for the smaller tubes, the fiber structure was representative, and similar results would be expected for an LWR-sized tube. In some embodiments, the fiber architecture for the outer monolith and corresponding all-composite structures was hoop-biased. Due to the differences in reinforcing fiber architecture, comparisons between the strength values of the overall inner and outer monolith structures cannot be made; in this work these strength values should only be compared with their corresponding all-composite tube samples.

TABLE 5

Mechanical data for hoop direction properties for two different multi-layered architectures and corresponding composite only tubes (Standard deviation given in parentheses)

| Architecture | UTS C-Ring (MPa) | Weibull Modulus | PLS - Expanding Plug (MPa) | | UTS - Expanding Plug (MPa) | | Modulus - Expanding Plug (GPa) |
|---|---|---|---|---|---|---|---|
| Inside Monolith | 174 (28) | 7.0 | OD = 92 (6) | ID = 140 (7) | OD = 152 (8) | ID = 231 (9) | 278 (20) |
| Composite | 209 (24) | 7.9 | N/A | | N/A | | N/A |
| Outside Monolith | 311 (59) | 4.6 | OD = 129 (10) | ID = 158 (12) | OD = 271 (2) | ID = 332 (3) | 288 (13) |
| Composite | 304 (14) | 12.1 | N/A | | N/A | | N/A |

In the case of the multi-layered materials both C-ring data and expanding plug data are provided due to the non-uniformity of the tube, which can cause greater deviations from hoop UTS in the c-ring test. For the expanding plug test, stresses at both the OD and ID are calculated and reported, but this particular calculation assumes a uniform material (rather than multi-layered). The differences in elastic modulus and Poison's ratio between composite and monolithic cause different stress profiles between the layers and as such the reported values should be treated as approximations only. In particular, when compared to a uniform material approximation, actual stresses in the monolithic layer would be higher than those in the composite layer, due to the higher modulus of the monolith. More detailed FEM analysis would be needed to provide a more accurate calculation of the stress distribution through these layered cladding structures.

Figures 22A, 22B:
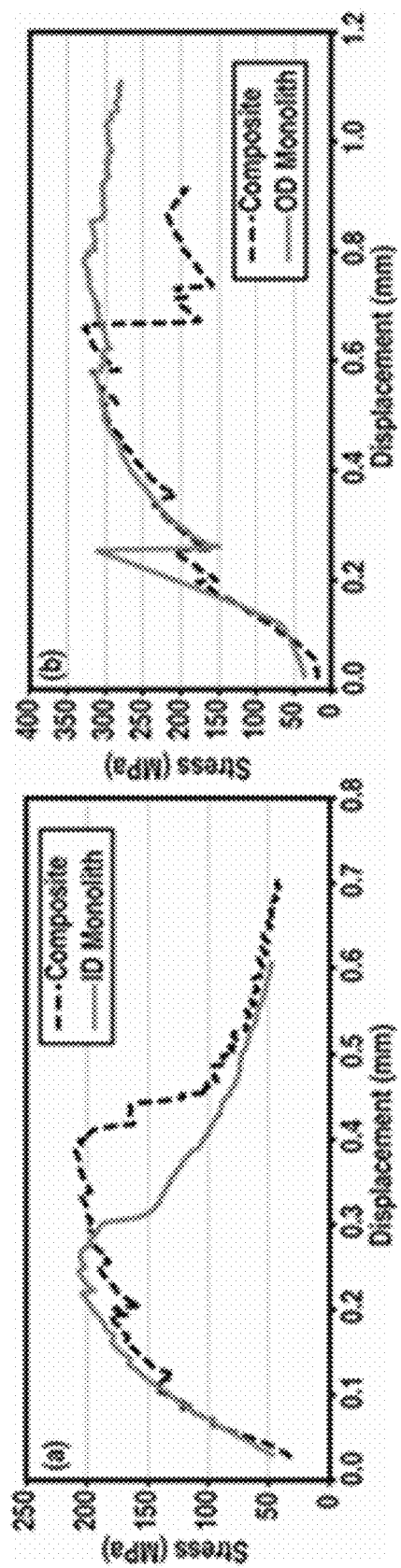
FIG. 22A shows an example representative hoop stress versus displacement as measured with the C-ring test for inner monolith material and corresponding composite only.
FIG. 22B shows an example of representative hoop stress versus displacement as measured with the C-ring test for outer monolith material and corresponding composite only.

For the case of the inside monolith, the UTS as measured by C-ring testing is slightly lower than the corresponding composite only UTS. The PLS of 140 MPa, located at the inner diameter, corresponds to the cracking of the inner monolith layer. Stress versus displacement for the C-ring test for these specimens can be seen in FIG. 22A. The C-ring test puts the OD of the composite in tension and the ID in compression and as such it is both expected and experimentally observed that the stress-displacement behavior for the inner monolith specimen is very similar to the composite only, as the tensile stress is being primarily applied at the composite layer in both cases. While the overall shape and UTS are very similar, a higher displacement at UTS is observed on average for the all composite specimen. This suggests that the addition of the monolith causes some loss of toughness in the specimens due to reduced fiber fraction, showing that this inner monolith configuration is not an ideal location for the monolithic layer.

For the outside monolith structure, the UTS is closer to the corresponding composite only specimen suggesting that the application of the outside monolith has little effect on the composite layer itself and once the monolith layer is breached it behaves similarly to a composite only specimen. This observation is supported by C-ring testing seen in FIG. 22B. For the outside monolith specimen an initial linear elastic region is observed as the monolith layer is loaded to failure. Once the monolith layer has failed the load redistributes onto the composite and the stress-displacement behavior becomes very similar to that observed for the composite only specimen. For the outer monolith and inner monolith specimens, there is significant additional load-carrying capacity after the PLS is reached, and composite behavior is observed.

Figures 23A, 23B:
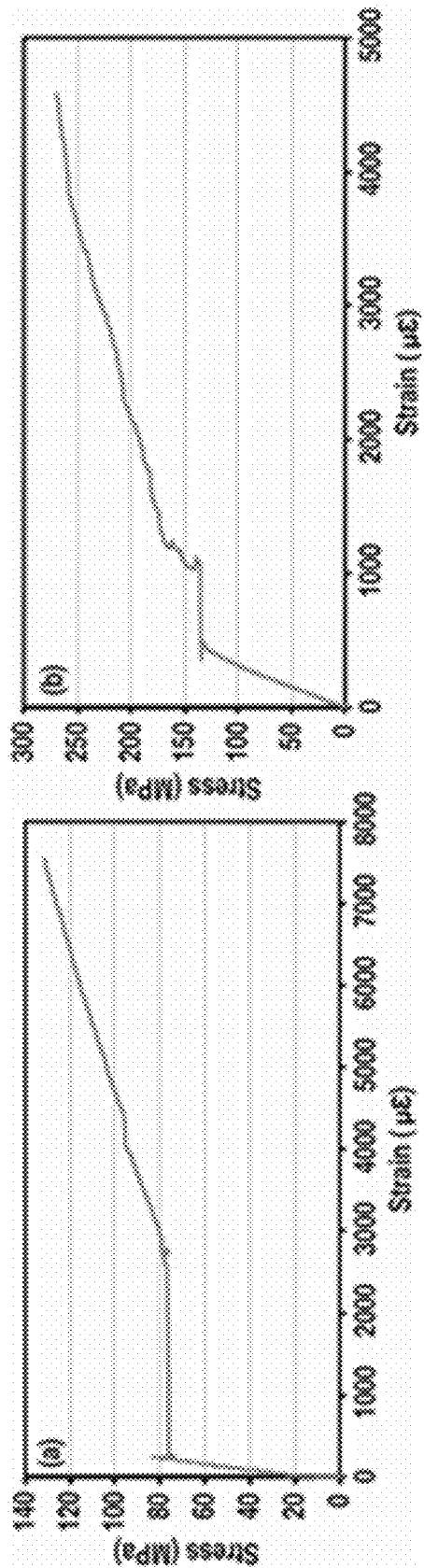
FIG. 23A shows an example of representative hoop stress versus strain as measured with expanding plug test for inner monolith material.
FIG. 23B shows an example of representative hoop stress versus strain as measured with expanding plug test for outer monolith material.

Strain was measured through use of strain gauges on the OD of the composite, and the stress versus strain plots for the expanding plug testing performed on the multi-layered tubes can be seen in FIG. 23A and FIG. 23B. Of particular interest in these plots is the shape of the stress strain plot at, and just following, the PLS. The PLS can be determined at both the outer and inner surfaces of the tube (these are listed in Table 5), and despite the dissimilarity in PLS values seen in the plots due to the difference in location of the monolith (inner versus outer), in both cases the monolith fails at approximately 130-140 MPa. Once the monolith fails, a rapid redistribution of the strain in the system takes place due to a significant reduction in the ability of the monolith to carry stress/strain. The effect is particularly noticeable in the case of the inner monolith structure where a large jump in strain is observed at the OD of the composite once cracking in the inner monolith occurred. As stress is highest at this inner surface, this means a larger redistribution must take place. This data highlights the advantage of using a monolith on the outside for the simple case of internal pressurization of a tube.

For SiC-based accident tolerant fuel under operating conditions, the actual stress distribution would be much more complicated due to thermal gradients and irradiation induced swelling. As a consequence, no definitive conclusions can be drawn from this data alone, and a more comprehensive assessment of these complex conditions is needed. For a fuel cladding application, a thorough stress analysis considering pressurization as well as thermal gradient and irradiation-induced swelling effects must be performed. Stress results for different potential SiC-based accident tolerant fuel cladding designs have been analyzed, with results published elsewhere. However, the C-ring and expanding plug test methods used here can still provide valuable basic strength information, to help evaluate all-composite structures and more complex multi-layered cladding designs.

Thermal Diffusivity

Figure 24:
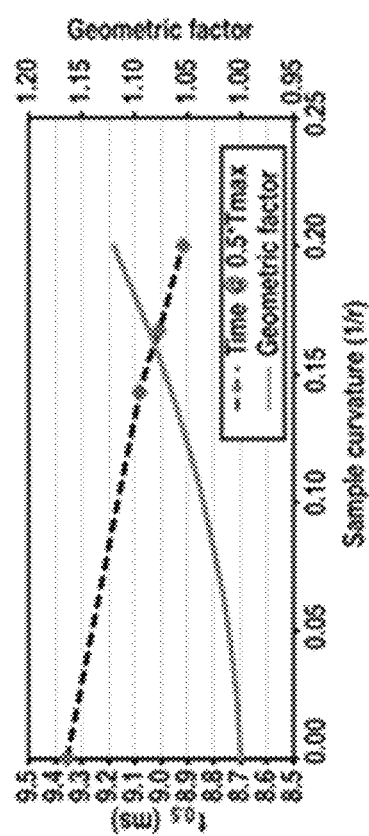
FIG. 24 shows an example of experimentally measured time required to reach half maximum temperature for laser flash measurements of surrogate curved lead samples, along with geometric correction factor obtained from these results.

A series of measurements was performed on surrogate materials to determine effects of sample curvature on thermal diffusivity measurements using the laser flash method (by evaluating the time required for the temperature to reach half the maximum). Experimental results for surrogate samples made of 1.25 mm thick lead sheet and curved to different radii are shsown in FIG. 24, and a geometric factor was empirically determined based on these results.

Dimensional Control

Recognizable features in adjacent scan volumes that can be oriented and merged can be used to assist in the alignment process. The use of appropriate alignment features may be particularly important when the volumes to be merged have similar, repeating features which cannot be easily distinguished between volumes. To serve as an alignment aid in this work, small additional portions of SiC—SiC tubes were attached to the sides of the longer tube being scanned at three intervals along the length. The exact nature of these additional alignment aids is not critical, as long as they are sized so that they have features which can easily be oriented between scans, can be fully included in adjacent scans, and have similar densities to the SiC—SiC tubes being scanned so as to not cause contrast issues in the XCT.

Figures 25A, 25B, 25C:
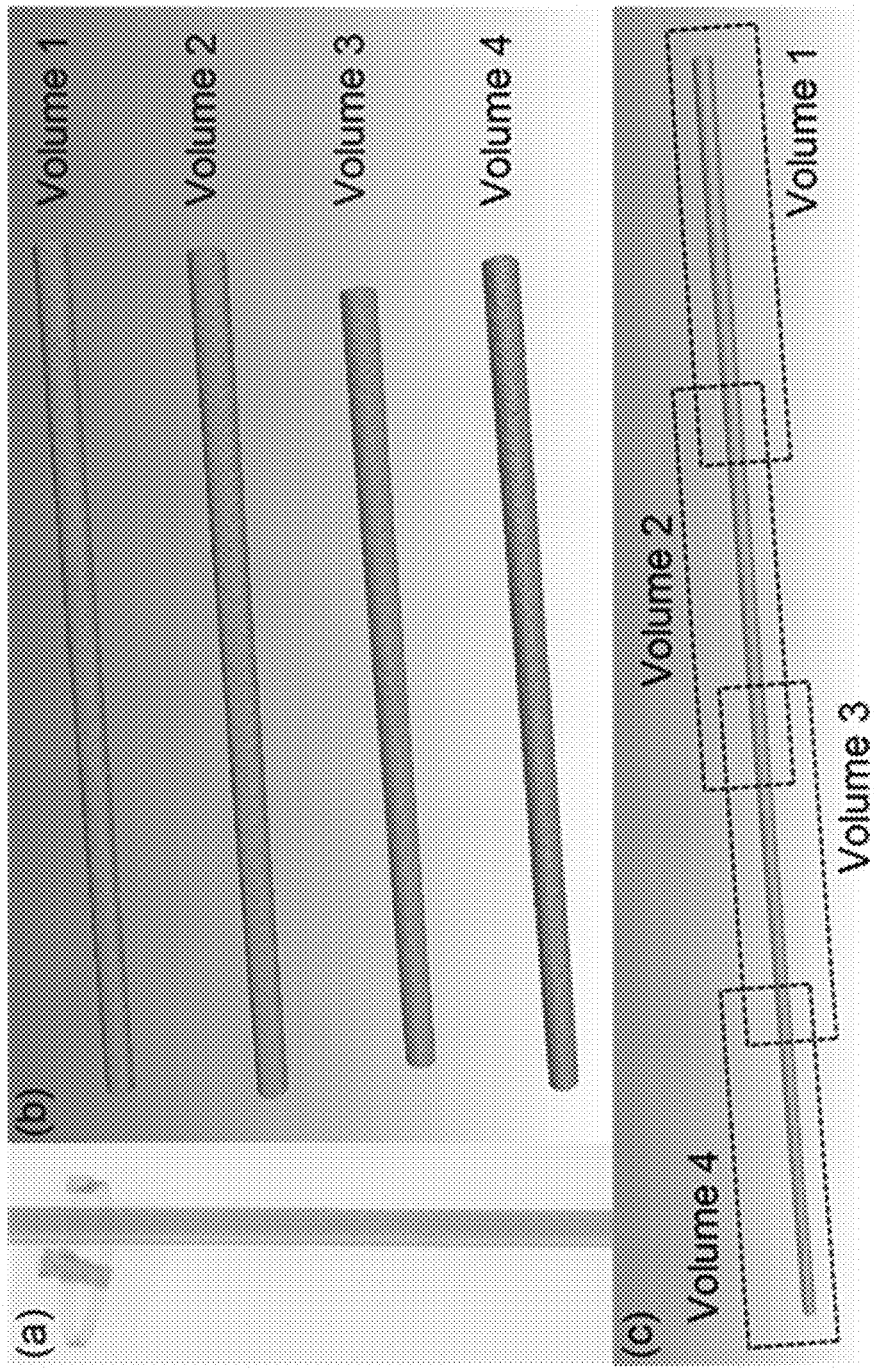
FIG. 25A shows an example of reference feature to aid volume alignment.
FIG. 25B shows an example of individual scanned volumes each ~25 cm long.
FIG. 25C shows an example of full reconstructed and stitched volume of entire 0.9 m long SiC—SiC tube.

The configuration of one of these alignment aids relative to the SiC—SiC tube is shown in FIG. 25A, along with the four individual scanned volumes shown in FIG. 25B and the full stitched and reconstructed 0.9 m long SiC—SiC tube as shown in FIG. 25C.

While the use of x-ray computed tomography allows for rapid measurement of roughness over a large area of a sample surface (via multiple profile scans), as well as roughness assessment in arbitrary directions (not limited to axial), these results show limitations of the XCT approach based on the scan resolution. For samples with larger surface roughness (the as-fabricated tubes), the XCT roughness results agree well with the reference measurement (the stylus profilometer value). The XCT roughness values are approximately half those of the stylus profilometry results. For these smoother samples, the scan resolution used for the XCT scans in this work was not sufficient to provide the same roughness detail as the profilometer scan, and underestimated the actual sample roughness. For these smoother SiC—SiC tubes (Ra≈5 µm), a higher magnification XCT scan should be used, with a resolution of ~1 µm or better. X-ray tomography of SiC—SiC composites has been reported in the literature with sub-µm resolution. With this improved resolution and modification to the XCT scan parameters and volume reconstruction, this technique could be used to rapidly assess SiC-based nuclear cladding tubes.

Figure 26A:
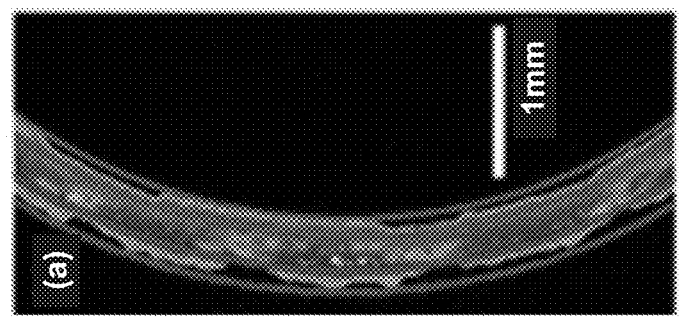
FIG. 26A shows an example of surface roughness contribution to outer (blue), and inner (red) roundness calculation.
Figure 26B:
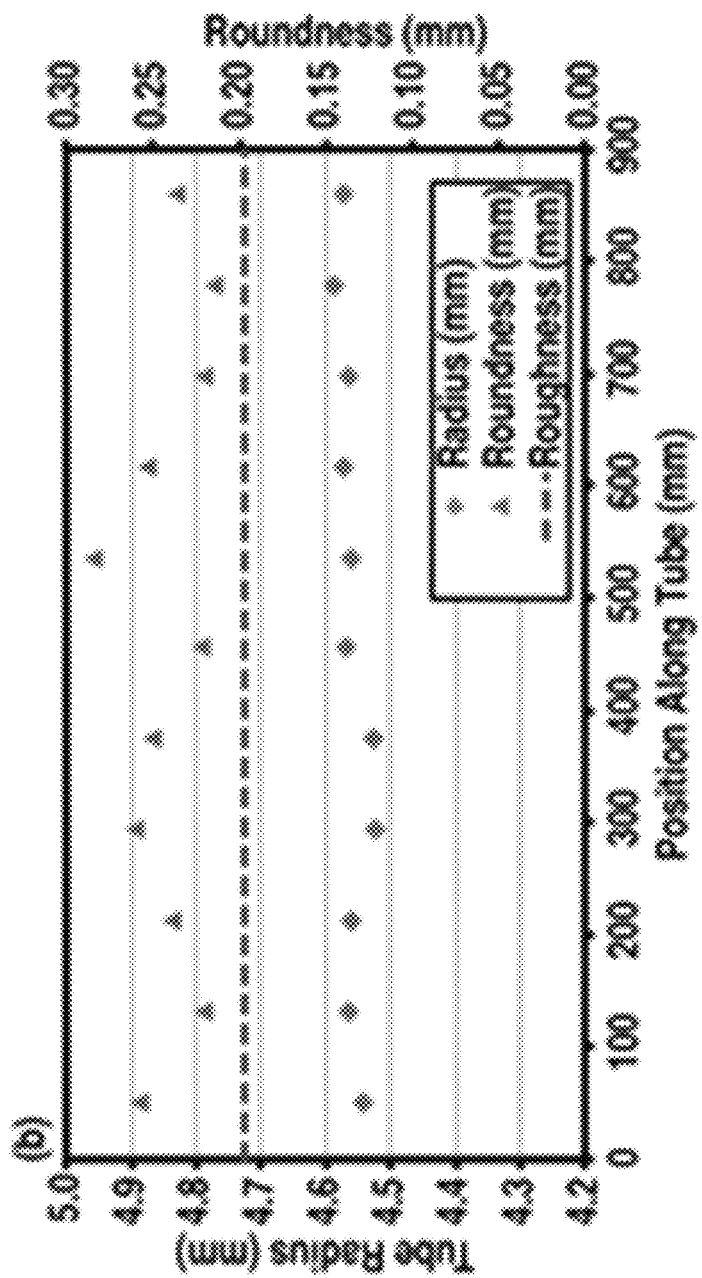
FIG. 26B shows an example of outer radius and outer surface roundness values measured along length of 0.9 mm SiC—SiC tube, along with typical as-fabricated composite surface roughness value.

Roundness was measured by fitting circles to either the inner or outer diameter of the XCT tube volume. Each fit circle utilized 5000 evenly spaced points and a Gaussian least squares method to determine the circle diameter. The roundness was then determined using the maximum inscribed and minimum circumscribed circles based on the locations of the 5000 points fit to the circle (FIG. 26A). This approach was used to measure roundness (and corresponding tube radii values) at 11 evenly spaced points along the axis of the stitched XCT 3D reconstruction of the entire 0.9 m tube. The average outer radius based on these 11 measurements was 4.56 mm (standard deviation of 0.02 mm), and roundness was 242 µm (standard deviation of 22 µm). Roundness values and tube radius values along the tube length are plotted in FIG. 26B.

Figure 26C:
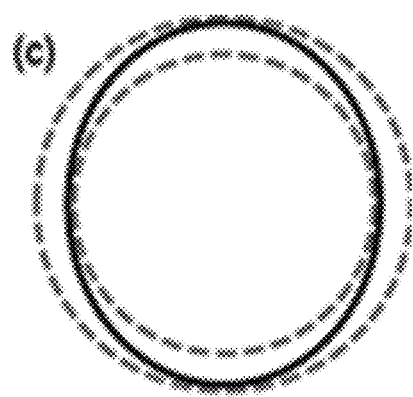
FIG. 26C shows an example schematic showing how ovality can contribute to the same measured roundness value.
Figure 26D:
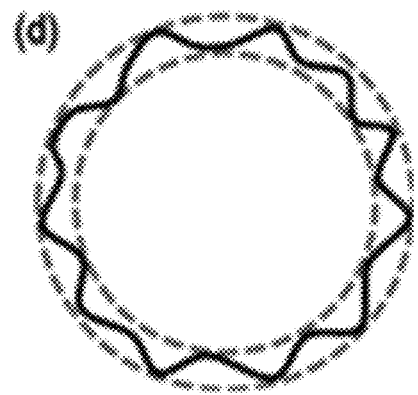
FIG. 26D shows an example schematic showing how roughness can contribute to the same measured roundness value.

The roundness values represent a significant deviation from circularity and exceed the roundness specification of ±25 µm; however, this is a consequence of the large surface roughness of the as-fabricated tubes, which have not undergone additional processing steps to reduce roughness. Since the roundness measurement is a function of the highest and lowest points along a cylindrical cross section, the unevenness caused by the underlying fiber tow structure leads to the large measured roundness values. For tubes such as those measured in this work with high roughness, the contributions of ovality and roughness to the overall roundness value cannot be isolated as shown in FIG. 26C and FIG. 26D.

The increase in the cylindricity obtained from the individual and stitched XCT reconstructions (average cylindricity of 399 µm for the individual volumes compared to 774 µm for the merged volume) could arise from two different sources. One cause of this would be an actual increase in the straightness deviation for the longer tube compared to the 25 cm individual segments scans. If there was a larger straightness deviation in the overall length of tube that was being missed by analyzing individual 25 cm long scans, then it would be expected that the straightness value would increase with increasing tube length, and correspondingly, decrease with tube length being analyzed was decreased.

Alternately, there could be errors associated with the stitching process, which result in misalignment and introduce straightness deviations, which are an artifact of the stitching process rather than present in the actual tube.

For a tube structure composed of an inner monolith surrounded by an outer composite layer, the straightness would instead be strongly influenced by the straightness of the underlying monolithic tube. To investigate this, the cylindricity of an extruded, ~0.9 m long, thin-walled (~400-500 µm wall thickness) Hexoloy tube was measured using the CMM. This was the same material used in the inner monolith structures shown in FIG. 14C. The cylindricity for this part was 267 µm, or slightly more than half that of the as-fabricated SiC—SiC tube. As the surface roughness of this Hexoloy tube is far smoother than that of the as-fabricated composite tube, there is a significant roughness contribution (~200 µm, see Table 1) to the cylindricity in the all composite tube that is absent in the Hexoloy cylindricity. In addition, for the inner monolith structure, the roughness caused by the fiber architecture would still be present in the overlaying composite layer, so the 267 µm cylindricity measured for the Hexoloy tube should represent a best-case cylindricity for a tube with an inner monolith structure, and the final cylindricity may be comparable to that of the all-composite or outer monolith tube.

Discussion of Experimental Results

Fiber architecture of SiC—SiC composites had a significant impact on the relative hoop and axial strengths of the tubes tested in this work. Results support the view that careful design of tube fiber structure will allow for control and balancing of the resulting hoop and axial strengths to meet operational requirements. Hoop strengths were also measured for multi-layered tube structures, and these specimens had strengths similar to corresponding all-composite samples.

The hermeticity of SiC-based tube structures with an outer monolithic layer was verified using a helium leak detector. Prototypical tube structures, including open-ended tubes and those composed of a tube sealed on one end by an endcap and a SiC-based joint were subjected to mechanical and thermal loading. These structures composed of a tube sealed with an endcap using a SiC-based joint demonstrated durability and the ability to withstand a range of stresses while still maintaining impermeability.

Several approaches were used to evaluate dimensional tolerances for longer (~0.9 m) SiC based tubes. In general, x-ray computed tomography (XCT) can provide a versatile means to measure a wide range of dimensional tolerances. Very large parts, which exceed the machine size limit for a single scan, must be scanned in multiple segments, and these can be recombined into a single volume for analysis. Roughness can be measured using a stylus profilometry for as-fabricated composite tubes (showing considerable texture from the underlying fiber structure). However, the use of a composite layer incorporating small-scale SiC whiskers and other additives provided significantly improved surface smoothness, showing the benefits of combining multiple, distinct composite layers.

Tube cylindricity and straightness were also assessed. Three approaches were used to measure tube cylindricity, and these values, which include contributions from both tube straightness and surface roughness, ranged from 0.5 mm to 1.0 mm deviation per meter length.

The measured roughness values for the smoother SiC—SiC tube were close to the current specification for Zircaloy cladding tubes. The majority of the long (~0.9 m) tubes measured meet the current straightness requirement.

Overall, characterization methods for evaluating four distinct cladding metrics were demonstrated on representative SiC—SiC tube architectures and it was shown that the cladding design described in this invention can be fabricated to meet dimensional tolerances for LWR fuel rod cladding applications, as well as fuel rod specifications for other reactor types. Development of new characterization techniques is needed to accurately represent the more complex mechanical and thermal stress states that will be experienced by a SiC-based fuel cladding throughout the fuel life, and additional refinement of the accident tolerant cladding structure will lead to fuel designs better able to accommodate these stresses.

Fabrication without Graphite Mandrel

The multi-layer SiC composite structures disclosed herein can be manufactured using various methods. For example, graphite can be used as a mandrel material capable of withstanding the harsh conditions of CVD or CVI to complete the densification process for the fabrication of the SiC composite structures. However, as discussed previously, the mandrel removal step after the densification completes usually involves burning or machining away the graphite material because the SiC CMC can become mechanically interconnected with graphite. This patent document further describes techniques and methods that can be used for fabricating SiC composite structures into complex shapes without a graphite mandrel during matrix processing.

Fabrication of the disclosed SiC composite structures can be performed using a fiber preform that is supported by a binder or additives. When a fiber preform is unsupported and does not contain a binder or additives, it relaxes into a natural resting position that has minimal stresses. However, preforms that are pre-impregnated with additives maintain their shape during CVD/CVI because an additive scaffolding supports the fibers. The fibers and additives would then remain after the binder within the slurry decomposes. This scaffolding acts as an inter-fiber support to keep fibers from returning to their natural resting position long enough for the coating gasses to form a rigid monolithic support structure.

The amount of additive loading to make a supported preform can depend on the geometry of the SiC matrix. For example a thin single-layer braided sleeve with a high aspect ratio of length to diameter may need more additive support than a thick multiple-layer braided sleeve with a low aspect ratio. One of design considerations is the amount and direction of force being applied to the preform. For example, a fiber sheet pulled over a sharp angle will require more support around the angle than a fiber sheet pulled over a long radius curve.

A slurry, comprising additives, a binder and a solvent, can be used to facilitate manufacturing of such supported preform. In situations where additive support is not necessarily required but fiber preforms have a tendency to shift during handling process, slurry without additives can also be used to ease the handling of the preform.

Figure 27:
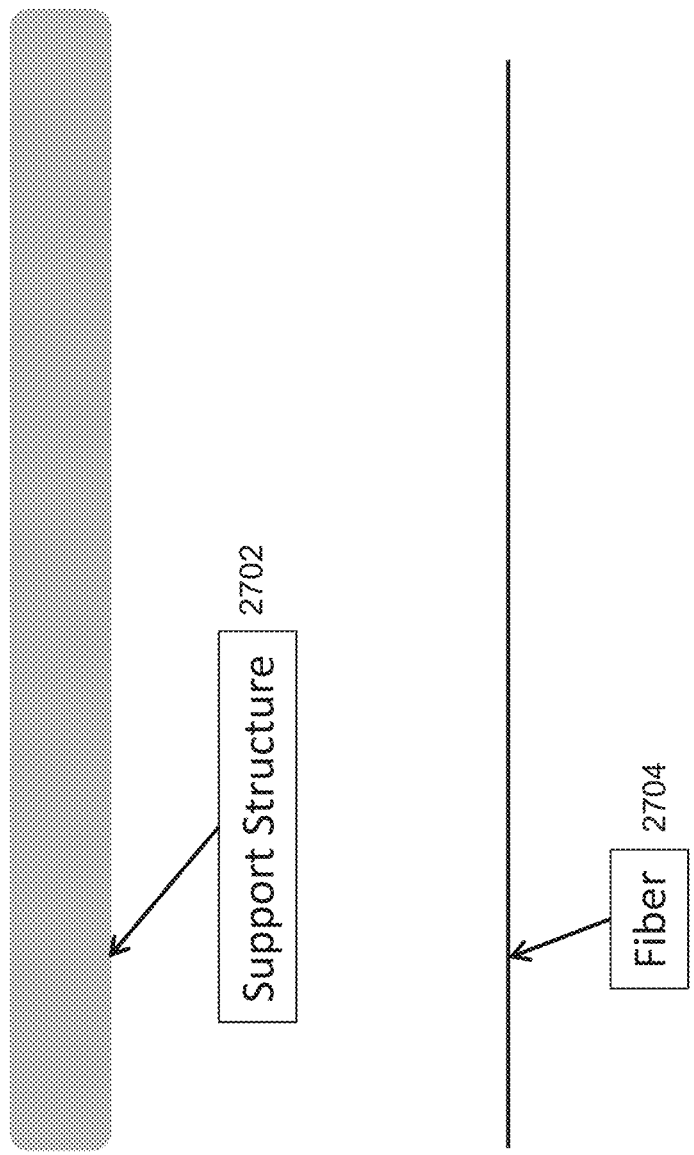
FIG. 27 shows an exemplary scheme diagram of a support structure and a fiber to be used for forming a composite fiber preform suitable for use in nuclear fuel cladding manufacture.
Figure 28:
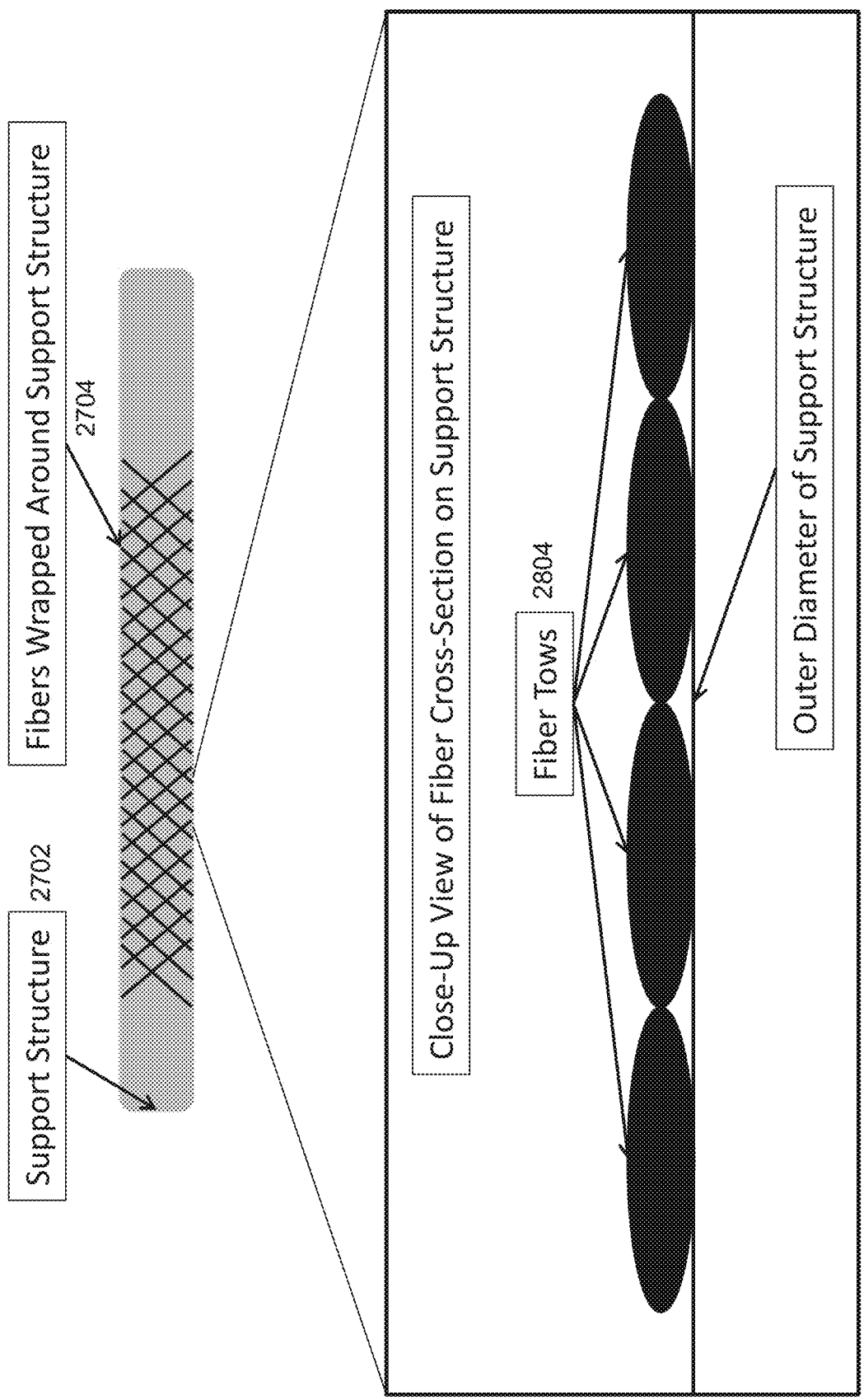
FIG. 28 shows an exemplary scheme diagram of a support structure with composite fibers wrapped around the support structure.

FIG. 27 shows an exemplary scheme diagram of a support structure 2702 and a fiber 2704 when they are separated before the fabrication process for producing a composite fiber preform. During the fabrication, as illustrated in FIG. 28, the fiber 2704 is placed on the outside surface the support structure 2702, e.g., being wrapped around the support structure. In some embodiments, the fiber 2704 can also be placed inside the support structure 2702. The dimensions of the support structure 2702 defines the final dimensions of the part to be made. The placement of the fiber 2702 defines the final geometry of the part to be made. In the particular embodiment shown in FIG. 3, the fiber 2704 is wrapped around the support structure 2702 to form a preform structure outside the support structure 2702. The lower image in FIG. 28 shows an enlarged view of the fiber tow cross sections 2804 on the support structure 2702. Some external restraints may be applied to maintain the desired final shape before the slurry is applied and allowed to dry, such as wrapping ends of braided sleeve to prevent fraying.

Next, a suitable slurry is applied to the preform structure. In some embodiments, the desired preform geometry as currently formed by wrapping the fiber 2704 around the support structure 2702 remains undisturbed after the slurry is applied. The slurry can be applied with one of various suitable methods, including, e.g., brushing, spraying, immersion, or by warm pressing.

Figure 29A:
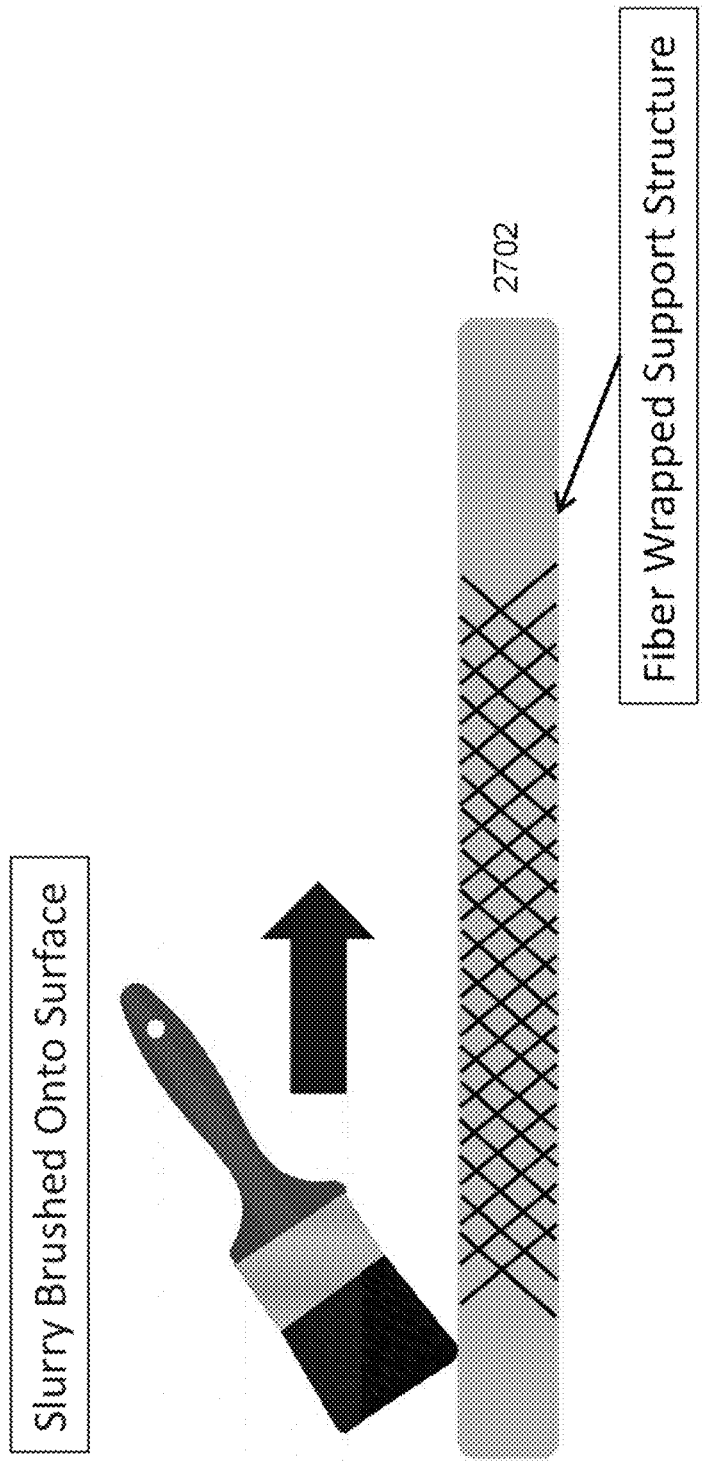
FIG. 29A shows an exemplary scheme diagram of brushing slurry on a fiber-wrapped support structure.
Figure 29B:
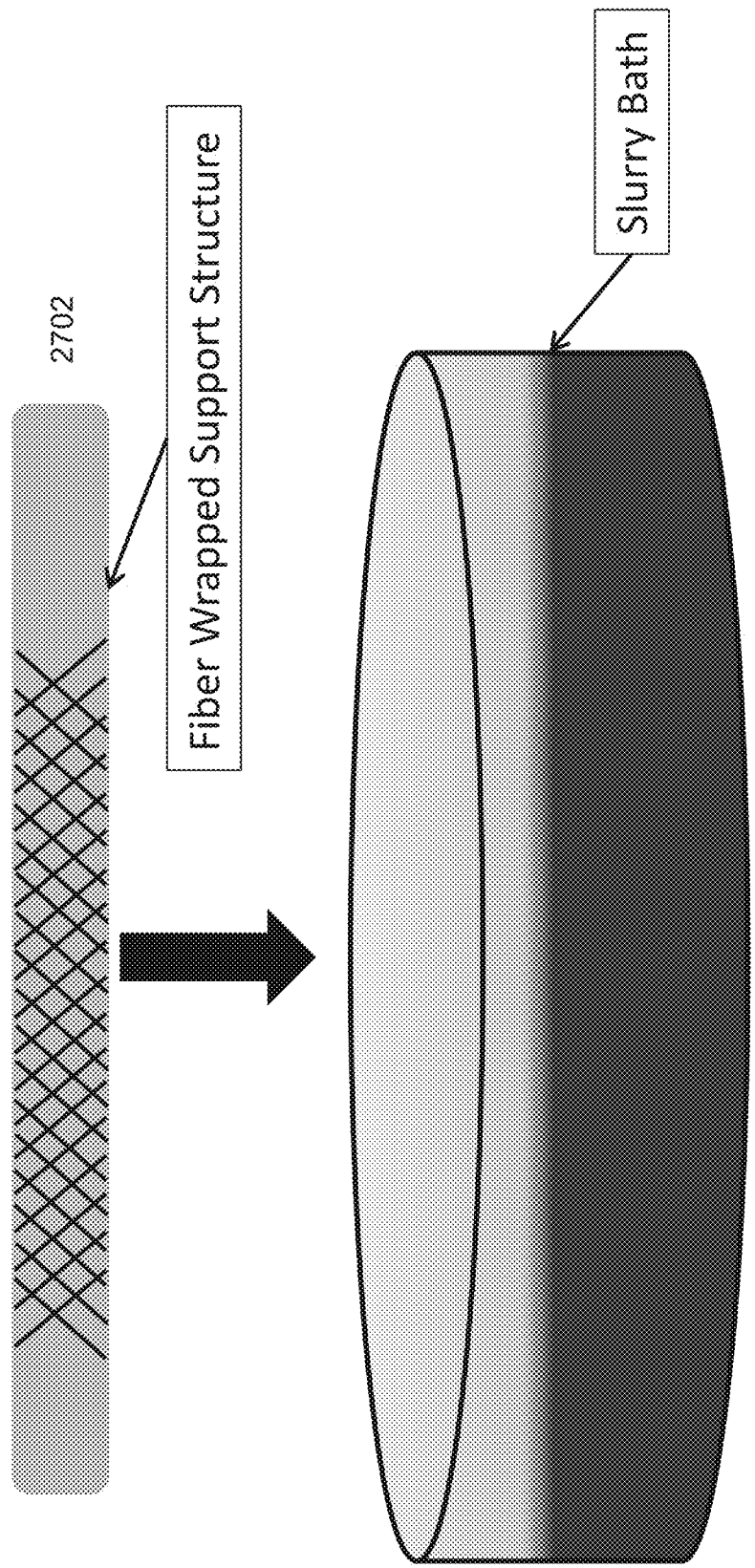

FIG. 29A shows, for example, a slurry is applied by brushing the slurry over the fiber wrapped support structure 2702. Alternatively, FIG. 29B shows that a slurry can be applied by submerging the fiber wrapped support structure 2702 in a slurry bath. The slurry application can be completed with a support structure in place that will define the final geometry.

FIG. 30 shows the fiber-wrapped support structure before (2702) and after (3004) slurry coating is applied. The slurry coated preform 3006, once dried, becomes sufficient rigid to maintain its shape without support of the support structure 2702. The support structure 2702 and any other external restraints are then removed (by sliding, pushing, melting, etc.) before matrix densification takes place, as shown in FIG. 31.

The slurry used in the above mentioned process may include, in some implementations, additives, a binder and a solvent. The additives used can be powders, whiskers, fibers, granules or any combination thereof. The particle size is typically sub-mm and the loading fraction of the slurry solution is typically 0-75% additive. The binder portion of the slurry comprises a thermo-plastic polymer that deteriorates at temperatures below that of the matrix densification process and does not thermally expand during burnout. The binder must be a solid at the room temperature and soluble in a cleanly evaporating solvent, such as acetone, methyl ethyl ketone, and ethanol. The viscosity of slurry mixtures can vary greatly based on the additive to binder ratio as well as the additive and binder to solvent ratio. The slurry viscosity should be tailored to the application method being used with the added consideration that multiple applications are possible.

The fibers used can be of various diameters, lengths, aspect ratios, cross-sectional geometries, and materials. The fibers can be arranged in any way that achieves the desired final preform geometry and mechanical strength. Some example arrangements include the fibers being woven into a planar sheet, braided into a tube, and wound around a tapered mandrel. The fibers can also be arranged in either hoop or axial orientations.

It is desirable that the support structure be compatible with the binder and binder solvents. The support structure may also be removable before matrix densification occurs. Removal of the support structure can be facilitated by using low surface friction supports, such as graphite, molybdenum disulfide (MoS2), polytetrafluoroethylene (PTFE), or boron nitride (BN), and supports that can be melted away at temperatures below the binder burnout temperature (wax, thermoplastics). The support structure can be reused as long as the removal process does not alter or damage the support beyond the previously established dimensional tolerance.

Samples were made based on the above structure and process. For example, a slurry was prepared by mixing SiC whiskers, Methyl Ethyl Ketone (solvent), and Polypropylene Carbonate Polymer (binder). The binder was slowly added to an ice bath-cooled container of MEK while being stirred by a high shear mixer at 4,000 rpm. Once the binder was completely dissolved the SiC additives were slowly added until the desired 1:1 ratio of binder to additives was obtained.

SiC fiber tow was fixed around the outer diameter of a PTFE support structure (e.g. rod) into the form of a tube and fastened at both ends with an additional SiC fiber tow. The slurry was then applied to the fiber using a paint brush until evenly coated and then allowed to dry in air.

These steps can be repeated for multiple times to manufacture the multi-layer SiC composite structure disclosed herein. For example, in some embodiments, a second layer of fiber preform having a second composite structure can be formed on top of the first layer of fiber preform. Different types of fiber arrangements (e.g. adjusting fiber orientations, varying number of fiber tows, etc.) can be used so that the second composite structure is different from a first composite structure of the first layer of fiber preform. In some embodiments, an outer monolithic layer can then be formed on top of the second layer of fiber preform.

In some embodiments, one or more layers of fiber preform can be formed between the first layer and the second layer, each of the one or more layers having a different composite structure. One or more monolithic layers can also be between the second layer of fiber preform and the outer monolithic layer. In some implementations, a plurality of thin layers are deposited between the outer monolithic layer and the one or more monolithic layers, and between each of the one or more monolithic layers, to inhibit crack propagation. A barrier coating layer can be formed on top of the outer monolithic layer.

After drying the preform was pulled off of the support structure. The low surface friction of the support structure allowed for mechanical separation and easy removal of the preform.

FIG. 32A shows an example of the support structure 3201 in a light color being slid out of the preform in a dark color 3203. FIG. 32B shows an example of the supported structure in the light color 3201 that separated from the preform in the dark color 3203. The shape and geometry of the support structure remained substantially intact after the preform manufacture process and can be re-used in subsequent fabrication process.

The preform was then placed into a CVD coater and the additive scaffolding and fiber were densified by CVI while maintaining their desired shape. The binder was burned away under a high temperature vacuum condition. The fabricated preform is a tubular structure and can be further processed to form a fuel rod as shown in FIG. 1A. Suitable further processing may fill in the porous and cracks in the fabricated preform tubular structure to make it impermeable by water or other liquid and to improve the strength of the final structure for holding nuclear pellets in nuclear reactions in a nuclear reactor.

Although nuclear fuel cladding is usually in the form of long and thin-walled tubes, other applications, including those for heat exchangers, aerospace, or nuclear fusion applications, may require different shapes, including planar and non-planar near net shapes. These shapes can also be made with corresponding support structures using the techniques and methods described in this patent document.

FIG. 33 shows an exemplary scheme diagram of a support structure 3302 and a fiber 3304 when they are separated before the fabrication process for producing a composite fiber preform. In this particular example, the support structure 3302 has a shape of a nosecone. During the fabrication, as illustrated in FIG. 34, the fiber 3304 is placed on the outside surface the support structure 3302, e.g., being wrapped around the support structure. In some embodiments, the fiber 3304 can also be placed inside the support structure 3302. The fiber 3304 is wrapped around the support structure 3302 to form a preform structure outside the support structure 3302.

Next, a suitable slurry is applied to the preform structure. In some embodiments, the desired preform geometry as currently formed by wrapping the fiber 3304 around the support structure 3302 remains undisturbed after the slurry is applied. The slurry can be applied with one of various suitable methods, including, e.g., brushing, spraying, immersion, or by warm pressing. For example, FIG. 35 shows that a slurry is applied by brushing the slurry over the fiber wrapped support structure 3302. The slurry application can be completed with a support structure in place that will define the final geometry. Additional layers of fiber and slurry can be arranged and applied to form a multi-layer fiber preform consistent with the multi-layer SiC composite structure described above.

FIG. 36 shows a fabrication flow 3600 for making the preform tubular structure based on SiC fiber for use in various applications. The method 3600 includes, at 3602, preparing a slurry with a plurality of additives, one or more binders, and one or more solvents, wherein the one or more binders comprise thermo-plastic polymers; at 3604, forming a preform of a desired geometry by: arranging a fiber on a support structure to form a first layer of fiber preform of the desired geometry, and applying the slurry to the first layer of fiber preform of the desired geometry; and, at 3608, removing the support structure after the slurry solidifies and binds with the first layer of fiber preform of the desired geometry so that the slurry and the first layer of fiber preform of the desired geometry form the preform.

This fabrication method eliminates the need for a mandrel during the CVI process and avoids the time consuming oxidation step after the CVD/CVI step is complete. It also provides a fluid path for CVD/CVI precursor gasses from all sides of the rigid fiber preform. Because additional infiltration pathways are opened up by removing the support structure, higher total densification and reduced infiltration time are possible with a support free composite. Coating of both the inner diameter and out diameter surfaces also becomes possible. An additional benefit of this process is the decrease of void size in the fiber preform before the coating process begins.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Only a few implementations and examples are described and other implementations, enhancements and variations can be made based on what is described and illustrated in this patent document.

What is claimed is:

1. A multilayer ceramic structure formed by a chemical vapor deposition process or a chemical vapor infiltration process, comprising a chamber including an external shell and a hollow space inside the external shell, wherein the external shell includes:
   an inner composite layer including a first composite structure, wherein the first composite structure comprises a first ceramic matrix reinforced by a first composite reinforcement comprising at least one of (1) ceramic additives at a first loading amount or (2) ceramic fibers arranged at a first reinforcement orientation,
   a middle composite layer placed outside of the inner composite layer, the middle composite layer including a second composite structure that is different from the first composite structure, and wherein the second composite structure comprises a second ceramic matrix reinforced by a second composite reinforcement comprising at least one of (1) ceramic whiskers at a second loading amount or (2) ceramic fibers arranged at a second reinforcement orientation, and
   an outer ceramic impermeable monolithic layer that is placed outside of the middle composite layer.

2. The multilayer ceramic structure of claim 1, further comprising:
   one or more composite layers placed between the inner composite layer and the middle composite layer, each of the one or more composite layers having a different composite structure.

3. The multilayer ceramic structure of claim 1, further comprising:
   one or more ceramic monolithic layers placed between the middle composite layer and the outer ceramic impermeable monolithic layer.

4. The multilayer ceramic structure of claim 3, further comprising:
   a plurality of thin layers deposited outside the outer ceramic impermeable monolithic layer or between the outer ceramic impermeable monolithic layer and one of the one or more ceramic monolithic layers, and between each of remaining layers of the one or more ceramic monolithic layers, to inhibit crack propagation, wherein the plurality of thin layers comprises a metal.

5. The multilayer ceramic structure of claim 4, wherein the plurality of thin layers comprise a ductile material.

6. The multilayer ceramic structure of claim 4, wherein the plurality of thin layers include pyrolytic carbon or metal.

7. The multilayer ceramic structure of claim 1, wherein the first composite structure comprises a first reinforced silicon carbide (SIC) composite, and wherein the second composite structure comprises a second reinforced silicon carbide (SIC) composite.

8. The multilayer ceramic structure of claim 7, wherein the first reinforced SiC composite or the second reinforced SiC composite includes a braided SiC fiber composite, a wound SiC fiber composite, or a small-scale additive composite with additives having a dimension in a nanometer or micrometer range.

9. The multilayer ceramic structure of claim 1, wherein the outer ceramic impermeable monolithic layer includes a β-SiC material.

10. The multilayer ceramic structure of claim 1, further comprising a barrier coating layer placed outside of the outer ceramic impermeable monolithic layer, wherein the barrier coating layer comprises a metal or a ceramic.

11. The multilayer ceramic structure of claim 1, wherein thickness of the inner composite layer and the middle composite layer comprises greater than 70% of an overall thickness of the external shell.

12. The multilayer ceramic structure of claim 1, wherein the external shell is structured for fabrication of a nuclear fuel cladding for holding a nuclear fuel material, a part of a heat exchanger, a part of a nozzle, a nosecone, a shroud, a combustor liner, or a flow channel insert.

13. The multilayer ceramic structure of claim 1, wherein the first composite structure of the inner composite layer comprises ceramic additives and the ceramic additives comprise micro- and nano-scale additives, wherein micro-scale refers to a sub-millimeter range and nano-scale refers to a sub-micron range, and wherein the second composite structure of the middle composite layer comprises ceramic fibers which are structured to exhibit different ratios in fiber strength in a hoop direction and an axial direction of the external shell, respectively, and wherein the nano-and micro-scale additives of the inner composite layer comprises a smoother surface than ceramic fiber reinforcement of the middle composite layer.

14. The multilayer ceramic structure of claim 13, wherein the ceramic fibers are structured to be hoop-biased, having a ratio above 1:1 and up to 1.3:1 in the hoop direction and the axial direction of the external shell.

15. The multilayer ceramic structure of claim 13, wherein the ceramic fibers are structured to be axial biased, having a ratio above 1:1 and up to 1:1.5 in the hoop direction and the axial direction of the external shell.

16. The multilayer ceramic structure of claim 1, wherein the outer ceramic impermeable monolithic layer is structured with respect to the inner and middle composite layers to remain in compression when subjected to an operating stress.

17. The multilayer ceramic structure of claim 1, wherein the outer ceramic impermeable monolithic layer is further configured to provide corrosion resistance.

18. The multilayer ceramic structure of claim 1, wherein a thickness of the outer ceramic impermeable monolithic layer is at least 100 μm.

19. The multilayer ceramic structure of claim 1, wherein a roughness measurement of the inner composite layer is within a range of 4 to 50 μm.

* * * * *